United States Patent
Zhang et al.

(10) Patent No.: US 11,995,256 B2
(45) Date of Patent: May 28, 2024

(54) DISPLAY PANEL, PREPARATION METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Shun Zhang, Beijing (CN); Yi Zhang, Beijing (CN); Ping Wen, Beijing (CN); Peng Xu, Beijing (CN); Chang Luo, Beijing (CN); Linhong Han, Beijing (CN); Weiyun Huang, Beijing (CN); Youngyik Ko, Beijing (CN); Yuanqi Zhang, Beijing (CN); Cong Fan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/641,444

(22) PCT Filed: Apr. 20, 2021

(86) PCT No.: PCT/CN2021/088322
§ 371 (c)(1),
(2) Date: Mar. 9, 2022

(87) PCT Pub. No.: WO2022/222022
PCT Pub. Date: Oct. 27, 2022

(65) Prior Publication Data
US 2024/0053842 A1    Feb. 15, 2024

(51) Int. Cl.
*G06F 3/041* (2006.01)
*G06F 3/044* (2006.01)

(52) U.S. Cl.
CPC .......... *G06F 3/0412* (2013.01); *G06F 3/0446* (2019.05); *G06F 3/0448* (2019.05);
(Continued)

(58) Field of Classification Search
CPC ...... G06F 3/0412; G06F 3/041; G06F 3/0446; G06F 3/0448; G06F 2203/04103; G06F 2203/04112
See application file for complete search history.

(56) References Cited

U.S. PATENT DOCUMENTS 9,965,995 B2 *   5/2018   Chen .................. G09G 3/20
11,740,718 B2 *  8/2023   Choi .................. G04G 17/00
                                                      345/173

(Continued)

FOREIGN PATENT DOCUMENTS

CN    102053751 A    5/2011
CN    103389843 A    11/2013

(Continued)

*Primary Examiner* — Deeprose Subedi
(74) *Attorney, Agent, or Firm* — Ling Wu; Stephen Yang; Ling and Yang Intellectual Property

(57) ABSTRACT

Provided are a display panel, a preparation method thereof, and a display device. The display panel includes a display substrate and a touch panel. The touch panel includes multiple touch electrodes. At least one of the touch electrodes includes multiple grid patterns enclosed by metal wires. At least one of the grid patterns includes a first edge, second edge, third edge and fourth edge that form a ring. The first edge and the third edge extend in a second direction. The second edge and the fourth edge extend in a first direction. A shape of the grid pattern includes a first curved ring, a second curved ring, a third curved ring, or a fourth curved ring. A first edge and third edge of the first curved ring are curves curved towards a direction opposite to the first direction.

19 Claims, 17 Drawing Sheets

(52) U.S. Cl.
CPC .............. *G06F 2203/04103* (2013.01); *G06F 2203/04112* (2013.01)

(56) References Cited

U.S. PATENT DOCUMENTS

| | | |
|---|---|---|
| 2011/0102361 A1 | 5/2011 | Philipp |
| 2013/0299222 A1 | 11/2013 | Lee et al. |
| 2016/0110008 A1 | 4/2016 | Lee et al. |
| 2017/0221195 A1 | 8/2017 | Iwami |
| 2018/0192503 A1 | 7/2018 | Fang et al. |
| 2019/0047605 A1 | 2/2019 | Clochard et al. |
| 2020/0064972 A1 | 2/2020 | Yen et al. |
| 2020/0301545 A1 | 9/2020 | Yang et al. |
| 2021/0004123 A1 | 1/2021 | Tan et al. |
| 2021/0135149 A1* | 5/2021 | Xin ................... H10K 59/1315 |
| 2021/0405803 A1* | 12/2021 | Ye ......................... G06F 3/0446 |
| 2022/0276741 A1* | 9/2022 | Ye ......................... G06F 3/0448 |
| 2023/0092521 A1* | 3/2023 | Li ......................... G06F 3/0412 |
| | | 345/173 |

FOREIGN PATENT DOCUMENTS

| | | |
|---|---|---|
| CN | 203376735 U | 1/2014 |
| CN | 105528125 A | 4/2016 |
| CN | 106020547 A | 10/2016 |
| CN | 106796471 A | 5/2017 |
| CN | 106953628 A | 7/2017 |
| CN | 107310250 A | 11/2017 |
| CN | 108698626 A | 10/2018 |
| CN | 108885516 A | 11/2018 |
| CN | 208367661 U | 1/2019 |
| CN | 110308822 A | 10/2019 |
| CN | 110858087 A | 3/2020 |
| JP | 2014-175609 A | 9/2014 |
| JP | 2014-203664 A | 10/2014 |
| JP | 2015-72517 A | 4/2015 |
| KR | 10-2017-0077583 A | 7/2017 |

* cited by examiner

DISPLAY PANEL, PREPARATION METHOD THEREOF, AND DISPLAY DEVICE

CROSS-REFERENCE TO RELATED APPLICATION

This application is a national stage application of PCT Application No. PCT/CN2021/088322, which is filed on Apr. 20, 2021, the contents of which are hereby incorporated by reference in their entirety.

TECHNICAL FIELD

The present disclosure relates, but is not limited, to the technical field of display, and particularly to a display panel, a preparation method thereof, and a display device.

BACKGROUND

With the rapid development of a display technology, touch screen has been gradually widespread in people's daily life. According to a composition structure, a touch screen may be of an Add on Mode, an On Cell mode, an In Cell mode, etc. According to a working principle, a touch screen may be of a capacitance type, a resistance type, infrared type, a surface acoustic wave type, etc. A capacitance On Cell type refers to forming a touch structure on a surface of an emergence side of a display screen, has the advantages of simple structure, small thickness, high transmittance, etc., and thus has gradually become a mainstream technology instead of the add on mode.

As an active emitting display device, an Organic Light Emitting Diode (OLED) has the advantages of autoluminescence, wide viewing angle, high contrast ratio, low power consumption, extremely quick response, etc. With the constant development of a display technology, a flexible display using an OLED as an emitting device and performing signal control by use of a Thin Film Transistor (TFT) has become a mainstream product in the field of display at present. According to product requirements for flexible folding, narrow border, etc., an existing OLED-based touch structure uses a flexible covering surface type structural form with a flexible touch substrate arranged on an encapsulation layer of an OLED back-plane, has the advantages of lightweight, small thickness, foldability, etc., and may meet the product requirements for flexible folding, narrow border, etc.

SUMMARY

The below is a summary about the subject matter described in the present disclosure in detail. The summary is not intended to limit the scope of protection of the claims.

According to an aspect, an exemplary embodiment of the present disclosure provides a display panel, which includes a display substrate and a touch panel arranged on the display substrate. The display substrate includes multiple sub-pixels. At least one of the sub-pixels includes an emitting region and a non-emitting region located on a periphery of the emitting region. The touch panel includes multiple touch electrodes. At least one of the touch electrodes includes multiple grid patterns enclosed by metal wires. An orthographic projection of the emitting region on the display substrate is located within a range of that of a region enclosed by the metal wires on the display substrate. An orthographic projection of the metal wire on the display substrate is located within a range of that of the non-emitting region on the display substrate.

At least one of the grid patterns includes a first edge, second edge, third edge and fourth edge that form a ring. The first edge and the third edge extend in a second direction, and the second edge and the fourth edge extend in a first direction, the first direction intersecting the second direction. A shape of the grid pattern includes at least one of a first curved ring, a second curved ring, a third curved ring, and a fourth curved ring. A first edge and third edge of the first curved ring are curves curved towards a direction opposite to the first direction. A first edge and third edge of the second curved ring are curves curved towards the first direction. A second edge and fourth edge of the third curved ring are curves curved towards the second direction. A second edge and fourth edge of the fourth curved ring are curves curved towards a direction opposite to the second direction.

In an exemplary implementation mode, a shape of the curve includes any one or more of an arc and a broken line.

In an exemplary implementation mode, at least one notch is formed in at least one of the first edge, the second edge, the third edge, and the fourth edge. The notch breaks the grid pattern.

In an exemplary implementation mode, the display substrate at least includes a first pixel unit and a second pixel unit adjacent to the first pixel unit in the second direction. Each of the first pixel unit and the second pixel unit includes a first sub-pixel emitting first-color light, a second sub-pixel emitting second-color light, and a third sub-pixel emitting third-color light. The touch electrode includes a first repetitive unit and a second repetitive unit adjacent to the first repetitive unit in the second direction. Each of the first repetitive unit and the second repetitive unit includes a first grid pattern corresponding to a position of the first sub-pixel, a second grid pattern corresponding to a position of the second sub-pixel, and a third grid pattern corresponding to a position of the third sub-pixel. A shape of the first grid pattern in the first repetitive unit is any one of a first curved ring and a second curved ring, and a shape of the first grid pattern in the second repetitive unit is the other of the first curved ring and the second curved ring.

In an exemplary implementation mode, a shape of the second grid pattern in the first repetitive unit is any one of a first curved ring and a second curved ring, and a shape of the second grid pattern in the second repetitive unit is the other of the first curved ring and the second curved ring.

In an exemplary implementation mode, a shape of the third grid pattern in the first repetitive unit is any one of a first curved ring and a second curved ring, and a shape of the third grid pattern in the second repetitive unit is the other of the first curved ring and the second curved ring.

In an exemplary implementation mode, in the first grid pattern of the first repetitive unit and the first grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction.

In an exemplary implementation mode, in the second grid pattern of the first repetitive unit and the second grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction.

In an exemplary implementation mode, in the third grid patterns of the first repetitive unit and the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction.

In an exemplary implementation mode, in the first repetitive unit, a notch is formed in a second edge of the first grid pattern, a notch is formed in a fourth edge of the second grid pattern, and notches are formed in a second edge and fourth edge of the third grid pattern. In the second repetitive unit, a notch is formed in a fourth edge of the first grid pattern, a notch is formed in a third edge of the second grid pattern, and a notch is formed in a second edge of the third grid pattern.

In an exemplary implementation mode, a third edge of the first grid pattern in each of the first repetitive unit and the second repetitive unit serves as a first edge of the second grid pattern. A second edge of the first grid pattern in the first repetitive unit together with a second edge of the second grid pattern in the first repetitive unit serves as a fourth edge of the third grid pattern in the first repetitive unit. A fourth edge of the first grid pattern in the second repetitive unit together with a fourth edge of the second grid pattern in the second repetitive unit serves as a second edge of the third grid pattern in the first repetitive unit. A second edge of the first grid pattern in the second repetitive unit together with a second edge of the second grid pattern in the second repetitive unit serves as a fourth edge of the third grid pattern in the second repetitive unit. A second edge of the first grid pattern in another first repetitive unit together with a second edge of the second grid pattern in the other first repetitive unit serves as a second edge of the third grid pattern in the second repetitive unit, the other first repetitive unit being a first repetitive unit adjacent to the second repetitive unit in the second direction.

In an exemplary implementation mode, a first opening or a second opening is formed in the third grid pattern in the first repetitive unit or the second repetitive unit, the first opening being formed by removing a first edge of the third grid pattern, and the second opening being formed by removing a third edge of the third grid pattern.

In an exemplary implementation mode, the touch electrode includes multiple first repetitive unit columns and multiple second repetitive unit columns, which are arranged alternately in the second direction. The first repetitive unit column includes multiple first repetitive units sequentially arranged in the first direction. The second repetitive unit column includes multiple second repetitive units sequentially arranged in the first direction. Any one of the repetitive unit columns includes at least one connected grid pattern. The connected grid pattern is a ring surrounding two emitting regions, and is formed by arranging the third grid pattern with the first opening at a side of the third grid pattern with the second opening in the first direction. The connected grid patterns of the first repetitive unit columns are staggered with those of the second repetitive unit columns.

In an exemplary implementation mode, any one of the repetitive unit columns includes at least one common horizontal edge. The common horizontal edge serves as both a third edge of the third grid pattern with the first opening and a first edge of the third grid pattern with the second opening. The third grid pattern with the second opening is arranged at a side of the third grid pattern with the first opening in the first direction. The common horizontal edges of the first repetitive unit columns are staggered with those of the second repetitive unit columns.

In an exemplary implementation mode, the display substrate at least includes a first pixel unit and a third pixel unit adjacent to the first pixel unit in the first direction. Each of the first pixel unit and the third pixel unit includes a first sub-pixel emitting first-color light, a second sub-pixel emitting second-color light, and a third sub-pixel emitting third-color light. The touch electrode includes a first repetitive unit and a third repetitive unit adjacent to the first repetitive unit in the first direction. Each of the first repetitive unit and the third repetitive unit includes a first grid pattern corresponding to a position of the first sub-pixel, a second grid pattern corresponding to a position of the second sub-pixel, and a third grid pattern corresponding to a position of the third sub-pixel. A shape of the first grid pattern in the first repetitive unit is any one of a third curved ring and a fourth curved ring, and a shape of the first grid pattern in the third repetitive unit is the other of the third curved ring and the fourth curved ring.

In an exemplary implementation mode, a shape of the second grid pattern in the first repetitive unit is any one of a third curved ring and a fourth curved ring, and a shape of the second grid pattern in the third repetitive unit is the other of the third curved ring and the fourth curved ring.

In an exemplary implementation mode, a shape of the third grid pattern in the first repetitive unit is any one of a third curved ring and a fourth curved ring, and a shape of the third grid pattern in the third repetitive unit is the other of the third curved ring and the fourth curved ring.

In an exemplary implementation mode, first edges and third edges of the first grid pattern and second grid pattern in the first repetitive unit and first edges and third edges of the first grid pattern and second grid pattern in the second repetitive unit are curves curved towards the direction opposite to the first direction.

In an exemplary implementation mode, in the first repetitive unit, a notch is formed in a second edge of the first grid pattern, a notch is formed in a fourth edge of the second grid pattern, and notches are formed in a second edge and fourth edge of the third grid pattern. In the third repetitive unit, a notch is formed in a third edge of the first grid pattern, and a notch is formed in a first edge of the second grid pattern.

In an exemplary implementation mode, a third edge of the first grid pattern in each of the first repetitive unit and the third repetitive unit serves as a first edge of the second grid pattern. A second edge of the first grid pattern in the first repetitive unit together with a second edge of the second grid pattern in the first repetitive unit serves as a fourth edge of the third grid pattern in the first repetitive unit. A second edge of the first grid pattern in the third repetitive unit together with a second edge of the second grid pattern in the third repetitive unit serves as a fourth edge of the third grid pattern in the third repetitive unit.

In an exemplary implementation mode, a first opening or a second opening is formed in the third grid pattern in the first repetitive unit or the third repetitive unit, the first opening being formed by removing a first edge of the third grid pattern, and the second opening being formed by removing a third edge of the third grid pattern.

In an exemplary implementation mode, the display substrate includes multiple pixel units. At least one of the pixel units includes a first sub-pixel emitting first-color light, a second sub-pixel emitting second-color light, and a third sub-pixel emitting third-color light. The touch electrode includes multiple repetitive units. At least one of the repetitive units includes a first grid pattern corresponding to a position of the first sub-pixel, a second grid pattern corresponding to a position of the second sub-pixel, and a third grid pattern corresponding to a position of the third sub-pixel. In at least one of the repetitive units, a shape of the first grid pattern is any one of a first curved ring and a second curved ring, and a shape of the third grid pattern is the other of the first curved ring and the second curved ring.

In an exemplary implementation mode, the display substrate includes multiple pixel units. At least one of the pixel units includes a first sub-pixel emitting first-color light, a second sub-pixel emitting second-color light, and a third sub-pixel emitting third-color light. The touch electrode includes multiple repetitive units. At least one of the repetitive units includes a first grid pattern corresponding to a position of the first sub-pixel, a second grid pattern corresponding to a position of the second sub-pixel, and a third grid pattern corresponding to a position of the third sub-pixel. Shapes of the first grid pattern and second grid pattern in at least one of the repetitive units are the same curved ring.

In an exemplary implementation mode, an included angle between a tangent of the first edge and the second direction at a junction of the first edge and the second edge or the fourth edge ranges from 12° to 18°. At a junction of the third edge and the second edge or the fourth edge, an included angle between a tangent of the third edge and the second direction ranges from 12° to 18°, and an included angle between a tangent of the second edge or the fourth edge and the first direction ranges from 12° to 18°.

In an exemplary implementation mode, at least one of the touch electrodes includes a wavy first electrode edge extending in the second direction and a wavy second electrode edge extending in the first direction. At a junction of the first electrode edge and the second electrode edge, an included angle between a tangent of the first electrode edge and the second direction ranges from 12° to 18°, and an included angle between a tangent of the second electrode edge and the first direction ranges from 12° to 18°.

In an exemplary implementation mode, a minimum distance between at least one of the first edge and/or the third edge and the emitting region in the first direction ranges from 8 μm to 10 μm. A minimum distance between at least one of the second edge and/or the fourth edge and the emitting region in the second direction ranges from 8 μm to 10 μm.

In an exemplary implementation mode, the touch panel includes a touch region, a bonding region located at a side of the touch region in the first direction, and a border region located at another side of the touch region. A signal lead, a grounding wire and an auxiliary grounding wire are arranged in the border region. A first end of the signal lead is connected with the touch electrode in the touch region, while a second end extends to the bonding region along a border shape. A first end of the grounding wire is arranged at a side of the border region away from the bonding region, while a second end extends to the bonding region along the border shape at a side of the signal lead away from the touch region. A first end of the auxiliary grounding wire is arranged at the side of the border region away from the bonding region, while a second end is connected with the grounding wire after extending along the border shape. A distance between the grounding wire and the touch region is longer than that between the auxiliary grounding wire and the touch region.

In an exemplary implementation mode, the auxiliary grounding wire includes an auxiliary extension section and an auxiliary connection section. A first end of the auxiliary extension section is arranged at the side of the border region away from the bonding region, while a second end is connected with a first end of the auxiliary connection section after extending along the border shape. A second end of the auxiliary connection section extends in the second direction or the direction opposite to the second direction, and is connected with the grounding wire to form a branched structure with the grounding wire.

In an exemplary implementation mode, the touch panel includes a centerline extending in the first direction and equally dividing the touch region and a reference line perpendicular to the centerline. The grounding wire includes a first grounding wire located at one side of the centerline and a second grounding wire located at the other side of the centerline. Both a first end of the first grounding wire and a first end of the second grounding wire are arranged at the side of the border region away from the bonding region. Both a second end of the first grounding wire and a second end of the second grounding wire extend to the bonding region along the border shape.

An insertion portion is arranged at the first end of the first grounding wire. The insertion portion includes a turning section and an insertion section. A first end of the turning section is connected with the first end of the first grounding wire, while a second end is connected with a first end of the insertion section after turning to a direction approaching the touch region. A second end of the insertion section extends to the other side of the centerline, and forms an inserted structure with the first end of the second grounding wire. There is an overlapping region between an orthographic projection of the insertion section on the reference line and an orthographic projection of the first end of the second grounding wire on the reference line.

In an exemplary implementation mode, the touch panel includes a centerline extending in the first direction and equally dividing the touch region and a reference line perpendicular to the centerline. The auxiliary grounding wire includes a first auxiliary grounding wire located at one side of the centerline and a second auxiliary grounding wire located at the other side of the centerline. Both a first end of the first auxiliary grounding wire and a first end of the second auxiliary grounding wire are arranged at the side of the border region away from the bonding region.

An auxiliary insertion portion is arranged at the first end of the first auxiliary grounding wire. The auxiliary insertion portion includes an auxiliary turning section and an auxiliary insertion section. A first end of the auxiliary turning section is connected with the first end of the first auxiliary grounding wire, while a second end is connected with a first end of the auxiliary insertion section after turning to a direction away from the touch region. A second end of the auxiliary insertion section extends to the other side of the centerline, and forms an auxiliary inserted structure with the first end of the second auxiliary grounding wire. There is an overlapping region between an orthographic projection of the auxiliary insertion section on the reference line and an orthographic projection of the first end of the second auxiliary grounding wire on the reference line.

In an exemplary implementation mode, multiple dummy line segments are further arranged in the border region. The multiple dummy line segments are arranged between the signal lead and the grounding wire, or, the multiple dummy line segments are arranged between the grounding wire and the auxiliary grounding wire.

According to another aspect, an exemplary embodiment of the present disclosure also provides a display device, which includes the above-mentioned display panel.

According to another aspect, an exemplary embodiment of the present disclosure also provides a preparation method for a display panel, which includes the following operations.

A display substrate is formed, the display substrate including multiple sub-pixels, and at least one of the sub-pixels including an emitting region and a non-emitting region located on a periphery of the emitting region.

A touch panel is formed on the display substrate, the touch panel including multiple touch electrodes, and at least one of the touch electrodes including multiple grid patterns enclosed by metal wires. Herein, an orthographic projection of the emitting region on the display substrate is located within a range of that of a region enclosed by the metal wires on the display substrate. An orthographic projection of the metal wire on the display substrate is located within a range of that of the non-emitting region on the display substrate.

At least one of the grid patterns includes a first edge, second edge, third edge and fourth edge that form a ring. The first edge and the third edge extend in a second direction, and the second edge and the fourth edge extend in a first direction, the first direction intersecting the second direction. A shape of the grid pattern includes at least one of a first curved ring, a second curved ring, a third curved ring, and a fourth curved ring. A first edge and third edge of the first curved ring are curves curved towards a direction opposite to the first direction. A first edge and third edge of the second curved ring are curves curved towards the first direction. A second edge and fourth edge of the third curved ring are curves curved towards the second direction. A second edge and fourth edge of the fourth curved ring are curves curved towards a direction opposite to the second direction.

The other aspects may be comprehended upon reading and understanding the drawings and the detailed descriptions.

BRIEF DESCRIPTION OF DRAWINGS

The drawings provide further understandings to the technical solutions of the present disclosure, constitute a part of the specification, and are used to explain, together with the embodiments of the present disclosure, the technical solutions of the present disclosure and not intended to form limits to the technical solutions of the present disclosure. The shapes and sizes of each component in the drawings do not reflect the true scale, and are only intended to schematically describe the contents of the present disclosure.

FIGS. 6-1 to 6-5 are structural schematic diagrams of several metal grids.

FIGS. 11-1 and 11-5 are structural schematic diagrams of a curve according to an exemplary embodiment of the present disclosure.

FIGS. 12-1 and 12-3 are structural schematic diagrams of a first curved ring according to an exemplary embodiment of the present disclosure.

FIGS. 13-1 and 13-3 are structural schematic diagrams of a second curved ring according to an exemplary embodiment of the present disclosure.

FIGS. 14-1 and 14-3 are structural schematic diagrams of a third curved ring according to an exemplary embodiment of the present disclosure.

FIGS. 15-1 and 15-3 are structural schematic diagrams of a fourth curved ring according to an exemplary embodiment of the present disclosure.

DESCRIPTION ABOUT THE REFERENCE SIGNS

Figure 1:
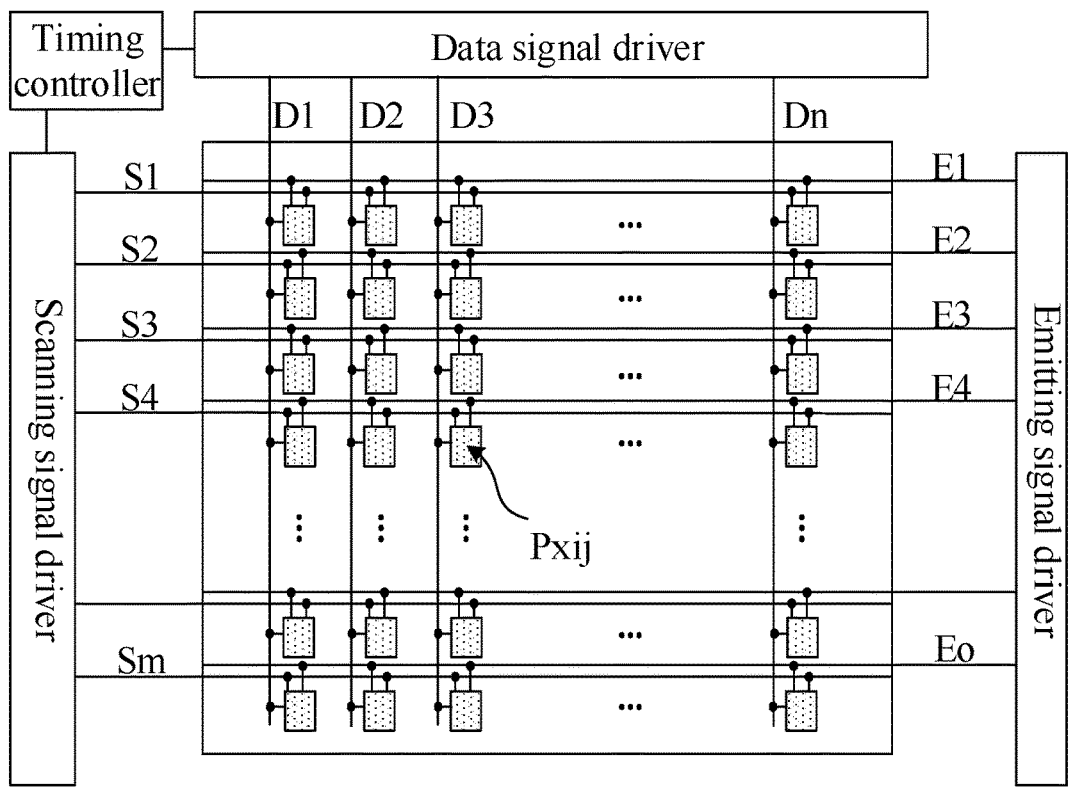
FIG. 1 is a structural schematic diagram of an OLED display substrate.

10—base; 11A—transistor; 11B—storage capacitor; 12—driving circuit layer; 13—emitting structure layer; 14—encapsulation layer;
15—touch electrode layer; 31—anode; 32—pixel definition layer;
33—organic emitting layer; 34—cathode; 41—first encapsulation layer;
42—second encapsulation layer; 43—third encapsulation layer; 51—TLD layer;
52—touch electrode layer; 53—touch protective layer; 100—touch region;
101—first electrode region; 102—second electrode region; 103—third electrode region;
104—fourth electrode region; 105—fifth electrode region; 200—border region;
210—signal lead; 220—grounding wire; 221—auxiliary grounding wire;
230—dummy line segment; 300—bonding region; 400—touch electrode;
410—touch wire; 500—notch; 610—first opening; and 620—second opening.

DETAILED DESCRIPTION

The embodiments of the present disclosure will be described below in combination with the drawings in detail. It is to be noted that implementation modes may be implemented in various forms. Those of ordinary skill in the art may easily understand such a fact that modes and contents may be transformed into various forms without departing from the objective and scope of the present disclosure. Therefore, the present disclosure should not be explained as being limited to the contents recorded in the following implementation modes only. The embodiments in the present disclosure and the features in the embodiments may be freely combined without conflicts. In order to keep the following description of the embodiments of the present disclosure clear and concise, detailed descriptions about part of known functions and known components are omitted in the present disclosure. The drawings of the embodiments of the present disclosure only involve the structures involved in the embodiments of the present disclosure, and the other structures may refer to conventional designs.

In the drawings, the sizes of composition elements, the thicknesses of layers or regions are exaggerated sometimes for clarity. Therefore, a mode of the present disclosure is not always limited to the size, and the shapes and sizes of each component in the drawings do not reflect the true scale. In addition, the drawings schematically illustrate ideal examples, and a mode of the present disclosure is not limited to the shapes, numerical values, or the like shown in the drawings.

Ordinal numerals "first", "second", "third", 1st, 2nd, 3rd, etc., in the present specification are set not to form limits in number but only to avoid the confusion of composition elements.

In the present specification, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction of description of each composition element. Therefore, appropriate replacements based on situations are allowed, not limited to the expressions in the specification.

In the present specification, unless otherwise specified and defined, terms "mounting", "mutual connection", and "connection" should be generally understood. For example, the term may be fixed connection, or detachable connection or integration connection. Alternatively, the term may be mechanical connection or electric connection. Alternatively, the term may be direct connection, or indirect connection through an intermediate, or communication inside two elements. Those of ordinary skill in the art may understand the meanings of the terms in the present disclosure according to specific situations.

In the present specification, the transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that, in the present specification, the channel region refers to a main region that the current flows through.

In the present specification, the first electrode may be the drain electrode, and the second electrode may be the source electrode. Alternatively, the first electrode may be the source electrode, and the second electrode may be the drain electrode. In case that transistors with opposite polarities are used, or a current direction changes during the work of a circuit, or the like, functions of the "source electrode" and the "drain electrode" may sometimes be exchanged. Therefore, the "source electrode" and the "drain electrode" may be exchanged in the present specification.

In the present specification, "electrical connection" includes connection of composition elements through an element with a certain electric action. "The component with the certain electric action" is not particularly limited as long as electric signals between the connected composition elements may be sent and received. Examples of "the element with the certain electric action" not only include an electrode and a wire, but also include a switch element such as a transistor, a resistor, an inductor, a capacitor, other elements with various functions, etc.

In the present specification, "parallel" refers to a state that an angle formed by two straight lines is larger than −10° and smaller than 10°, and thus may include a state that the angle is larger than −5° and smaller than 5°. In addition, "perpendicular" refers to a state that an angle formed by two straight lines is larger than 80° and smaller than 100°, and thus may include a state that the angle is larger than 85° and smaller than 95°.

In the present specification, "film" and "layer" may be exchanged. For example, "conductive layer" may be replaced with "conductive film" sometimes. Similarly, "insulating film" may be replaced with "insulating layer" sometimes.

In the present disclosure, "about" refers to that a boundary is defined not so strictly and numerical values in process and measurement error ranges are allowed.

A capacitance On Cell type touch panel is mainly divided into a mutual capacitance structure and a self capacitance structure. The mutual capacitance structure refers to forming mutual capacitance by overlapping a driving electrode and a sensing electrode and performing position detection based on a change of the mutual capacitance. The self capacitance structure refers to forming self capacitance by a touch electrode and a human body and performing position detection based on a change of the self capacitance. A self capacitance touch panel is of a single-layer structure, and has the characteristics of low power consumption, simple structure, etc. A mutual capacitance touch panel is of a multilayer structure, and has the characteristics of multi-point touch, etc.

A display device of an exemplary embodiment of the present disclosure may include a display substrate arranged on a base and a touch panel arranged on the display substrate. The display substrate may be a Liquid Crystal Display (LCD) substrate, or an Organic Light Emitting Diode (OLED) display substrate, or a Plasma Display Panel (PDP) display substrate, or an Electrophoretic Display (EPD) substrate. In an exemplary implementation mode, the display substrate is an OLED display substrate. The OLED display substrate may include a base, a driving circuit layer arranged on the base, an emitting structure layer arranged on the driving structure layer, and an encapsulation layer arranged on the emitting structure layer. The touch panel is arranged on the encapsulation layer of the display substrate, so as to form Touch on Thin Film Encapsulation (TFE) structure. Integrating a display structure and the touch structure may achieve the advantages of lightweight, small thickness, foldability, etc., and meet product requirements for flexible folding, narrow border, etc.

At present, a Touch on TFE structure mainly includes a Flexible Multi Layer On Cell (FMLOC) structure and a Flexible Single Layer On Cell (FSLOC) structure. The FMLOC structure is based on a working principle of mutual capacitance detection. Generally, a driving (Tx) electrode and a sensing (Rx) electrode are formed by two metal layers, and an Integrated Circuit (IC) detects mutual capacitance between the driving electrode and the sensing electrode to implement a touch operation. The FSLOC structure is based on a working principle of self capacitance (or voltage) detection. Generally, a touch electrode is formed by a single metal layer, and an integrated circuit detects self capacitance (or voltage) of the touch electrode to implement touch operation.

FIG. 1 is a structural schematic diagram of an OLED display substrate. As shown in FIG. 1, the OLED display substrate may include a timing controller, a data signal driver, a scanning signal driver, an emitting signal driver, and a pixel array. The pixel array may include multiple scanning signal wires (S1 to Sm), multiple data signal wires (D1 to Dn), multiple emitting signal wires (E1 to Eo), and multiple sub-pixels Pxij. In an exemplary implementation mode, the timing controller may provide a gray-scale value and control signal suitable for a specification of the data signal driver for the data signal driver, provide a clock signal, scan starting signal, etc., suitable for a specification of the scanning signal driver, and provide a clock signal, emission stopping signal, etc., suitable for a specification of the emitting signal driver for the emitting signal driver. The data signal driver may generate a data voltage to be provided for the data signal wires D1, D2, D3 . . . and Dn using the gray-scale value and control signal received from the timing controller. For example, the data signal driver may sample the gray-scale value using the clock signal and apply the data voltage corresponding to the gray-scale value to the data signal wires D1 to Dn taking pixel row as the unit. Herein, n may be a natural number. The scanning signal driver may receive the clock signal, the scan starting signal, etc., from the timing controller to generate a scanning signal to be provided for the scanning signal wires S1, S2, S3 . . . and Sm. For example, the scanning signal driver may sequentially provide the scanning signal with an on-level pulse for the scanning signal wires S1 to Sm. For example, the scanning signal driver may be structured in form of a shift register and sequentially transmit the scan starting signal provided in form of the on-level pulse to a next-stage circuit to generate the scanning signal under the control of the clock signal. Herein, m may be a natural number. The emitting signal driver may receive the clock signal, the emission stopping signal, etc., from the timing controller to generate an emitting signal to be provided for the emitting signal wires E1, E2, E3 . . . and Eo. For example, the emitting signal driver may sequentially provide the emitting signal with an off-level pulse for the emitting signal wires E1 to Eo. For example, the emitting signal driver may be structured in form of a shift register and sequentially transmit the emission stopping signal provided in form of the off-level pulse to a next-stage circuit to generate the emitting signal under the control of the clock signal. Herein, o may be a natural number. The pixel array may include multiple sub-pixels Pxij. At least one of the sub-pixels Pxij may include a pixel driving circuit and an emitting device. The pixel driving circuit may be connected to a corresponding data signal wire, a corresponding scanning signal wire, and a corresponding emitting signal wire, and is configured to, under the control of the scanning signal wire and the emitting signal wire, receive a data voltage transmitted by the data signal wire and output a corresponding current to the emitting device. The emitting device is configured to emit light of corresponding luminance in response to the current output by the pixel driving circuit of the corresponding sub-pixel. Herein, i and j may be natural numbers. The sub-pixel Pxij may refer to a sub-pixel of which a pixel driving circuit is connected to an ith scanning signal wire and a jth data signal wire.

Figure 2:
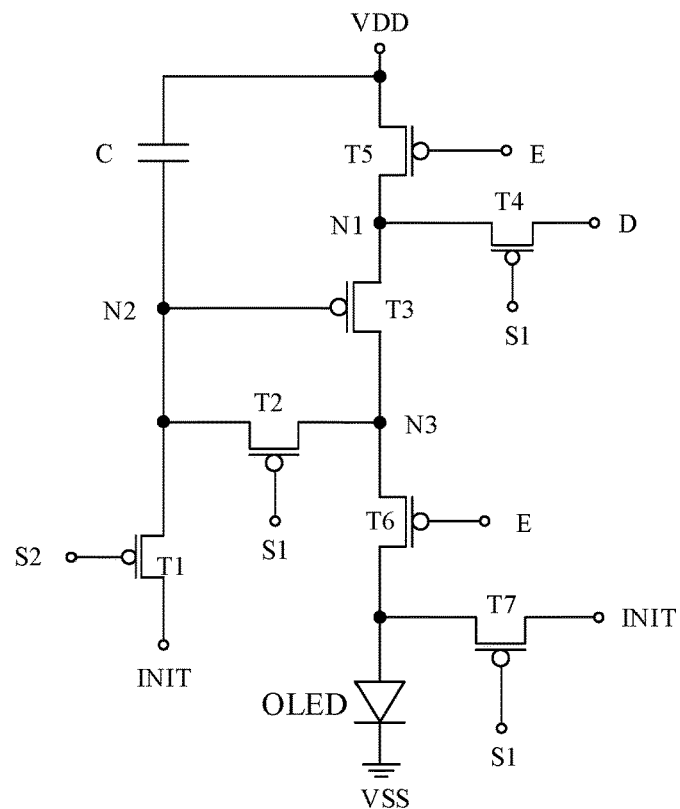
FIG. 2 is a schematic equivalent circuit diagram of a pixel driving circuit.

In an exemplary implementation mode, the pixel driving circuit may be of a 3T1C, 4T1C, 5T1C, 5T2C, 6T1C, or 7T1C structure. FIG. 2 is a schematic equivalent circuit diagram of a pixel driving circuit. As shown in FIG. 2, the pixel driving circuit may include seven transistors (a first transistor T1 to a seventh transistor T7), a storage capacitor C, and seven signal wires (a data signal wire D, a first scanning signal wire S1, a second scanning signal wire S2, an emitting signal wire E, an initial signal wire INIT, a first power wire VDD, and a second power wire VS S).

In an exemplary implementation mode, a first terminal of the storage capacitor C is connected with the first power wire VDD. A second terminal of the storage capacitor C is connected with a second node N2, namely the second terminal of the storage capacitor C is connected with a control electrode of the third transistor T3.

A control electrode of the first transistor T1 is connected with the second scanning signal wire S2. A first electrode of the first transistor T1 is connected with the initial signal wire INIT. A second electrode of the first transistor is connected with the second node N2. When an on-level scanning signal is applied to the second scanning signal wire S2, the first transistor T1 transmits an initial voltage to the control electrode of the third transistor T3 so as to initialize the quantity of electric charges of the control electrode of the third transistor T3.

A control electrode of the second transistor T2 is connected with the first scanning signal wire S1. A first electrode of the second transistor T2 is connected with the second node N2. A second electrode of the second transistor T2 is connected with a third node N3. When the on-level scanning signal is applied to the first scanning signal wire S1, the second electrode of the second transistor T2 is connected with the control electrode of the third transistor T3.

The control electrode of the third transistor T3 is connected with the second node N2, namely the control electrode of the third transistor T3 is connected with the second terminal of the storage capacitor C. A first electrode of the third transistor T3 is connected with a first node N1. A second electrode of the third transistor T3 is connected with the third node N3. The third transistor T3 may be referred to as a drive transistor. The third transistor T3 determines a magnitude of a drive current flowing between the first power wire VDD and the second power wire VSS according to a potential difference between the control electrode and first electrode of the third transistor T3.

A control electrode of the fourth transistor T4 is connected with the first scanning signal wire S1. A first electrode of the fourth transistor T4 is connected with the data signal wire D. A second electrode of the fourth transistor T4 is connected with the first node N1. The fourth transistor T4 may be referred to as a switch transistor, a scanning transistor, etc. When the on-level scanning signal is applied to the first scanning signal wire S1, the fourth transistor T4 drives a data voltage of the data signal wire D to be input to the pixel driving circuit.

A control electrode of the fifth transistor T5 is connected with the emitting signal wire E. A first electrode of the fifth transistor T5 is connected with the first power wire VDD. A second electrode of the fifth transistor T5 is connected with the first node N1. A control electrode of the sixth transistor T6 is connected with the emitting signal wire E. A first electrode of the sixth transistor T6 is connected with the third node N3. A second electrode of the sixth transistor T6 is connected with a first electrode of the emitting device. The fifth transistor T5 and the sixth transistor T6 may be referred to as emitting transistors. When an on-level emitting signal is applied to the emitting signal wire E, the fifth transistor T5 and the sixth transistor T6 form a drive current path between the first power wire VDD and the second power wire VSS to drive the emitting device to emit light.

A control electrode of the seventh transistor T7 is connected with the first scanning signal wire S1. A first electrode of the seventh transistor T7 is connected with the initial signal wire INIT. A second electrode of the seventh transistor T7 is connected with the first electrode of the emitting device. When the on-level scanning signal is applied to the first scanning signal wire S1, the seventh transistor T7 transmits the initial voltage to the first electrode of the emitting device so as to initialize the quantity of electric charges accumulated in the first electrode of the emitting device or release the electric charges accumulated in the first electrode of the emitting device.

In an exemplary implementation mode, a second electrode of the emitting device is connected with the second power wire VSS. A signal of the second power wire VSS is a low-level signal. A signal of the first power wire VDD is a signal that keeps providing a high level. The first scanning signal wire S1 is a scanning signal wire in the pixel driving circuit of a present display row, and the second scanning signal wire S2 is a scanning signal wire in the pixel driving circuit of a previous display row. That is, for an nth display row, the first scanning signal wire S1 is S(n), and the second scanning signal wire S2 is S(n−1). The second scanning signal wire S2 of the present display row and the first scanning signal wire S1 in the pixel driving circuit of the previous display row are the same signal wire. Signal wires of the display panel may be reduced, so that the display panel has a narrow border.

In an exemplary implementation mode, the first transistor T1 to the seventh transistor T7 may be P-type transistors or N-type transistors. Adopting the same type of transistors in the pixel driving circuit may simplify the process flow, reduce the process difficulties of a display panel, and improve the product yield. In some possible implementation modes, the first transistor T1 to the seventh transistor T7 may include P-type transistors and N-type transistors.

In an exemplary implementation mode, the first scanning signal wire S1, the second scanning signal wire S2, the emitting signal wire E and the initial signal wire INIT extend horizontally. The second power wire VSS, the first power wire VDD and the data signal wire D extend vertically.

In an exemplary implementation mode, the emitting device may be an Organic Light Emitting Diode (OLED), including a first electrode (anode), organic emitting layer and second electrode (cathode) that are stacked.

Figure 3:
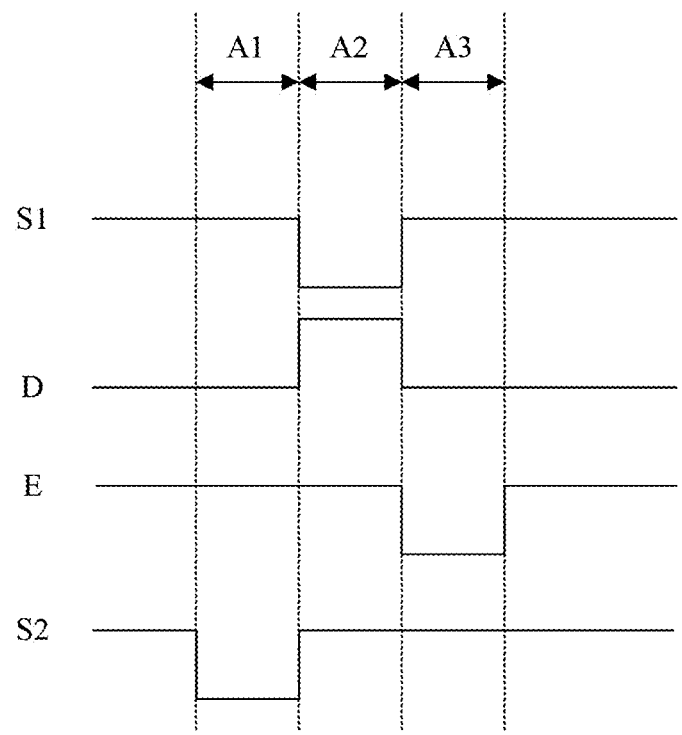
FIG. 3 is a working sequence diagram of a pixel driving circuit.

FIG. 3 is a working sequence diagram of a pixel driving circuit. An exemplary embodiment of the present disclosure will be described below through a working process of the pixel driving circuit shown in FIG. 2. In FIG. 2, the pixel driving circuit includes seven transistors (a first transistor T1 to a seventh transistor T7), a storage capacitor C, and seven signal wires (a data signal wire D, a first scanning signal wire S1, a second scanning signal wire S2, an emitting signal wire E, an initial signal wire INIT, a first power wire VDD, and a second power wire VSS). All of the seven transistors are P-type transistors.

In an exemplary implementation mode, the working process of the pixel driving circuit may include the following operations.

In a first stage A1, referred to as a reset stage, a signal of the second scanning signal wire S2 is a low-level signal, and signals of the first scanning signal wire S1 and the emitting signal wire E are high-level signals. The signal of the second scanning signal wire S2 is a low-level signal, so that the first transistor T1 is turned on, and a signal of the initial signal wire INIT is provided for the second node N2 to initialize the storage capacitor C to clear an original data voltage in the storage capacitor. The signals of the first scanning signal wire S1 and the emitting signal wire E are high-level signals, so that the second transistor T2, the fourth transistor T4, the fifth transistor T5, the sixth transistor T6, and the seventh transistor T7 are turned off. The OLED does not emit light in this stage.

In a second stage A2, referred to as a data write stage or a threshold compensation stage, the signal of the first scanning signal wire S1 is a low-level signal, the signals of the second scanning signal wire S2 and the emitting signal wire E are high-level signals, and the data signal wire D outputs a data voltage. In this stage, the second terminal of the storage capacitor C is a low level, so that the third transistor T3 is turned on. The signal of the first scanning signal wire S1 is a low-level signal, so that the second transistor T2, the fourth transistor T4, and the seventh transistor T7 are turned on. The second transistor T2 and the fourth transistor T4 are turned on, so that the data voltage output by the data signal wire D is provided for the second node N2 through the first node N1, the turned-on third transistor T3, the third node N3, and the turned-on second transistor T2, and the storage capacitor C is charged with a difference between the data voltage output by the data signal wire D and a threshold voltage of the third transistor T3. Herein, a voltage at the second terminal (the second node N2) of the storage capacitor C is Vd−|Vth|, where Vd represents the data voltage output by the data signal wire D, and Vth represents the threshold voltage of the third transistor T3. The seventh transistor T7 is turned on, so that the initial voltage of the initial signal wire INIT is provided for a first electrode of the OLED to initialize (reset) the first electrode of the OLED and clear a pre-stored voltage therein to complete initialization to ensure that the OLED does not emit light. The signal of the second scanning signal wire S2 is a high-level signal, so that the first transistor T1 is turned off. The signal of the emitting signal wire E is a high-level signal, so that the fifth transistor T5 and the sixth transistor T6 are turned off.

In a third stage A3, referred to as an emitting stage, the signal of the emitting signal wire E is a low-level signal, and the signals of the first scanning signal wire S1 and the second scanning signal wire S2 are high-level signals. The signal of the emitting signal wire E is a low-level signal, so that the fifth transistor T5 and the sixth transistor T6 are turned on, and a power voltage output by the first power wire VDD provides a drive voltage for the first electrode of the OLED through the turned-on fifth transistor T5, the third transistor T3, and the sixth transistor T6 to drive the OLED to emit light.

In a driving process of the pixel driving circuit, a drive current flowing through the third transistor T3 (drive transistor) is determined by a voltage difference between the gate electrode and first electrode thereof. A voltage of the second node N2 is Vdata−|Vth|, so that the drive current of the third transistor T3 is:

$$I=K^*(Vgs-Vth)^2=K^*[(Vdd-Vd+|Vth|)-Vth]^2=K^*[(Vdd-Vd]^2,$$

where I represents the drive current flowing through the third transistor T3, i.e., a drive current for driving the OLED, K is a constant, Vgs represents the voltage difference between the gate electrode and first electrode of the third transistor T3, Vth represents the threshold voltage of the third transistor T3, Vd represents the data voltage output by the data signal wire D, and Vdd represents the power voltage output by the first power wire VDD.

An exemplary embodiment of the present disclosure provides a display panel. The display panel may include a display substrate and a touch panel arranged on the display substrate. The display substrate includes multiple sub-pixels. At least one of the sub-pixels includes an emitting region and a non-emitting region located on a periphery of the emitting region. The touch panel includes multiple touch electrodes. At least one of the touch electrodes includes multiple grid patterns enclosed by metal wires. An orthographic projection of the emitting region on the display substrate is located within a range of that of a region enclosed by the metal wires on the display substrate. An orthographic projection of the metal wire on the display substrate is located within a range of that of the non-emitting region on the display substrate.

At least one of the grid patterns includes a first edge, second edge, third edge and fourth edge that form a ring. The first edge and the third edge extend in a second direction, and the second edge and the fourth edge extend in a first direction, the first direction intersecting the second direction. A shape of the grid pattern includes at least one of a first curved ring, a second curved ring, a third curved ring, and a fourth curved ring. A first edge and third edge of the first curved ring are curves curved towards a direction opposite to the first direction. A first edge and third edge of the second curved ring are curves curved towards the first direction. A second edge and fourth edge of the third curved ring are curves curved towards the second direction. A second edge and fourth edge of the fourth curved ring are curves curved towards a direction opposite to the second direction.

In an exemplary implementation mode, the display substrate at least includes a first pixel unit and a second pixel unit adjacent to the first pixel unit in the second direction. Each of the first pixel unit and the second pixel unit includes a first sub-pixel emitting first-color light, a second sub-pixel emitting second-color light, and a third sub-pixel emitting third-color light. The touch electrode includes a first repetitive unit and a second repetitive unit adjacent to the first repetitive unit in the second direction. Each of the first repetitive unit and the second repetitive unit includes a first grid pattern corresponding to a position of the first sub-pixel, a second grid pattern corresponding to a position of the second sub-pixel, and a third grid pattern corresponding to a position of the third sub-pixel. A shape of the first grid pattern in the first repetitive unit is any one of a first curved ring and a second curved ring, and a shape of the first grid pattern in the second repetitive unit is the other of the first curved ring and the second curved ring.

In an exemplary implementation mode, the display substrate at least includes a first pixel unit and a third pixel unit adjacent to the first pixel unit in the first direction. Each of the first pixel unit and the third pixel unit includes a first sub-pixel emitting first-color light, a second sub-pixel emitting second-color light, and a third sub-pixel emitting third-color light. The touch electrode includes a first repetitive unit and a third repetitive unit adjacent to the first repetitive unit in the first direction. Each of the first repetitive unit and the third repetitive unit includes a first grid pattern corresponding to a position of the first sub-pixel, a second grid pattern corresponding to a position of the second sub-pixel, and a third grid pattern corresponding to a position of the third sub-pixel. A shape of the first grid pattern in the first repetitive unit is any one of a third curved ring and a fourth curved ring, and a shape of the first grid pattern in the third repetitive unit is the other of the third curved ring and the fourth curved ring.

In an exemplary implementation mode, the display substrate includes multiple pixel units. At least one of the pixel units includes a first sub-pixel emitting first-color light, a second sub-pixel emitting second-color light, and a third sub-pixel emitting third-color light. The touch electrode includes multiple repetitive units. At least one of the repetitive units includes a first grid pattern corresponding to a position of the first sub-pixel, a second grid pattern corresponding to a position of the second sub-pixel, and a third grid pattern corresponding to a position of the third sub-pixel. In at least one of the repetitive units, a shape of the first grid pattern is any one of a first curved ring and a second curved ring, and a shape of the third grid pattern is the other of the first curved ring and the second curved ring.

In an exemplary implementation mode, the display substrate includes multiple pixel units. At least one of the pixel units includes a first sub-pixel emitting first-color light, a second sub-pixel emitting second-color light, and a third sub-pixel emitting third-color light. The touch electrode includes multiple repetitive units. At least one of the repetitive units includes a first grid pattern corresponding to a position of the first sub-pixel, a second grid pattern corresponding to a position of the second sub-pixel, and a third grid pattern corresponding to a position of the third sub-pixel. Shapes of the first grid pattern and second grid pattern in at least one of the repetitive units are the same curved ring.

In an exemplary implementation mode, at least one of the touch electrodes includes a wavy first electrode edge extending in the second direction and a wavy second electrode edge extending in the first direction. At a junction of the first electrode edge and the second electrode edge, an included angle between a tangent of the first electrode edge and the second direction ranges from 12° to 18°, and an included angle between a tangent of the second electrode edge and the first direction ranges from 12° to 18°.

Figure 4:
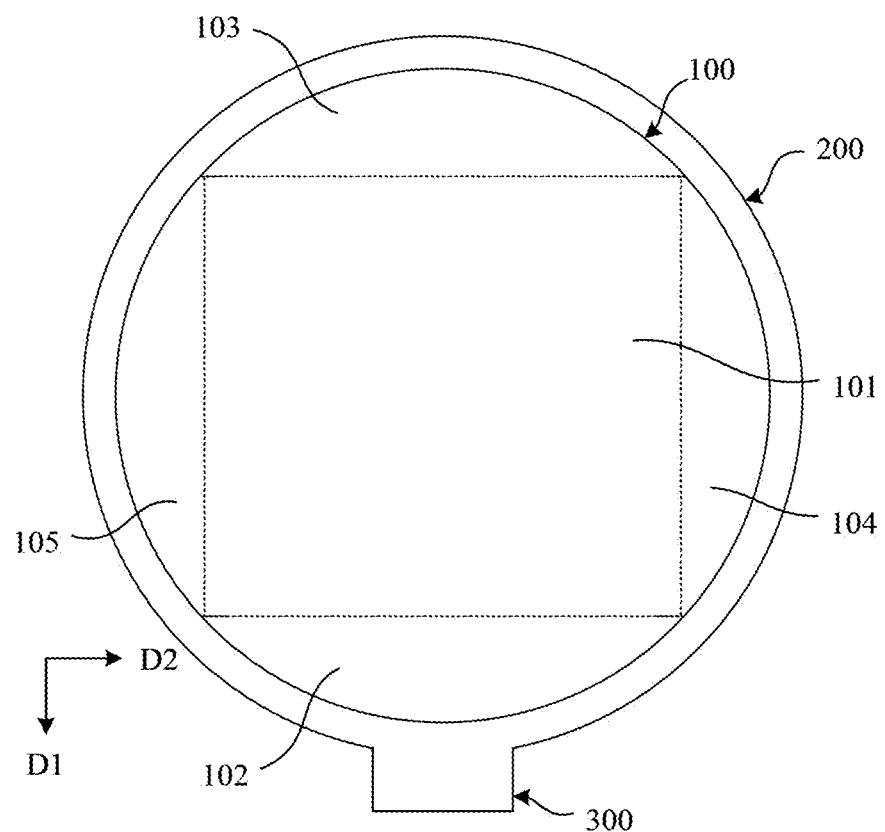
FIG. 4 is a structural schematic diagram of a touch panel according to an exemplary embodiment of the present disclosure.

FIG. 4 is a structural schematic diagram of a touch panel according to an exemplary embodiment of the present disclosure. As shown in FIG. 4, in a plane parallel to the touch panel, the touch panel includes a touch region 100, a bonding region 300 located at a side of the touch region 100 in a first direction D1, and a border region 200 located at another side of the touch region 100. In an exemplary implementation mode, a shape of the touch region 100 may be a round. The round touch region 100 is configured to arrange multiple touch electrodes. A shape of the border region 200 may be a ring surrounding the touch region 100. The ring-shaped border region 200 is configured to arrange multiple signal leads. A first end of at least one of the signal leads is connected with at least one touch electrode in the touch region 100, while a second end extends to the bonding region 300 along a border shape. A shape of the border region 300 may be a rectangle. The bonding region 300 is configured to connect the multiple signal leads with an external control device.

In an exemplary implementation mode, the bonding region 300 may sequentially include a wire leading-out region, a bending region, a circuit region and a bonding pin region in the first direction D1 (i.e., a direction away from the touch region 100). The wire leading-out region is configured to collect the multiple signal leads together. The bending region is configured to bend the bonding region to a back surface of the touch panel. The circuit region is configured to arrange a corresponding integrated circuit. The bonding pin region is configured to arrange multiple bonding pins. The multiple bonding pins may bond a Flexible Printed Circuit (FPC) so as to connect the multiple signal leads with the external control device through the multiple bonding pins. In an exemplary implementation mode, the integrated circuit arranged in the circuit region may be a Touch and Display Driver Integration (TDDI).

As shown in FIG. 4, the round touch region 100 may be divided into multiple electrode regions. In an exemplary implementation mode, the multiple electrode regions may include a first electrode region 101 located in the middle of the touch region 100, a second electrode region 102 located at a side (lower side) of the first electrode region 101 in the first direction D1, a third electrode region 103 located at a side (upper side) of the first electrode region 101 in a direction opposite to the first direction D1, a fourth electrode region 104 located at a side (right side) of the first electrode region 101 in a second direction D2, and a fifth electrode region 105 located at a side (left side) of the first electrode region 101 in a direction opposite to the second direction D2. In an exemplary implementation mode, a shape of the first electrode region 101 may be a rectangle that may be internally tangent to the round defined by the touch region, and the rectangular first electrode region 101 is configured to arrange multiple touch electrodes in a matrix. In an exemplary implementation mode, a shape of each of the second electrode region 102, the third electrode region 103, the fourth electrode 104 and the fifth electrode region 105 may be a round crown, and the round-crown-shaped electrode region is configured to sequentially arrange multiple touch electrodes in the first direction D1 or the second direction D2.

Figure 5:
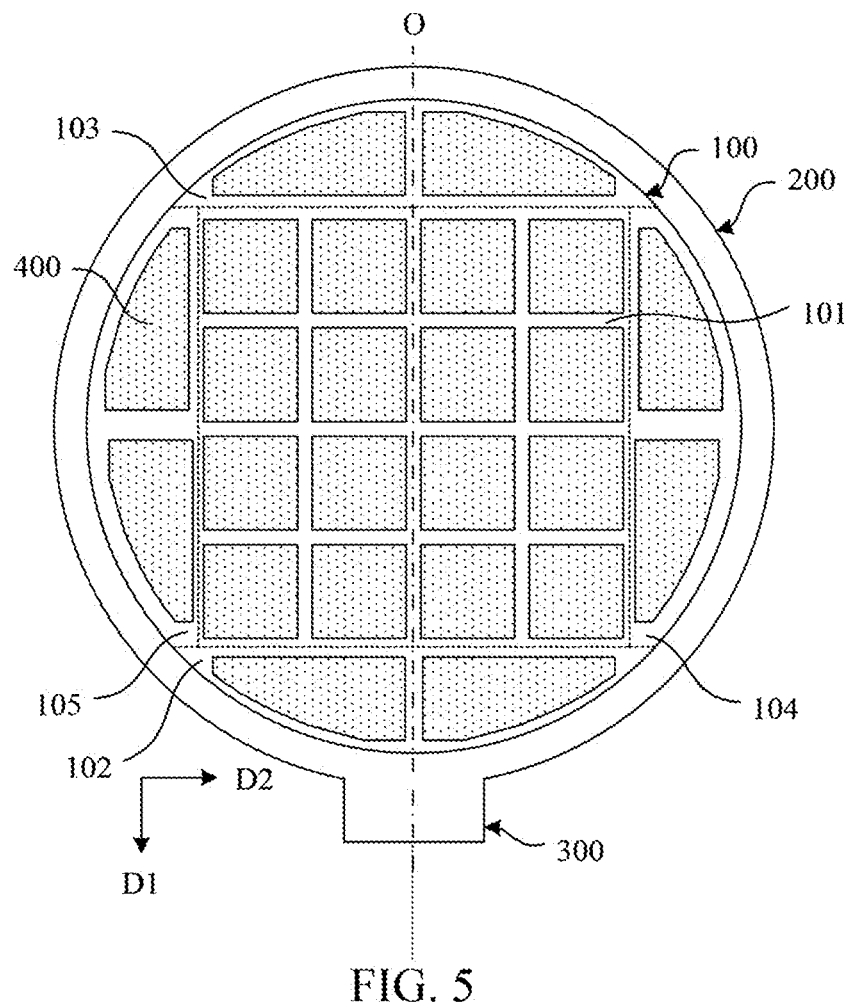
FIG. 5 is a schematic arrangement diagram of touch electrodes according to an exemplary embodiment of the present disclosure.

FIG. 5 is a schematic arrangement diagram of touch electrodes according to an exemplary embodiment of the present disclosure. For example, the touch region includes 24 self capacitance touch electrodes. As shown in FIG. 5, in a plane parallel to the touch panel, the touch region 100 may include 24 regularly arranged touch electrodes 400. In an exemplary implementation mode, the rectangular first electrode region 101 may include touch electrodes 400 arranged in a matrix with four rows and four columns. A shape of each of the touch electrodes 400 may be a rectangle. The 16 touch electrodes 400 may be the same in area. The area of each of the touch electrodes 400 is S. Each of the round-crown-shaped second electrode region 102 and third electrode region 103 may include two touch electrodes 400. The two touch electrodes 400 are sequentially arranged in the second direction D2. The two touch electrodes 400 in each of the two electrode regions may be the same in area. The area of the touch electrode 400 in the second electrode region 102 may be the same as that of the touch electrode 400 in the third electrode region 103. Each of the round-crown-shaped fourth electrode region 104 and fifth electrode region 105 may include two touch electrodes 400. The two touch electrodes 400 are sequentially arranged in the first direction D1. The two touch electrodes 400 in each of the two electrode regions may be the same in area. The area of the touch electrode 400 in the fourth electrode region 104 may be the same as that of the touch electrode 400 in the fifth electrode region 105.

In an exemplary implementation mode, the area of at least one touch electrode 400 in the second electrode region 102 and the third electrode region 103 may approximately range from 1.5S to 1.6S. For example, the area of each touch electrode 400 in the second electrode region 102 and the third electrode region 103 may be about 1.55S.

In an exemplary implementation mode, the area of at least one touch electrode 400 in the fourth electrode region 104 and the fifth electrode region 105 may approximately range from 1.47S to 1.57S. For example, the area of each touch electrode 400 in the fourth electrode region 104 and the fifth electrode region 105 may be about 1.52S.

In an exemplary implementation mode, the multiple touch electrodes 400 in the touch region 100 may be arranged symmetrically about a centerline O. The centerline O may extend in the first direction D1 and equally divide the touch region.

In an exemplary implementation mode, each of the multiple touch electrodes 400 in the first electrode region 101 may approximately be a 4 mm*4 mm or 5 mm*5 mm rectangular pattern. In some possible exemplary implementation modes, a shape of each of the multiple touch electrodes 400 in the first electrode region 101 may be a rhombus, a triangle, a polygon, or the like. During work, a touch of a finger of a person may change self capacitance of the corresponding touch electrode, and the external control device may judge a position of the finger according to a capacitance change of the touch electrode.

In an exemplary implementation mode, the touch electrodes in the touch panel may be in form of a metal grid. The metal grid is formed by interweaving multiple metal wires, and includes multiple grid patterns. The grid pattern is a polygon enclosed by multiple metal wires. The touch electrodes in form of the metal grid have the advantages of low resistance, small thickness, quick response, etc. In an exemplary implementation mode, a region enclosed by metal wires in a grid pattern includes an emitting region of a sub-pixel, and the metal wires are located in a non-emitting region between adjacent emitting regions. For example, when the display substrate is an OLED display substrate, the emitting region is a region of a pixel opening in a pixel definition layer, and the non-emitting region is a region except the pixel opening. An orthographic projection of the emitting region on the display substrate is located within a range of that of the region enclosed by the metal wires on the display substrate. An orthographic projection of the metal wire on the display substrate is located within a range of that of the non-emitting region on the display substrate.

Figures 1, 6:
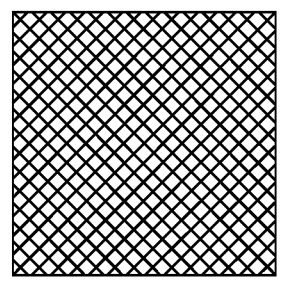
Figures 2, 6:
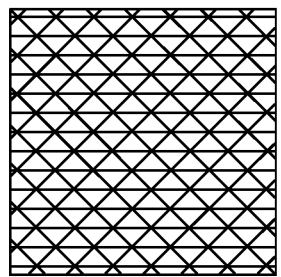
Figures 3, 6:
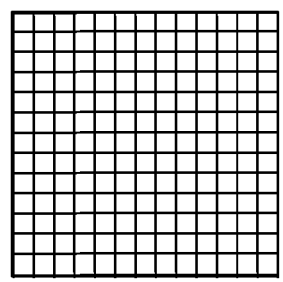
Figures 4, 6:
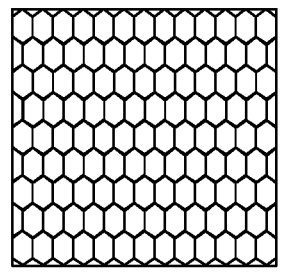
Figures 5, 6:
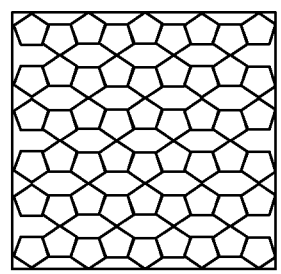

FIGS. 6-1 to 6-5 are structural schematic diagrams of several metal grids. The metal grid includes multiple grid patterns. The grid pattern is a polygon formed by metal wires. The metal grid is formed by splicing the multiple grid patterns that are repeated and consecutively arranged. In an exemplary implementation mode, a shape of a grid pattern enclosed by metal wires may be a rhombus, as shown in FIG. 6-1. Alternatively, a shape of a grid pattern enclosed by metal wires may be a triangle, as shown in FIG. 6-2. Alternatively, a shape of a grid pattern enclosed by metal wires may be a rectangle, as shown in FIG. 6-3. Alternatively, a shape of a grid pattern enclosed by metal wires may be a hexagon, as shown in FIG. 6-4. Alternatively, a shape of a grid pattern enclosed by metal wires may be a combination of multiple shapes, such as a combination of a pentagon and a hexagon, as shown in FIG. 6-5. Alternatively, a shape of a grid pattern enclosed by metal wires may include any one or more of a triangle, a square, a rectangle, a rhombus, a trapezoid, a pentagon, and a hexagon. In some possible implementation modes, a grid pattern enclosed by metal wires may be shaped regularly or irregularly. No limits are made in the present disclosure. In some possible implementation modes, a wire width of the metal wire is less than or equal to 5 μm.

Figure 7:
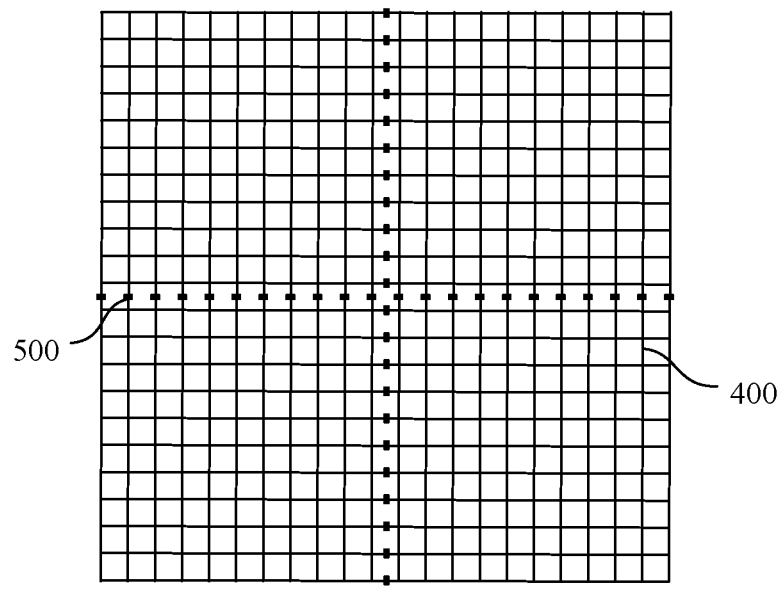
FIG. 7 is a structural schematic diagram of touch electrodes in form of a metal grid.

FIG. 7 is a structural schematic diagram of a touch electrode in form of a metal grid. For example, the grid pattern is rectangular. As shown in FIG. 7, in order to form multiple mutually insulated touch electrodes in the touch region, multiple notches 500 are formed in the metal grid. The multiple notches 500 break the metal wires of the grid patterns so as to isolate the grid patterns of adjacent touch electrodes 400. In FIG. 7, the black block represents the notch 500. The notch 500 may be understood as an imaginary line cutting the metal wire. In an exemplary implementation mode, the multiple notches 500 may divide the metal grid into a touch region and a border region. The notches 500 are formed in each grid pattern in the border region and break the metal wires of the grid patterns so as to divide each grid pattern into two portions, one portion belonging to the touch electrode 400 at one side, while the other portion belonging to the touch electrode 400 at the other side.

In an exemplary implementation mode, multiple notches (not shown) may be formed in the touch region. The multiple notches form one or more dummy regions in the touch region.

Figure 8:
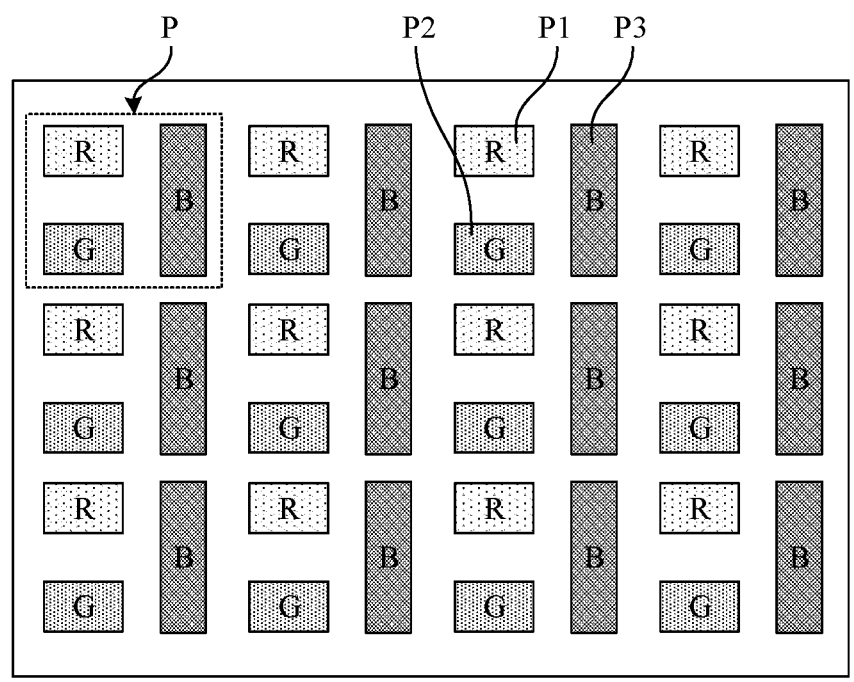
FIG. 8 is a schematic plan view of a display substrate according to an exemplary embodiment of the present disclosure.

FIG. 8 is a schematic structural plan view of a display substrate according to an exemplary embodiment of the present disclosure. As shown in FIG. 8, the display substrate may include multiple pixel units P arranged in a matrix. At least one of the pixel units P may include a first sub-pixel P1 emitting first-color light, a second sub-pixel P2 emitting second-color light, and a third sub-pixel P3 emitting third-color light. Each of the first sub-pixel P1, the second sub-pixel P2 and the third sub-pixel P3 includes a pixel driving circuit and an emitting device. The pixel driving circuit in the sub-pixel is connected with a scanning signal wire, a data signal wire and an emitting signal wire respectively. The emitting device in the sub-pixel is connected with the pixel driving circuit of the corresponding sub-pixel. The pixel driving circuit is configured to, under the control of the scanning signal wire and the emitting signal wire, receive a data voltage transmitted by the data signal wire and output a corresponding current to the emitting device. The emitting device is configured to emit light of corresponding luminance in response to the current output by the pixel driving circuit of the corresponding sub-pixel.

In an exemplary implementation mode, the first sub-pixel P1 may be a Red (R) sub-pixel, the second sub-pixel P2 may be a Green (G) sub-pixel, and the third sub-pixel P3 may be a Blue (B) sub-pixel. The three sub-pixels are arranged in a Delta shape. The rectangular R sub-pixel and the rectangular G sub-pixel are located at one side of the pixel unit, while the rectangular B sub-pixel is located at the other side of the pixel unit. An area of the B sub-pixel may approximately be a sum of areas of the R sub-pixel and the G sub-pixel. In an exemplary implementation mode, a shape of the sub-pixel may be any one or more of a triangle, a square, a rectangle, a rhombus, a trapezoid, a parallelogram, a pentagon, a hexagon, and another polygon. The multiple sub-pixels may be arranged in parallel in a horizontal direction, in parallel in a vertical direction, in an X shape, in a cross or Delta shape, etc. No limits are made in the present disclosure.

In an exemplary implementation mode, the pixel unit P may include four sub-pixels, such as a red sub-pixel, a green sub-pixel, a blue sub-pixel, and a white sub-pixel. The four sub-pixels may be arranged in parallel in a horizontal direction, in parallel in a vertical direction, or in a square. No limits are made in the present disclosure.

Figure 9:
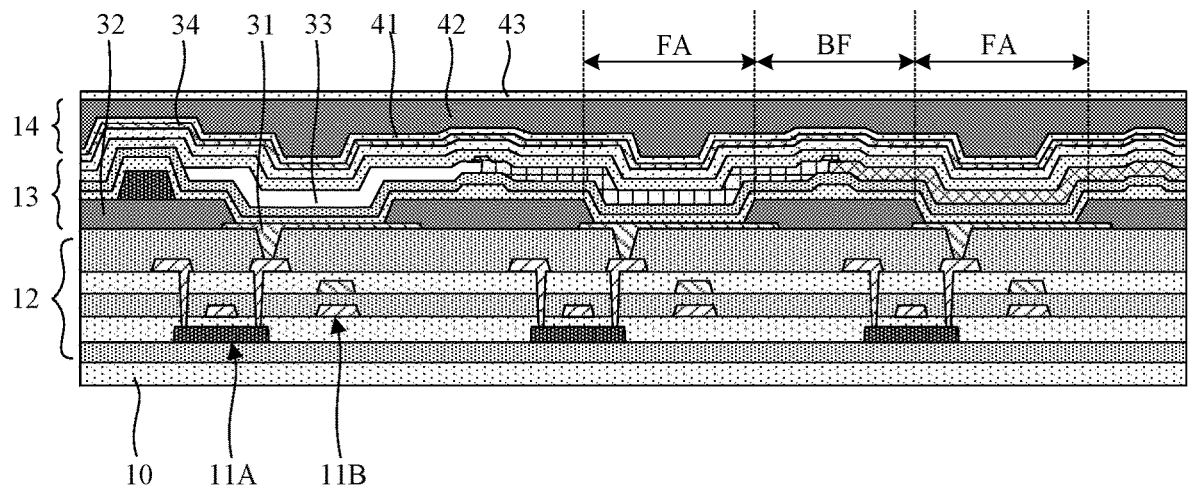
FIG. 9 is a schematic sectional view of a display substrate according to an exemplary embodiment of the present disclosure.

FIG. 9 is a schematic sectional view of a display substrate according to an exemplary embodiment of the present disclosure, and shows a structure of an OLED display substrate including three sub-pixels. As shown in FIG. 9, on a plane perpendicular to the display substrate, the display substrate may include a driving circuit layer 12 arranged on a base 10, an emitting structure layer 13 arranged at a side of the driving circuit layer 12 away from the base 10, and an encapsulation layer 14 arranged at a side of the emitting structure layer 13 away from the base 10. In some possible implementation modes, the display substrate may include another film layer, such as a photo spacer. No limits are made in the present disclosure.

In an exemplary implementation mode, the base 10 may be a flexible base or a rigid base. The driving circuit layer 12 of each sub-pixel may include multiple transistors and storage capacitor that form a pixel driving circuit. FIG. 9 only shows one transistor 11A and one storage capacitor 11B as an example. The emitting structure layer 13 may include an anode 31, a pixel definition layer 32, an organic emitting layer 33, and a cathode 34. The anode 31 is connected with a drain electrode of the transistor 11A through a via. The pixel definition layer 32 covers the anode 31, and is provided with a pixel opening exposing the anode 31. The organic emitting layer 33 is connected with the anode 31 through the pixel opening. The cathode 34 is connected with the organic emitting layer 33. The organic emitting layer 33 is driven by the anode 31 and the cathode 34 to emit light of a corresponding color. The encapsulation layer 14 may include a first encapsulation layer 41, second encapsulation layer 42, and third encapsulation layer 43 that are stacked. The first encapsulation layer 41 and the third encapsulation layer 43 may be made of an inorganic material. The second encapsulation layer 42 may be made of an organic material. The second encapsulation layer 42 is arranged between the first encapsulation layer 41 and the third encapsulation layer 43 so as to prevent external water vapor from entering the emitting structure layer 13. In an exemplary implementation mode, the touch panel is arranged at a side of the third encapsulation layer 43 away from the base.

In an exemplary implementation mode, the driving circuit layer of each sub-pixel may include a first insulating layer arranged on the flexible base, an active layer arranged on the first insulating layer, a second insulating layer covering the active layer, a gate electrode and first capacitor electrode arranged on the second insulating layer, a third insulating layer covering the gate electrode and the first capacitor electrode, a second capacitor electrode arranged on the third insulating layer, and a fourth insulating layer covering the second capacitor electrode, a via being formed in the fourth insulating layer and exposing the active layer, a source electrode and drain electrode arranged on the fourth insulating layer, the source electrode and the drain electrode being connected with the active layer through the via, and a planarization layer covering the above-mentioned structures. The active layer, the gate electrode, the source electrode, and the drain electrode form a transistor. The first capacitor electrode and the second capacitor electrode form a storage capacitor. In an exemplary implementation mode, the active layer may be made of a material such as amorphous Indium Gallium Zinc Oxide (a-IGZO), zinc oxynitride (ZnON), indium zinc tin oxide (IZTO), amorphous silicon (a-Si), polycrystalline silicon (p-Si), sexithiophene, or polythiophene. That is, the present disclosure is applied to a transistor manufactured based on an oxide technology, a silicon technology, or an organic matter technology.

In an exemplary implementation mode, the organic emitting layer may include an Emitting Layer (EML), as well as any one or more of the following layers: a Hole Injection Layer (HIL), a Hole Transporting Layer (HTL), an Electron Blocking Layer (EBL), a Hole Blocking Layer (HBL), an Electron Transporting Layer (ETL), and an Electron Injection Layer (EIL). In an exemplary implementation mode, the hole injection layers of all the sub-pixels may be connected together to form a through layer. The electron injection layers of all the sub-pixels may be connected together to form a through hole. The hole transporting layers of all the sub-pixels may be connected together to form a through layer. The electron transporting layers of all the sub-pixels may be connected together to form a through hole. The hole blocking layers of all the sub-pixels may be connected together to form a through hole. The emitting layers of adjacent sub-pixels may have a small overlap, or may be isolated from each other. The electron blocking layers of adjacent sub-pixels may have a small overlap, or may be isolated from each other.

In an exemplary implementation mode, each sub-pixel in the display substrate may include an emitting region and a non-emitting region. Since the organic emitting layer emits light from a region of a pixel opening defined by the pixel definition layer, the region of the pixel opening is an emitting region FA of the sub-pixel, and a region except the pixel opening is a non-emitting region BF of the sub-pixel. The non-emitting region BF is located between emitting regions FA of adjacent sub-pixels.

Figure 10:
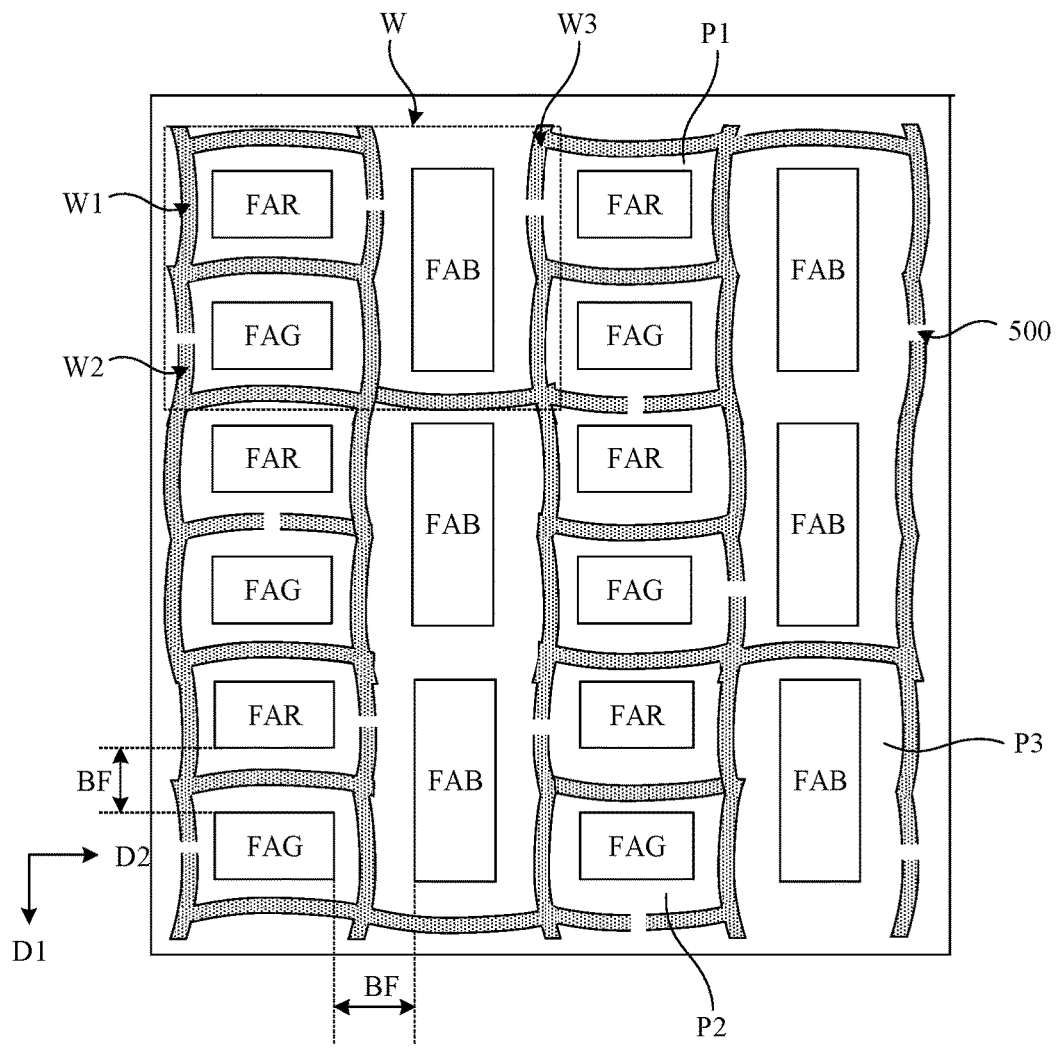
FIG. 10 is a structural schematic diagram of a metal grid according to an exemplary embodiment of the present disclosure.

FIG. 10 is a structural schematic diagram of a metal grid according to an exemplary embodiment of the present disclosure. The inclusion of four repetitive units is taken as an example. In an exemplary implementation mode, the display substrate includes multiple pixel units arranged in a matrix. Each of the pixel units may include a first sub-pixel P1 emitting red light, a second sub-pixel P2 emitting green light, and a third sub-pixel P3 emitting blue light. The first sub-pixel P1 may include a first emitting region FAR emitting light and a non-emitting region BF located on a periphery of the first emitting region FAR. The second sub-pixel P2 may include a second emitting region FAG emitting light and a second non-emitting region BF located on a periphery of the second emitting region FAG. The third sub-pixel P3 may include a third emitting region FAB emitting light and a non-emitting region BF located on a periphery of the third emitting region FAB. That is, the non-emitting regions B are located between adjacent emitting regions. In an exemplary implementation mode, a shape of each of the first emitting region FAR, the second emitting region FAG and the third emitting region FAB may be a rectangle including two horizontal edges extending in a second direction D2 and two vertical edges extending in a first direction D1, all of the two horizontal edges and the two vertical edges being straight lines. In an exemplary implementation mode, a length of the horizontal edge of the third emitting region FAB may be smaller than that of the vertical edge. Lengths of the horizontal edges of the first emitting regions FAR and the second emitting region FAG may be larger than those of the vertical edges, or the lengths of the horizontal edges may be smaller than those of the vertical edges, or the lengths of the horizontal edges may be equal to those of the vertical edges.

As shown in FIG. 10, in an exemplary implementation mode, the touch panel is arranged on the display substrate. The touch electrodes in the touch panel are in form of a metal grid. The metal grid includes multiple repetitive units W arranged in a matrix. Alternatively, the metal grid is formed by splicing multiple grid patterns that are repeated and consecutively arranged. Positions of the repetitive units W correspond to those of the pixel units on the display substrate. In an exemplary implementation mode, the repetitive unit W may include a first grid pattern W1 corresponding to a position of the first sub-pixel P1 on the display substrate, a second grid pattern W2 corresponding to a position of the second sub-pixel P2 on the display substrate, and a third grid pattern W3 corresponding to a position of the third sub-pixel P3 on the display substrate. All metal wires of the metal grid are located in regions where the non-emitting regions BF are located. An orthographic projection of the metal wire on the display substrate is located within a range of that of the non-emitting region BF on the display substrate. An orthographic projection of the emitting region FA on the display substrate is located within a range of that of a region enclosed by the metal wires on the display substrate.

In an exemplary implementation mode, a shape of each of the first grid pattern W1, the second grid pattern W2 and the third grid pattern W3 may be a ring. The ring-shaped grid pattern may at least include a first edge and third edge that extend in the second direction D2, and a second edge and fourth edge that extend in the first direction D1. The first edge, the second edge, the third edge and the fourth edge are sequentially connected end to end to form the ring-shaped grid pattern. In an exemplary implementation mode, at least one of the first edge, the second edge, the third edge and the fourth edge is curved. That is, the ring may include one or more of a first curved edge, a second curved edge, a third curved edge, and a fourth curved edge.

In an exemplary implementation mode, the first edge may be referred to as a first horizontal edge, the second edge may be referred to as a first vertical edge, the third edge may be referred to as a second horizontal edge, and the fourth edge may be referred to as a second vertical edge. Exemplary descriptions will be made below taking the condition that the ring includes a first horizontal edge and second horizontal edge that extend in the second direction D2 and a first vertical edge and second vertical edge that extend in the first direction D1 as an example.

In an exemplary implementation mode, in any ring-shaped grid pattern, a notch 500 is formed in at least one of the first horizontal edge, the second horizontal edge, the first vertical edge, and the second vertical edge. The notch 500 breaks the ring-shaped grid pattern. The notch 500 may be understood as an imaginary line cutting the horizontal edge or the vertical edge.

Figures 1, 11:
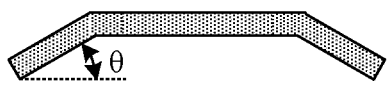
Figures 2, 11:
Figures 3, 11:
Figures 4, 11:
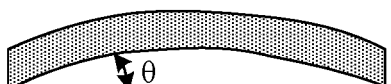
Figures 5, 11:

FIGS. 11-1 and 11-5 are structural schematic diagrams of a curve according to an exemplary embodiment of the present disclosure. In an exemplary implementation mode, a shape of the curve may include any one or more of an arc and a broken line. For example, the curve may include a first straight line, second straight line and third straight line that are sequentially connected. Mutually adjacent ends of the first straight line and the second straight line are connected with each other. Mutually adjacent ends of the second straight line and the third straight line are connected with each other. The second straight line is parallel to a reference line. Each of the first straight line and the third straight line forms an included angle θ with the reference line, the included angle θ being larger than 0° and smaller than 90°. The first straight line and the third straight line may be arranged symmetrically about the second straight line, as shown in FIG. 11-1. For another example, the curve may include a first straight line, arc and third straight line that are sequentially connected. Mutually adjacent ends of the first straight line and the arc are connected with each other. Mutually adjacent ends of the arc and the third straight line are connected with each other. Each of the first straight line and the third straight line forms an included angle θ with a reference line, the included angle θ being larger than 0° and smaller than 90°. The first straight line and the third straight line may be arranged symmetrically about the arc, as shown in FIG. 11-2. For another example, the curve may include a first arc, straight line and third arc that are sequentially connected. Mutually adjacent ends of the first arc and the straight line are connected with each other. Mutually adjacent ends of the straight line and the third arc are connected with each other. Each of the first arc and the third arc forms an included angle θ with a reference line at an end portion of each of the first arc and the third arc away from the straight line, the included angle θ being larger than 0° and smaller than 90°. The first arc and the third arc may be arranged symmetrically about the straight line, as shown in FIG. 11-3. For another example, the curve may include an arc. A tangent of the arc forms an included angle θ with a reference line at each of two end portions of the arc, the included angle θ being larger than 0° and smaller than 90°. The arc may be arranged symmetrically about a centerline of the curve, as shown in FIG. 11-4. For another example, the curve may include at least two curve segments that are sequentially connected. Each of the curve segments may include any one or more of the curves shown in FIGS. 11-1 to 11-4, as shown in FIG. 11-5. In an exemplary implementation mode, the reference line may be the first direction D1 or the second direction D2. In an exemplary implementation mode, the curve may be another arc or broken line. For example, the second straight line in the curve shown in FIG. 11-1 is removed. No limits are made in the present disclosure.

In an exemplary implementation mode, a shape of the ring-shaped grid pattern may include at least one of a first curved ring, a second curved ring, a third curved ring, and a fourth curved ring.

Figures 1, 12:
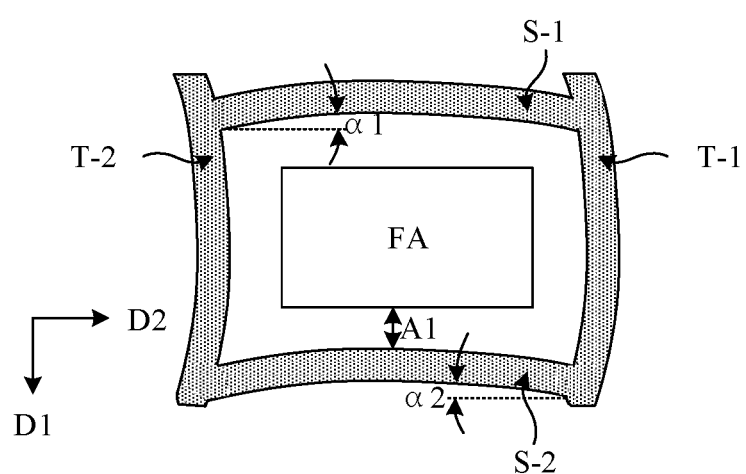
Figures 2, 12:
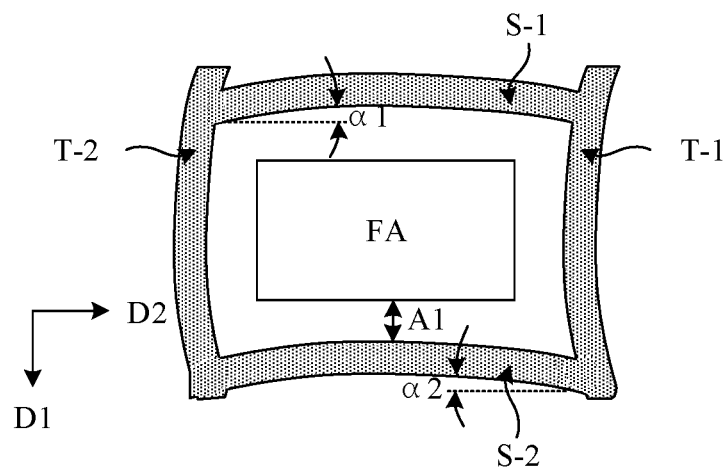
Figures 3, 12:
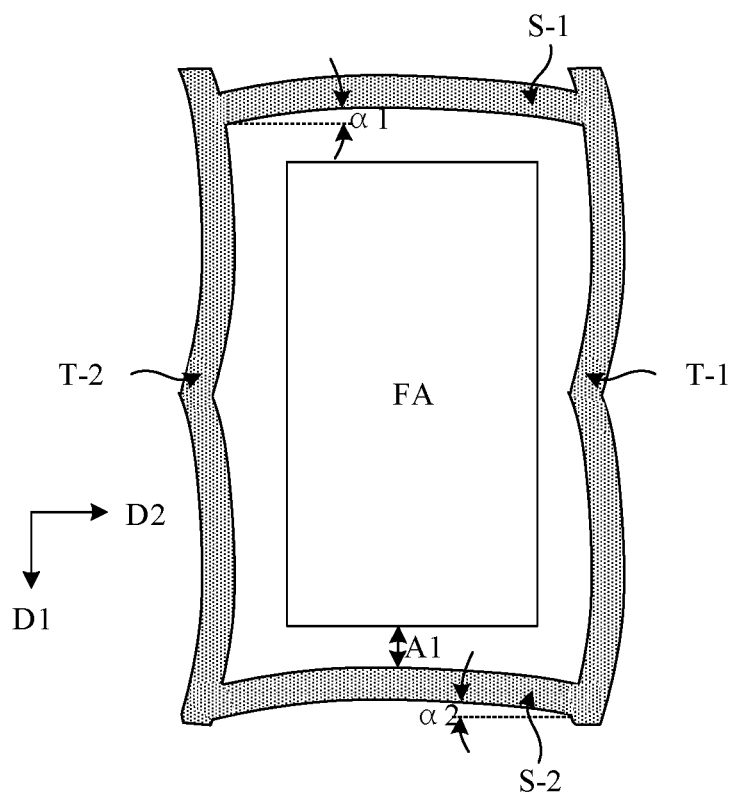

FIGS. 12-1 and 12-3 are structural schematic diagrams of a first curved ring according to an exemplary embodiment of the present disclosure. A grid pattern in a repetitive unit is taken as an example, and the curve is an arc. In an exemplary implementation mode, the first curved ring may include a first horizontal edge S-1 and second horizontal edge S-2 that are arranged opposite to each other, and a first vertical edge T-1 and second vertical edge T-2 that are arranged opposite to each other. A second end of the first horizontal edge S-1 extends in the second direction D2, and is connected with a first end of the first vertical edge T-1. A second end of the first vertical edge T-1 extends in the first direction D1, and is connected with a first end of the second horizontal edge S-2. A second end of the second horizontal edge S-2 extends in a direction opposite to the second direction D2, and is connected with a first end of the second vertical edge T-2. A second end of the second vertical edge T-2 extends in a direction opposite to the first direction D1, and is connected with the first end of the first horizontal edge S-1. That is, the first horizontal edge S-1, the first vertical edge T-1, the second horizontal edge S-2 and the second vertical edge T-2 are sequentially connected so as to form a ring surrounding the emitting region FA in the sub-pixel.

In an exemplary embodiment of the present disclosure, the first curved ring refers to that at least one of the first horizontal edge and second horizontal edge of the curved ring is a curve curved towards the direction opposite to the first direction D1. In an exemplary implementation mode, a structure of the first curved ring is exemplarily described taking the condition that both the first horizontal edge and second horizontal edge of the first curved ring are curves curved towards the direction opposite to the first direction D1 as an example.

FIG. 12-1 is a structural schematic diagram of a first curved ring according to an exemplary embodiment of the present disclosure. As shown in FIG. 12-1, in the first curved ring, both the first horizontal edge S-1 and the second horizontal edge S-2 are curved towards the direction (upwards) opposite to the first direction D1, and the first vertical edge T-1 and the second vertical edge T-2 may be curved towards the second direction D2 (rightwards). FIG. 12-2 is a structural schematic diagram of another first curved ring according to an exemplary embodiment of the present disclosure. As shown in FIG. 12-2, in the first curved ring, both the first horizontal edge S-1 and the second horizontal edge S-2 are curved towards the direction (upwards) opposite to the first direction D1, and the first vertical edge T-1 and the second vertical edge T-2 may be curved towards the direction (leftwards) opposite to the second direction D2. FIG. 12-3 is a structural schematic diagram of another first curved ring according to an exemplary embodiment of the present disclosure. As shown in FIG. 12-3, in the first curved ring, both the first horizontal edge S-1 and the second horizontal edge S-2 are curved towards the direction (upwards) opposite to the first direction D1, each of the first vertical edge T-1 and the second vertical edge T-2 includes two curve segments, the two curve segments are sequentially arranged in the first direction D1 and connected with each other, and each of the curve segments is curved towards the second direction D2 (rightwards).

In an exemplary implementation mode, an included angle α1 between a tangent of the first horizontal edge S-1 of the arc and the second direction D2 at a junction of the first horizontal edge S-1 and the first vertical edge T-1 or the second vertical edge T-2 may approximately range from 12° to 18°. An included angle α2 between a tangent of the second horizontal edge S-2 of the arc and the second direction D2 at a junction of the second horizontal edge S-2 and the first vertical edge T-1 or the second vertical edge T-2 may approximately range from 12° to 18°. In an exemplary implementation mode, the included angle α1 may be equal to the included angle α2. For example, the included angle α1 and the included angle α2 may be about 14°.

In an exemplary implementation mode, a minimum distance A1 between the second horizontal edge S-2 curved towards the emitting region FA and the emitting region FA in the first direction may approximately range from 8 μm to 10 μm. For example, the minimum distance A1 in the first direction may be about 9 μm.

In an exemplary implementation mode, the first vertical edge T-1 and second vertical edge T-2 in the first curved ring may be broken lines or curves of other forms. For example, both the first vertical edge T-1 and the second vertical edge T-2 may be straight lines. For another example, one of the first vertical edge T-1 and the second vertical edge T-2 is a straight line, while the other is a curve. For another example, when both the first vertical edge T-1 and the second vertical edge T-2 are curves, both the first vertical edge T-1 and the second vertical edge T-2 may be curved towards a direction approaching the emitting region FA, or, both the first vertical edge T-1 and the second vertical edge T-2 may be curved towards a direction away from the emitting region FA. No limits are made in the present disclosure.

In an exemplary implementation mode, in the first curved ring, the first horizontal edge (or the second horizontal edge) is a curve curved towards the direction opposite to the first direction D1, and the second horizontal edge (or the first horizontal edge) is a straight line or a curve of another form. No limits are made in the present disclosure.

Figures 1, 13:
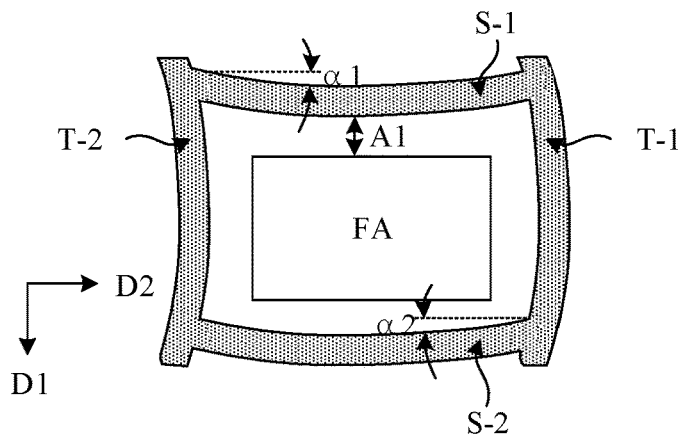
Figures 2, 13:
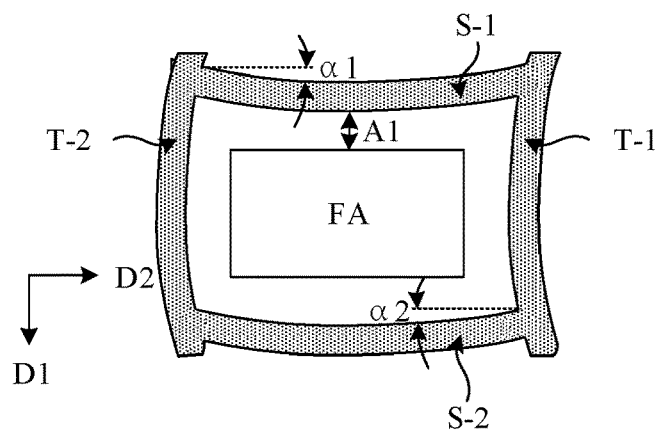
Figures 3, 13:
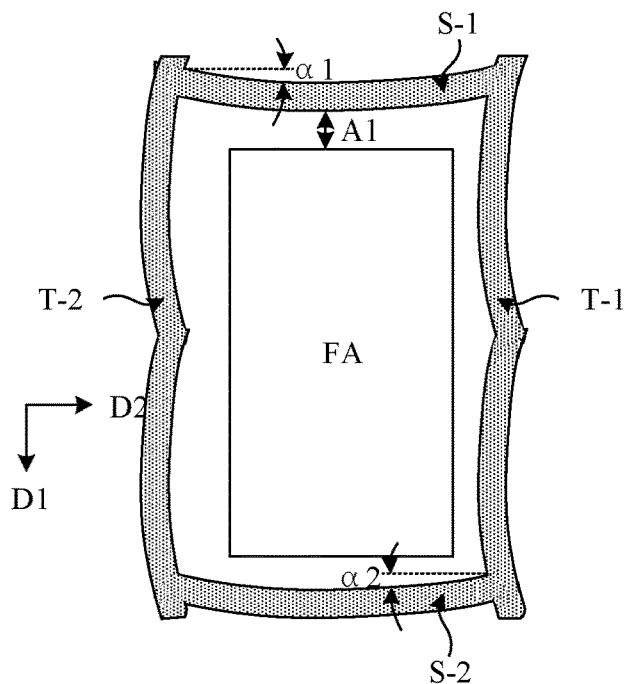

FIGS. 13-1 and 13-3 are structural schematic diagrams of a second curved ring according to an exemplary embodiment of the present disclosure. A grid pattern in a repetitive unit is taken as an example, and the curve is an arc. In an exemplary implementation mode, the second curved ring may include a first horizontal edge S-1, first vertical edge T-1, second horizontal edge S-2 and second vertical edge T-2 that are sequentially connected so as to form a ring surrounding the emitting region FA in the sub-pixel.

In an exemplary embodiment of the present disclosure, the second curved ring refers to that at least one of the first horizontal edge and second horizontal edge of the curved ring is a curve curved towards the first direction D1. In an exemplary implementation mode, a structure of the second curved ring is exemplarily described taking the condition that both the first horizontal edge and second horizontal edge of the second curved ring are curves curved towards the first direction D1 as an example.

FIG. 13-1 is a structural schematic diagram of a second curved ring according to an exemplary embodiment of the present disclosure. As shown in FIG. 13-1, in the second curved ring, both the first horizontal edge S-1 and the second horizontal edge S-2 are curved towards the first direction D1 (downwards), and the first vertical edge T-1 and the second vertical edge T-2 may be curved towards the second direction D2 (rightwards). FIG. 13-2 is a structural schematic diagram of another second curved ring according to an exemplary embodiment of the present disclosure. As shown in FIG. 13-2, in the second curved ring, both the first horizontal edge S-1 and the second horizontal edge S-2 are curved towards the first direction D1 (downwards), and the first vertical edge T-1 and the second vertical edge T-2 may be curved towards the direction (leftwards) opposite to the second direction D2. FIG. 13-3 is a structural schematic diagram of another second curved ring according to an exemplary embodiment of the present disclosure. As shown in FIG. 13-3, in the second curved ring, both the first horizontal edge S-1 and the second horizontal edge S-2 are curved towards the first direction D1 (downwards), each of the first vertical edge T-1 and the second vertical edge T-2 includes two curve segments, the two curve segments are sequentially arranged in the first direction D1 and connected with each other, and each of the curve segments is curved towards the direction (leftwards) opposite to the second direction D2.

In an exemplary implementation mode, an included angle α1 between a tangent of the first horizontal edge S-1 of the arc and the second direction D2 at a junction of the first horizontal edge S-1 and the first vertical edge T-1 or the second vertical edge T-2 may approximately range from 12° to 18°. An included angle α2 between a tangent of the second horizontal edge S-2 of the arc and the second direction D2 at a junction of the second horizontal edge S-2 and the first vertical edge T-1 or the second vertical edge T-2 may approximately range from 12° to 18°. In an exemplary implementation mode, the included angle α1 may be equal to the included angle α2. For example, the included angle α1 and the included angle α2 may be about 14°.

In an exemplary implementation mode, a minimum distance A1 between the first horizontal edge S-1 curved towards the emitting region FA and the emitting region FA in the first direction may approximately range from 8 μm to 10 μm. For example, the minimum distance A1 in the first direction may be about 9 μm.

In an exemplary implementation mode, the first vertical edge T-1 and second vertical edge T-2 in the second curved ring may be broken lines or curves of other forms. For example, both the first vertical edge T-1 and the second vertical edge T-2 may be straight lines. For another example, one of the first vertical edge T-1 and the second vertical edge T-2 is a straight line, while the other is a curve. For another example, when both the first vertical edge T-1 and the second vertical edge T-2 are curves, both the first vertical edge T-1 and the second vertical edge T-2 may be curved towards a direction approaching the emitting region FA, or, both the first vertical edge T-1 and the second vertical edge T-2 may be curved towards a direction away from the emitting region FA. No limits are made in the present disclosure.

In an exemplary implementation mode, in the second curved ring, the first horizontal edge (or the second horizontal edge) is a curve curved towards the first direction D1, and the second horizontal edge (or the first horizontal edge) is a straight line or a curve of another form. No limits are made in the present disclosure.

Figures 1, 14:
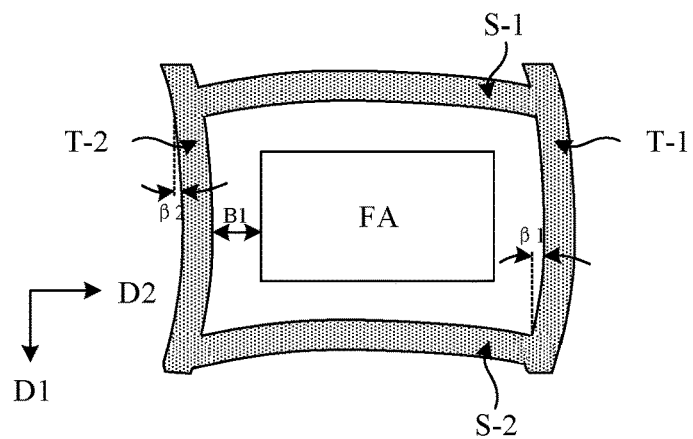
Figures 2, 14:
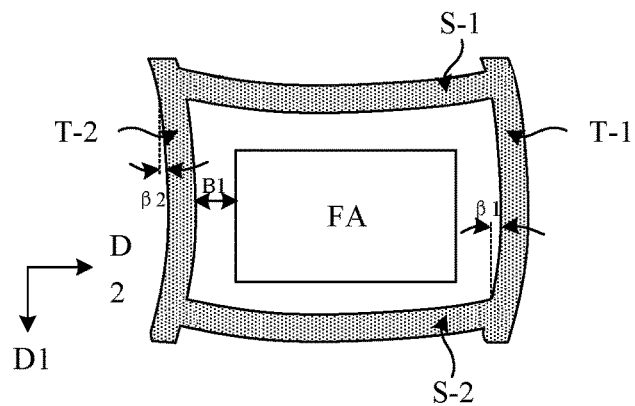
Figures 3, 14:
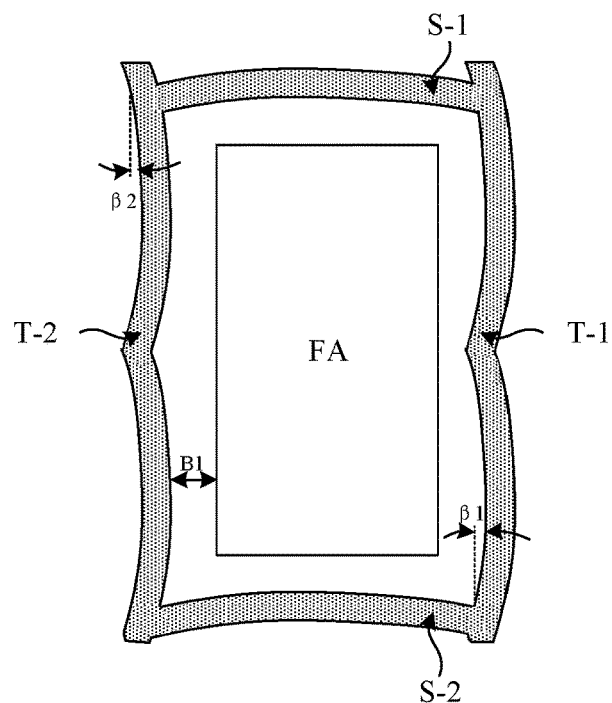

FIGS. 14-1 and 14-3 are structural schematic diagrams of a third curved ring according to an exemplary embodiment of the present disclosure. A grid pattern in a repetitive unit is taken as an example, and the curve is an arc. In an exemplary implementation mode, the third curved ring may include a first horizontal edge S-1, first vertical edge T-1, second horizontal edge S-2 and second vertical edge T-2 that are sequentially connected so as to form a ring surrounding the emitting region FA in the sub-pixel.

In an exemplary embodiment of the present disclosure, the third curved ring refers to that at least one of the first vertical edge and second vertical edge of the curved ring is a curve curved towards the second direction D2. In an exemplary implementation mode, a structure of the third curved ring is exemplarily described taking the condition that both the first vertical edge and second vertical edge of the third curved ring are curves curved towards the second direction D2 as an example.

FIG. 14-1 is a structural schematic diagram of a third curved ring according to an exemplary embodiment of the present disclosure. As shown in FIG. 14-1, in the third curved ring, both the first vertical edge T-1 and the second vertical edge T-2 are curved towards the second direction D2 (rightwards), and the first horizontal edge S-1 and the second horizontal edge S-2 may be curved towards the direction (upwards) opposite to the first direction D1. FIG. 14-2 is a structural schematic diagram of another third curved ring according to an exemplary embodiment of the present disclosure. As shown in FIG. 14-2, in the third curved ring, both the first vertical edge T-1 and the second vertical edge T-2 are curved towards the second direction D2 (rightwards), and the first horizontal edge S-1 and the second horizontal edge S-2 may be curved towards the first direction D1 (downwards). FIG. 14-3 is a structural schematic diagram of another third curved ring according to an exemplary embodiment of the present disclosure. As shown in FIG. 14-3, in the third curved ring, each of the first vertical edge T-1 and the second vertical edge T-2 includes two curve segments, the two curve segments are sequentially arranged in the first direction D1 and connected with each other, each of the curve segments is curved towards the second direction D2 (rightwards), and the first horizontal edge S-1 and the second horizontal edge S-2 may be curved towards the direction (upwards) opposite to the first direction D1.

In an exemplary implementation mode, an included angle β1 between a tangent of the first vertical edge T-1 of the arc and the first direction D1 at a junction of the first vertical edge T-1 and the first horizontal edge S-1 or the second horizontal edge S-2 may approximately range from 12° to 18°. In an exemplary implementation mode, an included angle β2 between a tangent of the second vertical edge T-2 of the arc and the first direction D1 at a junction of the second vertical edge T-2 and the first horizontal edge S-1 or the second horizontal edge S-2 may approximately range from 12° to 18°. In an exemplary implementation mode, the included angle β1 may be equal to the included angle β2. For example, the included angle β1 and the included angle β2 may be about 14°.

In an exemplary implementation mode, a minimum distance B1 between the second vertical edge T-2 curved towards the emitting region FA and the emitting region FA in the second direction may approximately range from 8 μm to 10 μm. For example, the minimum distance B1 in the second direction may be about 9 μm.

In an exemplary implementation mode, the first horizontal edge S-1 and second horizontal edge S-2 in the third curved ring may be broken lines or curves of other forms. For example, both the first horizontal edge S-1 and the second horizontal edge S-2 may be straight lines. For another example, one of the first horizontal edge S-1 and the second horizontal edge S-2 is a straight line, while the other is a curve. For another example, when both the first horizontal edge S-1 and the second horizontal edge S-2 are curves, both the first horizontal edge S-1 and the second horizontal edge S-2 may be curved towards a direction approaching the emitting region FA, or, both the first horizontal edge S-1 and the second horizontal edge S-2 may be curved towards a direction away from the emitting region FA. No limits are made in the present disclosure.

In an exemplary implementation mode, in the third curved ring, the first vertical edge (or the second vertical edge) is a curve curved towards the second direction D2, and the second vertical edge (or the first vertical edge) is a straight line or a curve of another form. No limits are made in the present disclosure.

Figures 1, 15:
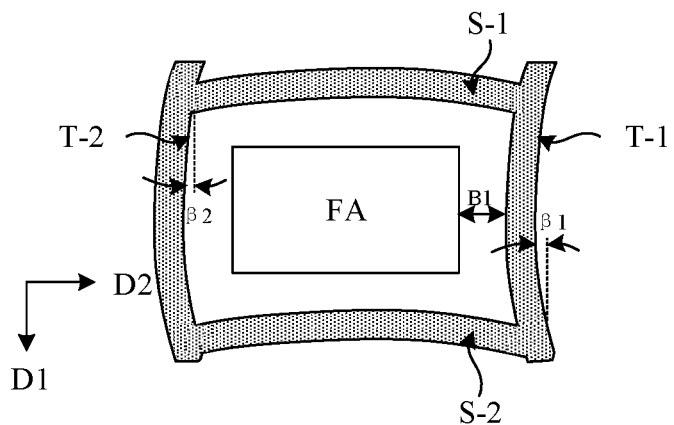
Figures 2, 15:
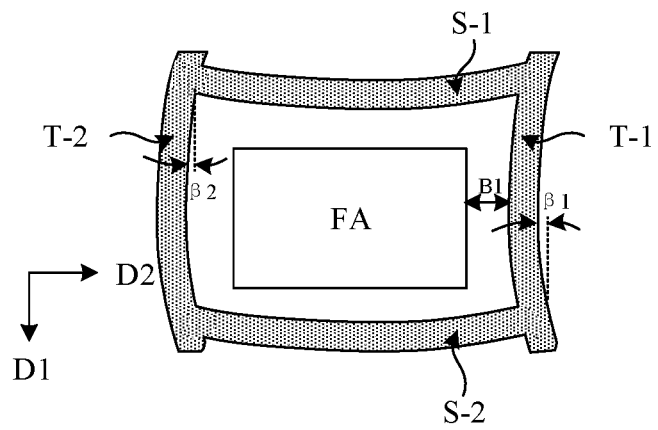
Figures 3, 15:
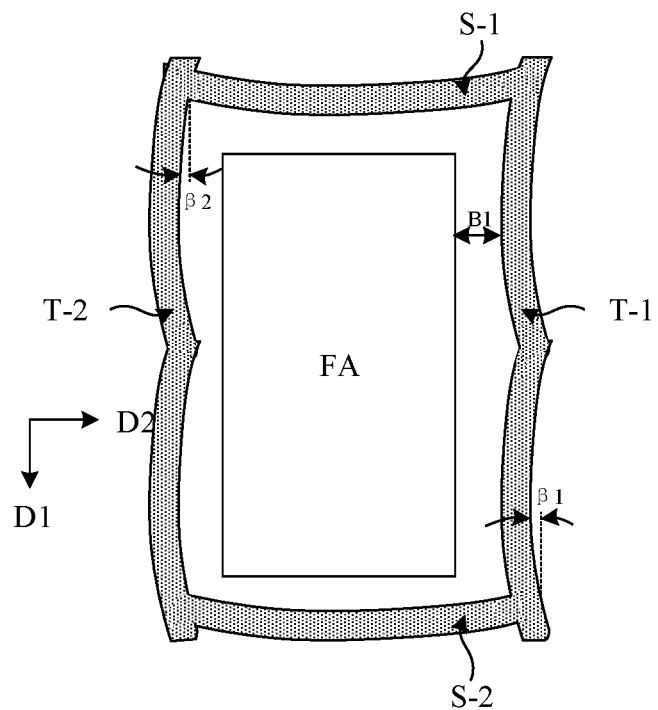

FIGS. 15-1 and 15-3 are structural schematic diagrams of a fourth curved ring according to an exemplary embodiment of the present disclosure. A grid pattern in a repetitive unit is taken as an example, and the curve is an arc. In an exemplary implementation mode, the fourth curved ring may include a first horizontal edge S-1, first vertical edge T-1, second horizontal edge S-2 and second vertical edge T-2 that are sequentially connected so as to form a ring surrounding the emitting region FA in the sub-pixel.

In an exemplary embodiment of the present disclosure, the fourth curved ring refers to that at least one of the first vertical edge and second vertical edge of the curved ring is a curve curved towards the direction opposite to the second direction D2. In an exemplary implementation mode, a structure of the fourth curved ring is exemplarily described taking the condition that both the first vertical edge and second vertical edge of the fourth curved ring are curves curved towards the direction opposite to the second direction D2 as an example.

FIG. 15-1 is a structural schematic diagram of a fourth curved ring according to an exemplary embodiment of the present disclosure. As shown in FIG. 15-1, in the fourth curved ring, both the first vertical edge T-1 and the second vertical edge T-2 are curved towards the direction (leftwards) opposite to the second direction D2, and both the first horizontal edge S-1 and the second horizontal edge S-2 may be curved towards the direction (upwards) opposite to the first direction D1. FIG. 15-2 is a structural schematic diagram of another fourth curved ring according to an exemplary embodiment of the present disclosure. As shown in FIG. 15-2, in the fourth curved ring, both the first vertical edge T-1 and the second vertical edge T-2 are curved towards the direction (leftwards) opposite to the second direction D2, and both the first horizontal edge S-1 and the second horizontal edge S-2 may be curved towards the first direction D1 (downwards). FIG. 15-3 is a structural schematic diagram of another fourth curved ring according to an exemplary embodiment of the present disclosure. As shown in FIG. 15-3, in the fourth curved ring, each of the first vertical edge T-1 and the second vertical edge T-2 includes two curve segments, the two curve segments are sequentially arranged in the first direction D1 and connected with each other, each of the curve segments is curved towards the direction (leftwards) opposite to the second direction D2, and both the first horizontal edge S-1 and the second horizontal edge S-2 may be curved towards the first direction D1 (downwards).

In an exemplary implementation mode, an included angle β1 between a tangent of the first vertical edge T-1 of the arc and the first direction D1 at a junction of the first vertical edge T-1 and the first horizontal edge S-1 or the second horizontal edge S-2 may approximately range from 12° to 18°. In an exemplary implementation mode, an included angle β2 between a tangent of the second vertical edge T-2 of the arc and the first direction D1 at a junction of the second vertical edge T-2 and the first horizontal edge S-1 or the second horizontal edge S-2 may approximately range from 12° to 18°. In an exemplary implementation mode, the included angle β1 may be equal to the included angle β2. For example, the included angle β1 and the included angle β2 may be about 14°.

In an exemplary implementation mode, a minimum distance B1 between the first vertical edge T-1 curved towards the emitting region FA and the emitting region FA in the second direction may approximately range from 8 μm to 10 μm. For example, the minimum distance B1 in the second direction may be about 9 μm.

In an exemplary implementation mode, the first horizontal edge S-1 and second horizontal edge S-2 in the fourth curved ring may be broken lines or curves of other forms. For example, both the first horizontal edge S-1 and the second horizontal edge S-2 may be straight lines. For another example, one of the first horizontal edge S-1 and the second horizontal edge S-2 is a straight line, while the other is a curve. For another example, when both the first horizontal edge S-1 and the second horizontal edge S-2 are curves, both the first horizontal edge S-1 and the second horizontal edge S-2 may be curved towards a direction approaching the emitting region FA, or, both the first horizontal edge S-1 and the second horizontal edge S-2 may be curved towards a direction away from the emitting region FA. No limits are made in the present disclosure.

In an exemplary implementation mode, in the fourth curved ring, the first vertical edge (or the second vertical edge) is a curve curved towards the direction opposite to the second direction D2, and the second vertical edge (or the first vertical edge) is a straight line or a curve of another form. No limits are made in the present disclosure.

Figure 16:
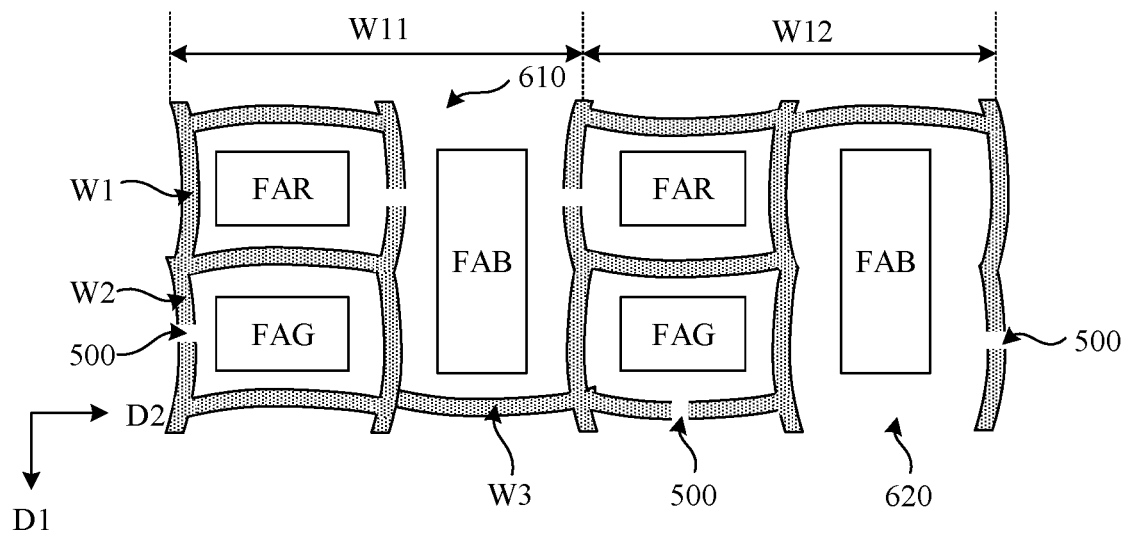
FIG. 16 is a structural schematic diagram of adjacent repetitive units according to an exemplary embodiment of the present disclosure.

FIG. 16 is a structural schematic diagram of adjacent repetitive units according to an exemplary embodiment of the present disclosure. In an exemplary implementation mode, the display substrate may include a first pixel unit and a second pixel unit adjacent to the first pixel unit in the second direction D2. Each of the first pixel unit and the second pixel unit includes a first sub-pixel emitting first-color light, a second sub-pixel emitting second-color light, and a third sub-pixel emitting third-color light. As shown in FIG. 16, the metal grid may include a first repetitive unit W11 and a second repetitive unit W12 adjacent to the first repetitive unit W11 in the second direction D2. Positions of a first grid pattern W1, second grid pattern W2 and third grid pattern W3 in the first repetitive unit W11 correspond to those of the first sub-pixel unit, second sub-pixel and third sub-pixel in the first pixel unit respectively. Positions of a first grid pattern W1, second grid pattern W2 and third grid pattern W3 in the second repetitive unit W12 correspond to those of the first sub-pixel, second sub-pixel and third sub-pixel in the second pixel unit respectively.

In an exemplary implementation mode, a curving direction of a horizontal edge (including a first horizontal edge and/or a second horizontal edge, the same below) of the first grid pattern W1 in the first repetitive unit W11 is opposite to that of a horizontal edge of the first grid pattern W1 in the second repetitive unit W12. That is, a shape of the first grid pattern in the first repetitive unit is any one of a first curved ring and a second curved ring, and a shape of the first grid pattern in the second repetitive unit is the other of the first curved ring and the second curved ring. For example, when the shape of the first grid pattern W1 in the first repetitive unit W11 is a first curved ring, a shape of the first grid pattern W1 in the second repetitive unit W12 is a second curved ring. For another example, when the shape of the first grid pattern W1 in the first repetitive unit W11 is a second curved ring, a shape of the first grid pattern W1 in the second repetitive unit W12 is a first curved ring.

In an exemplary implementation mode, a curving direction of a horizontal edge of the second grid pattern W2 in the first repetitive unit W11 is opposite to that of a horizontal edge of the second grid pattern W2 in the second repetitive unit W12. That is, a shape of the second grid pattern in the first repetitive unit is any one of a first curved ring and a second curved ring, and a shape of the second grid pattern in the second repetitive unit is the other of the first curved ring and the second curved ring. For example, when the shape of the second grid pattern W2 in the first repetitive unit W11 is a first curved ring, a shape of the second grid pattern W2 in the second repetitive unit W12 is a second curved ring. For another example, when the shape of the second grid pattern W2 in the first repetitive unit W11 is a second curved ring, a shape of the second grid pattern W2 in the second repetitive unit W12 is a first curved ring.

In an exemplary implementation mode, a curving direction of a horizontal edge of the third grid pattern W3 in the first repetitive unit W11 is opposite to that of a horizontal edge of the third grid pattern W3 in the second repetitive unit W12. That is, a shape of the third grid pattern in the first repetitive unit is any one of a first curved ring and a second curved ring, and a shape of the third grid pattern in the second repetitive unit is the other of the first curved ring and the second curved ring. For example, when the shape of the third grid pattern W3 in the first repetitive unit W11 is a first curved ring, a shape of the third grid pattern W3 in the second repetitive unit W12 is a second curved ring. For another example, when the shape of the third grid pattern W3 in the first repetitive unit W11 is a second curved ring, a shape of the third grid pattern W3 in the second repetitive unit W12 is a first curved ring.

In an exemplary implementation mode, in the first grid pattern of the first repetitive unit and the first grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction. In an exemplary implementation mode, a curving direction of a vertical edge (including a first vertical edge and/or a second vertical edge, the same below) of the first grid pattern W1 in the first repetitive unit W11 is opposite to that of a vertical edge of the first grid pattern W1 in the second repetitive unit W12. For example, when the shape of the first grid pattern W1 in the first repetitive unit W11 is a third curved ring, a shape of the first grid pattern W1 in the second repetitive unit W12 is a fourth curved ring. For another example, when the shape of the first grid pattern W1 in the first repetitive unit W11 is a fourth curved ring, a shape of the first grid pattern W1 in the second repetitive unit W12 is a third curved ring.

In an exemplary implementation mode, in the second grid pattern of the first repetitive unit and the second grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction. In an exemplary implementation mode, a curving direction of a vertical edge of the second grid pattern W2 in the first repetitive unit W11 is opposite to that of a vertical edge of the second grid pattern W2 in the second repetitive unit W12. For example, when the shape of the second grid pattern W2 in the first repetitive unit W11 is a third curved ring, a shape of the second grid pattern W2 in the second repetitive unit W12 is a fourth curved ring. For another example, when the shape of the second grid pattern W2 in the first repetitive unit W11 is a fourth curved ring, a shape of the second grid pattern W2 in the second repetitive unit W12 is a third curved ring.

In an exemplary implementation mode, a curving direction of a first vertical edge of the third grid pattern W3 in each of the first repetitive unit W11 and the second repetitive unit W12 is opposite to that of a second vertical edge. For example, in the third grid pattern W3 of the first repetitive unit W11, the first vertical edge is a curve curved towards the direction opposite to the second direction D2, while the second vertical edge is a curve curved towards the second direction D2. For another example, in the third grid pattern W3 of the second repetitive unit W12, the first vertical edge is a curve curved towards the second direction D2, while the second vertical edge is a curve curved towards the direction opposite to the second direction D2.

In an exemplary implementation mode, a second horizontal edge (third edge) of the first grid pattern W1 in each of the first repetitive unit W11 and the second repetitive unit W12 serves as a first horizontal edge (first edge) of the second grid pattern W2.

In an exemplary implementation mode, a first vertical edge (second edge) of the first grid pattern W1 in the first repetitive unit W11 together with a first vertical edge (second edge) of the second grid pattern W2 in the first repetitive unit W11 serves as a second vertical edge (fourth edge) of the third grid pattern W3 in the first repetitive unit W11. In an exemplary implementation mode, a second vertical edge (fourth edge) of the first grid pattern W1 in the second repetitive unit W12 together with a second vertical edge (fourth edge) of the second grid pattern W2 in the second repetitive unit W11 serves as a first vertical edge (second edge) of the third grid pattern W3 in the first repetitive unit W11.

In an exemplary implementation mode, a first vertical edge of the first grid pattern W1 in the second repetitive unit W12 together with a first vertical edge of the second grid pattern W2 in the second repetitive unit W12 serves as a second vertical edge of the third grid pattern W3 in the second repetitive unit W12. A second vertical edge of the first grid pattern in another first repetitive unit together with a second vertical edge of the second grid pattern in the other first repetitive unit serves as a first vertical edge of the third grid pattern in the second repetitive unit, the other first repetitive unit being a first repetitive unit adjacent to the second repetitive unit in the second direction.

In an exemplary implementation mode, at least one notch 500 is formed in each grid pattern in the first repetitive unit W11. For example, a notch 500 is formed in a first vertical edge of the first grid pattern W1, a notch 500 is formed in a second vertical edge of the second grid pattern W2, and notches 500 are formed in a first vertical edge and second vertical edge of the third grid pattern W3.

In an exemplary implementation mode, at least one notch 500 is formed in each grid pattern in the second repetitive unit W12. For example, a notch 500 is formed in a second vertical edge of the first grid pattern W1, a notch 500 is formed in a second horizontal edge of the second grid pattern W2, and a notch 500 is formed in a first vertical edge of the third grid pattern W3.

In an exemplary implementation mode, openings may be formed in the third grid patterns W3 in both the first repetitive unit W11 and the second repetitive unit W12. A first opening 610 is formed by removing a first horizontal edge of the third grid pattern W3 in the first repetitive unit W11. That is, the third grid pattern W3 in the first repetitive unit W11 only includes a first vertical edge, a second horizontal edge, and a second vertical edge, so as to form a ring with the first opening 610. The first opening 610 faces the direction opposite to the first direction D1. A second opening 620 is formed by removing a second horizontal edge of the third grid pattern W3 in the second repetitive unit W12. That is, the third grid pattern W3 in the second repetitive unit W12 only includes a first horizontal edge, a vertical edge, and a second vertical edge, so as to form a ring with the second opening 620. The second opening 620 faces the first direction D1.

In an exemplary implementation mode, the touch electrode may include multiple first repetitive unit columns and multiple second repetitive unit columns, which are arranged alternately in the second direction D2. The first repetitive unit column includes multiple first repetitive units W11 sequentially arranged in the first direction D1. The second repetitive unit column includes multiple second repetitive units W12 sequentially arranged in the first direction D1.

In an exemplary implementation mode, any one of the repetitive unit columns includes at least one connected grid pattern. The connected grid pattern is a ring surrounding two emitting regions, and is formed by arranging the third grid pattern with the first opening 610 at a side of the third grid pattern with the second opening 620 in the first direction D1. The connected grid patterns of the first repetitive unit columns are staggered with those of the second repetitive unit columns.

In an exemplary implementation mode, any one of the repetitive unit columns includes at least one common horizontal edge. The common horizontal edge serves as both a third edge of the third grid pattern with the first opening 610 and a first edge of the third grid pattern with the second opening 620. The third grid pattern with the second opening 620 is arranged at a side of the third grid pattern with the first opening 610 in the first direction. The common horizontal edges of the first repetitive unit columns are staggered with those of the second repetitive unit columns.

As shown in FIGS. 10 and 16, in an exemplary implementation mode, the metal grid may include a first repetitive unit row, second repetitive unit row, third repetitive unit row that are sequentially arranged in the first direction D1, as well as a first repetitive unit column, second repetitive unit column, third repetitive unit column that are sequentially arranged in the second direction D2. Each of the repetitive unit rows may include multiple first repetitive units W11 and multiple second repetitive units W12, the first repetitive units W11 and the second repetitive units W12 being arranged alternately. Each of the repetitive unit columns may include multiple first repetitive units W11 sequentially arranged in the first direction D1, or multiple second repetitive units W12 sequentially arranged in the first direction D1. For example, an odd repetitive unit column may include multiple first repetitive units W11, and an even repetitive unit column may include multiple second repetitive units W12.

In an exemplary implementation mode, in any one of the repetitive unit columns, a third grid pattern W3 with a first opening 610 is arranged at a side of a third grid pattern W3 with a second opening 620 in the first direction D1, so that regions enclosed by a third grid pattern W3 with a second opening 620 and an adjacent third grid pattern W3 with a first opening 610 in the first direction D1 are interconnected so as to form a connected grid pattern, the connected grid pattern being a ring surrounding two emitting regions.

In an exemplary implementation mode, the connected grid patterns in the odd repetitive unit columns are staggered with those in the even repetitive unit columns. For example, a ring surrounding two emitting regions in the first repetitive unit column is located in the second repetitive unit row and the third repetitive unit row, and a ring surrounding two emitting regions in the second repetitive unit column is located in the first repetitive unit row and the second repetitive unit row.

In an exemplary implementation mode, in any one of the repetitive unit columns, a third grid pattern W3 with a second opening 620 is arranged at a side of a third grid pattern W3 with a first opening 610 in the first direction D1, so as to form a common horizontal edge. The common horizontal edge serves as both a second horizontal edge of the third grid pattern W3 with the first opening 610 and a first horizontal edge of the third grid pattern W3 with the second opening 620. The common horizontal edge refers to that a third grid pattern W3 with a first opening 610 and an adjacent grid pattern W3 with a second opening 620 in the first direction share the same horizontal edge.

In an exemplary implementation mode, the common horizontal edges in the odd repetitive unit columns are staggered with those in the even repetitive unit columns. For example, a common horizontal edge in the first repetitive unit column is located between the first repetitive unit row and the second repetitive unit row, and a common horizontal edge in the second repetitive unit column is located between the second repetitive unit row and the third repetitive unit row.

Figure 17:
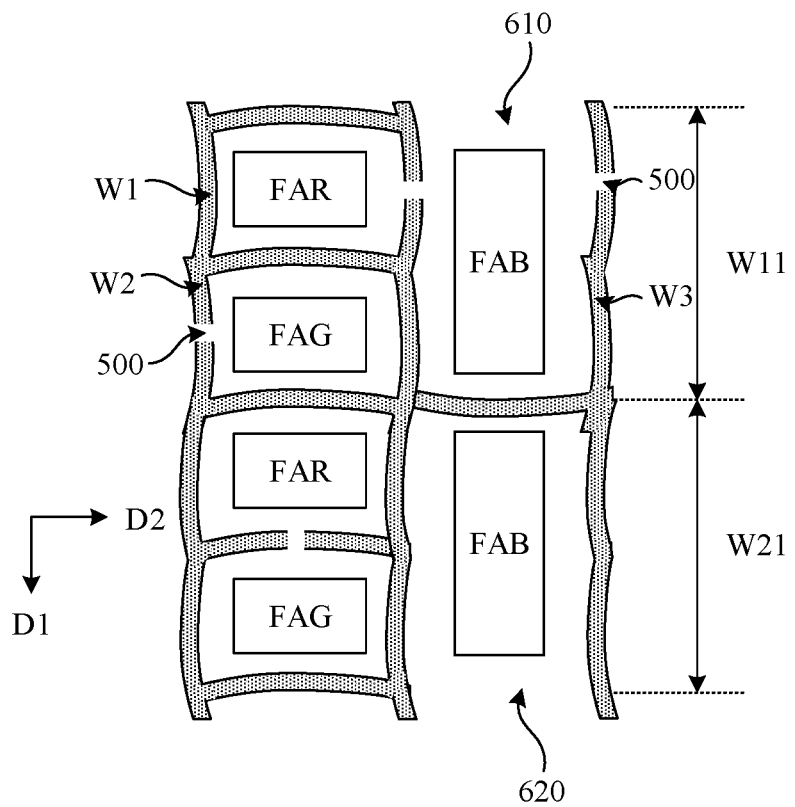
FIG. 17 is another structural schematic diagram of adjacent repetitive units according to an exemplary embodiment of the present disclosure.

FIG. 17 is another structural schematic diagram of adjacent repetitive units according to an exemplary embodiment of the present disclosure. In an exemplary implementation mode, the display substrate may include a first pixel unit and a third pixel unit adjacent to the first pixel unit in the first direction D1. Each of the first pixel unit and the third pixel unit includes a first sub-pixel emitting first-color light, a second sub-pixel emitting second-color light, and a third sub-pixel emitting third-color light. As shown in FIG. 17, the metal grid may include a first repetitive unit W11 and a third repetitive unit W21 adjacent to the first repetitive unit W11 in the first direction D1. Positions of a first grid pattern W1, second grid pattern W2 and third grid pattern W3 in the first repetitive unit W11 correspond to those of the first sub-pixel unit, second sub-pixel and third sub-pixel in the first pixel unit respectively. Positions of a first grid pattern W1, second grid pattern W2 and third grid pattern W3 in the third repetitive unit W21 correspond to those of the first sub-pixel, second sub-pixel and third sub-pixel in the third pixel unit respectively.

In an exemplary implementation mode, a curving direction of a vertical edge of the first grid pattern W1 in the first repetitive unit W11 is opposite to that of a vertical edge of the first grid pattern W1 in the third repetitive unit W21. That is, a shape of the first grid pattern in the first repetitive unit is any one of a third curved ring and a fourth curved ring, and a shape of the first grid pattern in the third repetitive unit is the other of the third curved ring and the fourth curved ring. For example, when the shape of the first grid pattern W1 in the first repetitive unit W11 is a third curved ring, a shape of the first grid pattern W1 in the third repetitive unit W21 is a fourth curved ring. For another example, when the shape of the first grid pattern W1 in the first repetitive unit W11 is a fourth curved ring, a shape of the first grid pattern W1 in the third repetitive unit W21 is a third curved ring.

In an exemplary implementation mode, a curving direction of a vertical edge of the second grid pattern W2 in the first repetitive unit W11 is opposite to that of a vertical edge of the second grid pattern W2 in the third repetitive unit W21. That is, a shape of the second grid pattern in the first repetitive unit is any one of a third curved ring and a fourth curved ring, and a shape of the second grid pattern in the third repetitive unit is the other of the third curved ring and the fourth curved ring. For example, when the shape of the second grid pattern W2 in the first repetitive unit W11 is a third curved ring, a shape of the second grid pattern W2 in the third repetitive unit W21 is a fourth curved ring. For another example, when the shape of the second grid pattern W2 in the first repetitive unit W11 is a fourth curved ring, a shape of the second grid pattern W2 in the third repetitive unit W21 is a third curved ring.

In an exemplary implementation mode, a curving direction of a vertical edge of the third grid pattern W3 in the first repetitive unit W11 is opposite to that of a vertical edge of the third grid pattern W3 in the third repetitive unit W21. That is, a shape of the third grid pattern in the first repetitive unit is any one of a third curved ring and a fourth curved ring, and a shape of the third grid pattern in the third repetitive unit is the other of the third curved ring and the fourth curved ring. For example, when the shape of the third grid pattern W3 in the first repetitive unit W11 is a third curved ring, a shape of the third grid pattern W3 in the third repetitive unit W21 is a fourth curved ring. For another example, when the shape of the third grid pattern W3 in the first repetitive unit W11 is a fourth curved ring, a shape of the third grid pattern W3 in the third repetitive unit W21 is a third curved ring.

In an exemplary implementation mode, a curving direction of a horizontal edge of the first grid pattern W1 in the first repetitive unit W11 may be the same as that of a horizontal edge of the first grid pattern W1 in the third repetitive unit W21. A curving direction of a horizontal edge of the second grid pattern W2 in the first repetitive unit W11 may be the same as that of a horizontal edge of the second grid pattern W2 in the third repetitive unit W21. A curving direction of a horizontal edge of the third grid pattern W3 in the first repetitive unit W11 may be the same as that of a horizontal edge of the third grid pattern W3 in the third repetitive unit W21. In an exemplary implementation mode, a curving direction of a horizontal edge may be the direction opposite to the first direction D1.

In an exemplary implementation mode, a second horizontal edge (third edge) of the first grid pattern W1 in each of the first repetitive unit W11 and the third repetitive unit W21 serves as a first horizontal edge (first edge) of the second grid pattern W2.

In an exemplary implementation mode, a first vertical edge (second edge) of the first grid pattern W1 in the first repetitive unit W11 together with a first vertical edge (second edge) of the second grid pattern W2 in the first repetitive unit W11 serves as a second vertical edge (fourth edge) of the third grid pattern W3 in the first repetitive unit W11. In an exemplary implementation mode, a first vertical edge of the first grid pattern W1 in the third repetitive unit W21 together with a first vertical edge of the second grid pattern W2 in the third repetitive unit W21 serves as a second vertical edge of the third grid pattern W3 in the third repetitive unit W21.

In an exemplary implementation mode, at least one notch 500 is formed in each grid pattern in the first repetitive unit W11. For example, a notch 500 is formed in a first vertical edge of the first grid pattern W1, a notch 500 is formed in a second vertical edge of the second grid pattern W2, and notches 500 are formed in a first vertical edge and second vertical edge of the third grid pattern W3.

In an exemplary implementation mode, at least one notch 500 is formed in each grid pattern in the third repetitive unit W21. For example, a notch 500 is formed in a second horizontal edge of the first grid pattern W1 (i.e., a first horizontal edge of the second grid pattern W2).

In an exemplary implementation mode, openings may be formed in the third grid patterns W3 in both the first repetitive unit W11 and the third repetitive unit W21. A first opening 610 is formed by removing a first horizontal edge of the third grid pattern W3 in the first repetitive unit W11. That is, the third grid pattern W3 in the first repetitive unit W11 only includes a first vertical edge, a second horizontal edge, and a second vertical edge, so as to form a ring with the first opening 610. The first opening 610 faces the direction opposite to the first direction D1. A second opening 620 is formed by removing a second horizontal edge of the third grid pattern W3 in the third repetitive unit W21. That is, the third grid pattern W3 in the third repetitive unit W21 only includes a first horizontal edge, a vertical edge, and a second vertical edge, so as to form a ring with the second opening 620. The second opening 620 faces the first direction D1.

As shown in FIGS. 16 and 17, in an exemplary implementation mode, in a repetitive unit, a curving direction of a horizontal edge in a first grid pattern W1 may be the same as that of a horizontal edge in a second grid pattern W2, and a curving direction of a vertical edge in the first grid pattern W1 may be the same as that of a vertical edge in the second grid pattern W2. That is, shapes of the first grid pattern W1 and second grid pattern W2 in a repetitive unit W may be the same curved ring. For example, the shapes of both the first grid pattern W1 and the second grid pattern W2 may be a first curved ring. For another example, the shapes of the first grid pattern W1 and the second grid pattern W2 may be a second curved ring. For another example, the shapes of both the first grid pattern W1 and the second grid pattern W2 may be a third curved ring. For another example, the shapes of both the first grid pattern W1 and the second grid pattern W2 may be a fourth curved ring.

In an exemplary implementation mode, a curving direction of a horizontal edge of a first grid pattern W1 in a repetitive unit may be opposite to that of a horizontal edge of the third grid pattern W3. For example, when a shape of the first grid pattern W1 is a first curved ring, a shape of the third grid pattern W3 is a second curved ring. For another example, when a shape of the first grid pattern W1 is a second curved ring, a shape of the third grid pattern W3 is a first curved ring.

Figure 18:
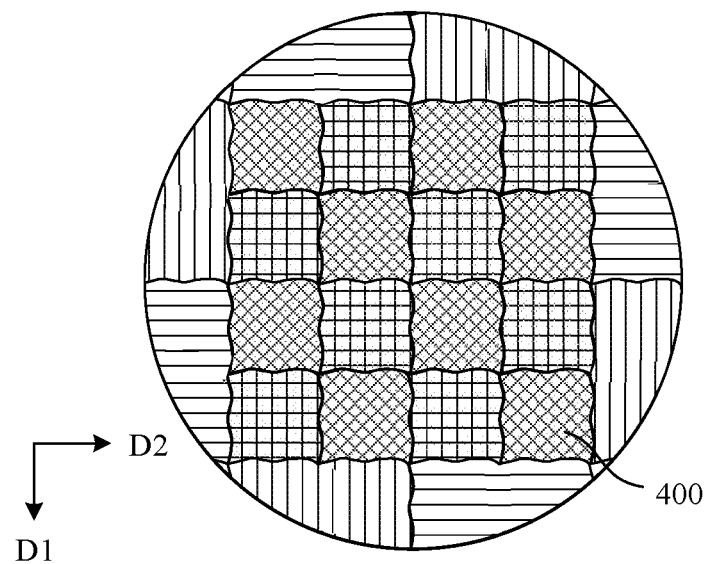
FIG. 18 is a schematic diagram of touch electrodes in form of a metal grid according to an exemplary embodiment of the present disclosure.

FIG. 18 is a schematic diagram of touch electrodes in form of a metal grid according to an exemplary embodiment of the present disclosure. For example, the touch region includes 24 self capacitance touch electrodes. As shown in FIG. 18, in an exemplary implementation mode, touch electrodes may be formed in four rows and four columns in a rectangular first electrode region, and a shape of each of the touch electrodes 400 may be a square block with wavy edges. Two touch electrodes 400 may be formed in each of around-crown-shaped second electrode region, third electrode region, fourth electrode region and fifth electrode region, and a shape of each of the touch electrodes 400 may be a triangular block with wavy edges.

Figure 19:
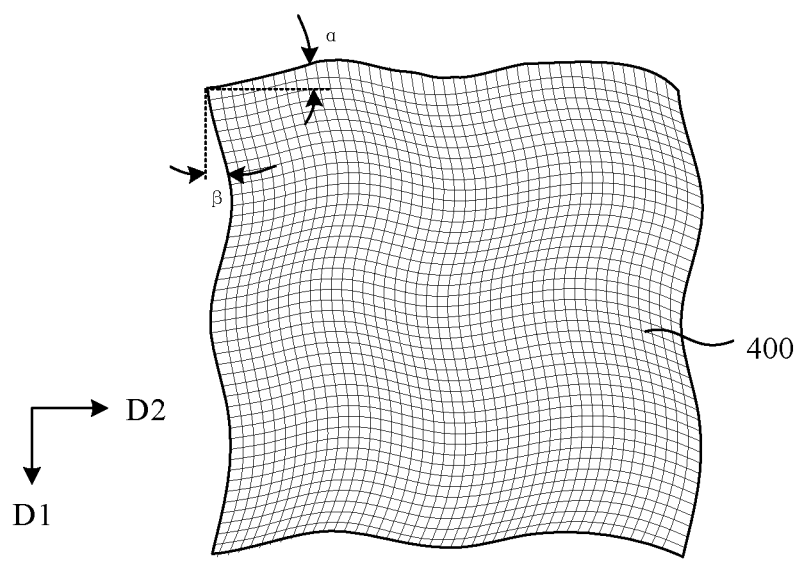
FIG. 19 is an enlarged view of a square-block-shaped touch electrode with wavy edges in FIG. 18.

FIG. 19 is an enlarged view of a square-block-shaped touch electrode with wavy edges in FIG. 18. As shown in FIG. 19, in an exemplary implementation mode, the square-block-shaped touch electrode with the wavy edges may include multiple repetitive units that are repeated and consecutively arranged. Each of the repetitive units may include the above-mentioned first grid pattern, second grid pattern and third grid pattern. Each of the grid patterns may be a ring formed by curved horizontal edges and/or curved vertical edges. That is, each of the grid patterns may include one of a first curved ring, a second curved ring, a third curved ring, and a fourth curved ring. The horizontal edge and vertical edge in the grid pattern are curved, curvature directions (curving directions) of the vertical edges of the same grid patterns in adjacent repetitive units in the first direction D1 are opposite, and curvature directions of the horizontal edges of the same grid patterns in adjacent repetitive units in the second direction D2 are opposite, so that edges of the touch electrode are wavy. In an exemplary implementation mode, at least one dummy region may be arranged in at least one of the touch electrodes. A shape of the dummy region may be similar to that of the touch electrode. Edges of the dummy region are wavy. No limits are made in the present disclosure.

In an exemplary implementation mode, the touch electrode 400 may include a wavy first electrode edge extending in the second direction D2 and a wavy second electrode edge extending in the first direction D1. An included angle between the horizontal edge in the grid pattern and the second direction D2 approximately ranges from 12° to 18°, and an included angle between the vertical edge and the first direction D1 approximately ranges from 12° to 18°, so that, at a junction of the first electrode edge and the second electrode edge, an included angle α between a tangent of the first electrode edge and the second direction D2 may approximately range from 12° to 18°, and an included angle θ between a tangent of the second electrode edge and the first direction D1 may approximately range from 12° to 18°. In an exemplary implementation mode, the included angle α may be equal to the included angle β. For example, the included angle α and the included angle θ may be about 14°.

In a design of a touch panel, a shape of a grid pattern forming a touch electrode is substantially the same as that of the emitting region in the sub-pixel on the display substrate. For example, when the emitting region in the sub-pixel is rectangular, the grid pattern is also rectangular. As such, when the sub-pixels on the display substrate are arranged orderly in a row direction and a column direction, grid patterns on the touch panel are arranged orderly. Therefore, not only are the metal wires forming the grid patterns usually long straight lines, but also touch electrodes with rectilinear edges are formed. Researches show that a straight metal wire has a strong reflection characteristic and the orderly arranged metal wires tend to interfere with one another, which not only results in the visibility of the touch electrodes and signal leads of the touch panel under a macroscopic view, particularly the visibility of rectilinear edges of the touch electrodes, but also results in a luminance difference of the touch panel in a direction or a region under a microscopic view. As a result, the display quality is reduced, and user experiences are affected.

According to the display panel provided in the exemplary embodiment of the present disclosure, the horizontal edges and/or vertical edges of the grid patterns on the touch panel are configured to be curves, and curvature directions of curves at different positions are different, so that the metal wires forming the metal grids are wavy bent wires, and the touch electrodes with the wavy edges are further formed. Therefore, not only is the reflection of the metal wires diminished to effectively reduce the visibility of the touch electrodes and the signal leads under the macroscopic view, particularly the visibility of the edges of the touch electrodes, but also interferences between the metal wires are diminished to effectively reduce a luminance difference in a direction or a region under the microscopic view and improve the display quality. According to the exemplary embodiment of the present disclosure, the included angle between the horizontal edge in the grid pattern and the second direction and the included angle between the vertical edge and the first direction are set to approximately range from 12° to 18°, so that the included angle α between the first electrode edge of the touch electrode and the second direction approximately ranges from 12° to 18°, and an included angle R between the second electrode edge and the first direction approximately ranges from 12° to 18°. Therefore, a vanishing effect is improved maximally, and the visibility of the edge of the touch electrode is reduced maximally. According to the exemplary embodiment of the present disclosure, the horizontal edges of the grid patterns corresponding to adjacent sub-pixels emitting light of the same color in the row direction are configured to be opposite in curvature direction, and the vertical edges of the grid patterns corresponding to the adjacent sub-pixels emitting light of the same color in the column direction are configured to be opposite in curvature direction, so that the horizontal edges and vertical edges of the grid patterns corresponding to the adjacent sub-pixels emitting light of the same color are bent in opposite directions, which eliminates a color shift caused by the reflection of the grid patterns and contributes to improving the display quality. According to the exemplary embodiment of the present disclosure, the minimum distance between the horizontal edge or vertical edge of the grid pattern and the emitting region of the sub-pixel is set to range from 8 μm to 10 μm, so that the risk that the light output performance is affected by the grid pattern is reduced effectively.

Figure 20:
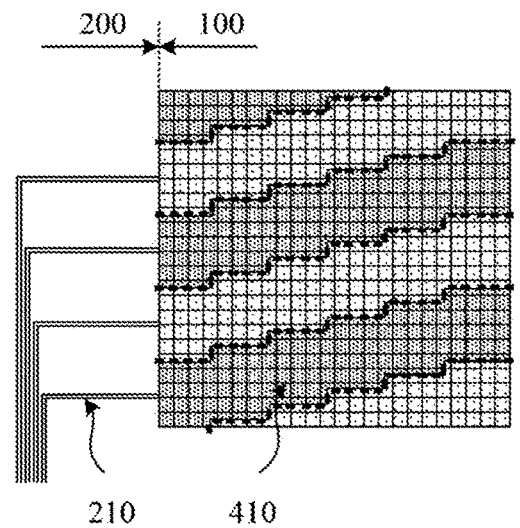
FIG. 20 is a schematic diagram of touch wires in a touch panel.

FIG. 20 is a schematic diagram of touch wires in a touch panel, and shows a structure of touch wires in a junction region of the touch region 100 and the border region 200. For example, the grid pattern is rectangular. In an exemplary implementation mode, in order to form multiple mutually insulated touch wires in the touch region 100, notches may be formed in the metal grid. In an exemplary implementation mode, multiple notches are formed in the grid patterns. The multiple notches break the metal wires of the grid patterns so as to implement the isolation of a grid pattern of a touch wire from a grid pattern of another adjacent touch wire. The notch may be understood as an imaginary line cutting the metal wire. The multiple notches in the multiple grid patterns may form a signal transmission channel. As shown in FIG. 20, the black block represents the notch, and dark and light fillings represent touch wires 410 defined by multiple notches respectively. In an exemplary implementation mode, a signal lead 210 in the border region 200 may be in a metal wire form. The multiple signal leads 210 in the border region 200 are correspondingly connected with the multiple touch wires 410 in the touch region 100.

Figure 21:
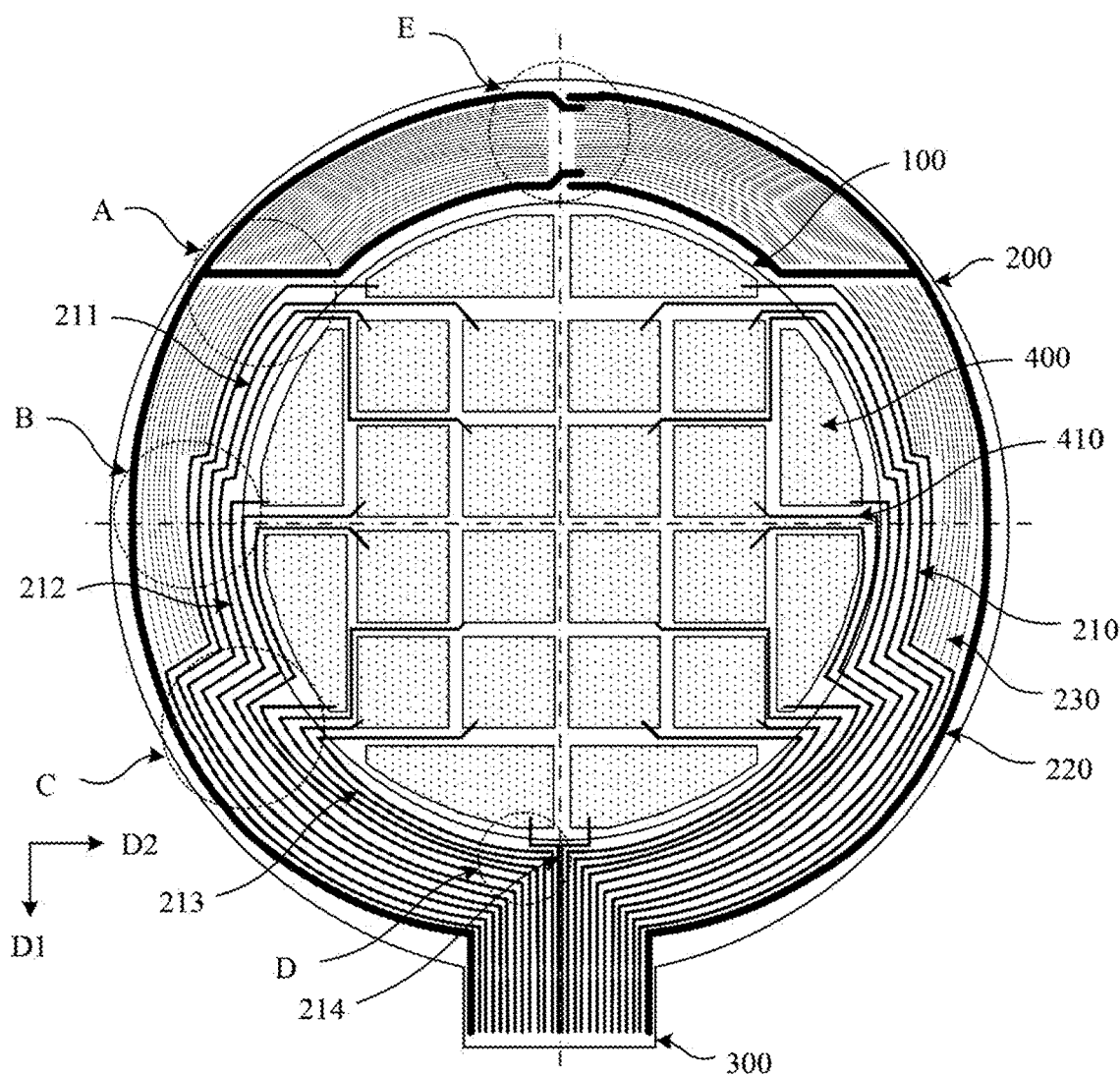
FIG. 21 is a schematic diagram of signal leads in a touch panel according to an exemplary embodiment of the present disclosure.

FIG. 21 is a schematic arrangement diagram of signal leads in a touch panel according to an exemplary embodiment of the present disclosure. For example, the touch region includes 24 self capacitance touch electrodes. As shown in FIG. 21, the touch panel may include a touch region 100, a border region 200, and a bonding region 300. The touch region 100 may include multiple touch electrodes 400 and multiple touch wires 410. The border region 200 may include multiple signal leads 210, grounding wires 220, and dummy line segments 230. In an exemplary implementation mode, the multiple touch electrodes 400 and multiple touch wires 410 in the touch region 100 are in a metal grid pattern form. The multiple signal leads 210 and grounding wires 220 in the border region 200 are in a metal wire form.

In an exemplary implementation mode, the 24 touch electrodes 400 in the touch region 100 are arranged in six rows and six columns. The 24 touch electrodes 400 may be arranged symmetrically about a centerline O. Positions of the touch electrodes will be described below taking the 12 touch electrodes at a left side of the centerline O as an example.

In an exemplary implementation mode, no touch electrodes are arranged in a region where the first row and the first column are located and a region where the sixth row and the first column are located. A first-row bar-shaped touch electrode extending in the second direction D2 is formed in a region where the second column and third column of the first row are located. A sixth-row bar-shaped touch electrode extending in the second direction D2 is formed in a region where the second column and third column of the sixth row are located. A second-third-row bar-shaped touch electrode extending in the first direction D1 is formed in a region where the second row and third row of the first column are located. A fourth-fifth-row bar-shaped touch electrode extending in the first direction D1 is formed in a region where the fourth row and fifth row of the first column are located. Eight block-shaped touch electrodes are formed in a region where the second column to third column of the second row are located, a region where the second column to third column of the third row are located, a region where the second column to third column of the fourth row are located, and a region where the second column to third column of the fifth row are located.

In an exemplary implementation mode, the 24 touch wires 410 in the touch region 100 may be arranged between the touch electrodes 400. The 24 touch wires 410 may be arranged symmetrically about a centerline O. A first end of a touch wire 410 is connected with a touch electrode 400, while a second end extends to the border region 200 to be connected with a first end of a signal lead 210 in the border region 200. Positions of the touch wires will be described below taking the 12 touch wires at a left side of the centerline O as an example.

In an exemplary implementation mode, the multiple touch wires 410 may include a first set of wires, a second set of wires, a third set of wires and a fourth set of wires, which are sequentially arranged in the first direction D1. The first set of wires may include four touch wires. First ends of the four touch wires are connected with the first-row bar-shaped touch electrode, the second-row second-column block-shaped touch electrode, the second-row third-column block-shaped touch electrode and the third-row third-column block-shaped touch electrode respectively, while second ends extend to the border region 200. The second set of wires may include three touch wires. First ends of the three touch wires are connected with the second-third-row bar-shaped touch electrode, the third-row second-column block-shaped touch electrode and the fourth-row second-column block-shaped touch electrode respectively, while second ends extend to the border region 200. The third set of wires may include four touch wires. First ends of the four touch wires are connected with the fourth-fifth-row bar-shaped touch electrode, the fourth-row third-column block-shaped touch electrode, the fifth-row second-column block-shaped touch electrode and the fifth-row third-column block-shaped touch electrode respectively, while second ends extend to the border region 200. The fourth set of wires may include one touch wire. A first end of the touch wire is connected with the sixth-row bar-shaped touch electrode, while a second end directly extends to the bonding region 300.

In an exemplary implementation mode, a first end of the signal lead 210 in the border region 200 is connected with a second end of the touch wire 410 in the touch region 100, while a second end extends to the bonding region 300 along a border shape. A first end of the grounding wire 220 in the border region 200 is arranged at a side of the border region 200 away from the bonding region 300, while a second end extends to the bonding region 300 along the border shape. The grounding wire 220 is arranged at a side of the signal lead 210 away from the touch region 100. The grounding wire 220 is configured to conduct static electricity generated by the touch panel out through a conduction circuit.

In an exemplary implementation mode, the signal leads 210 and grounding wires 220 in the border region 200 may be arranged symmetrically about a centerline O. Positions of the leads will be described below taking the leads at a left side of the centerline O as an example.

In an exemplary implementation mode, the multiple signal leads 210 may include a first set of leads 211, a second set of leads 212, a third set of leads 213 and a fourth set of leads 214, which are sequentially arranged in the first direction D1. The first set of leads 211 may include four signal leads. First ends of the four signal leads are connected with the second ends of the four touch wires in the first set of wires, while second ends extend to the bonding region 300 along the border shape respectively. The second set of leads 212 may include three signal leads. First ends of the three signal leads are connected with the second ends of the three touch wires in the second set of wires, while second ends extend to the bonding region 300 along the border shape respectively. The third set of leads 213 may include four signal leads. First ends of the four signal leads are connected with the second ends of the four touch wires in the third set of wires, while second ends extend to the bonding region 300 along the border shape respectively. The fourth set of leads 214 may include one signal lead. A first end of the signal lead is connected with the second end of the touch wire in the fourth set of wires, while a second end extends to the bonding region 300.

Figure 22:
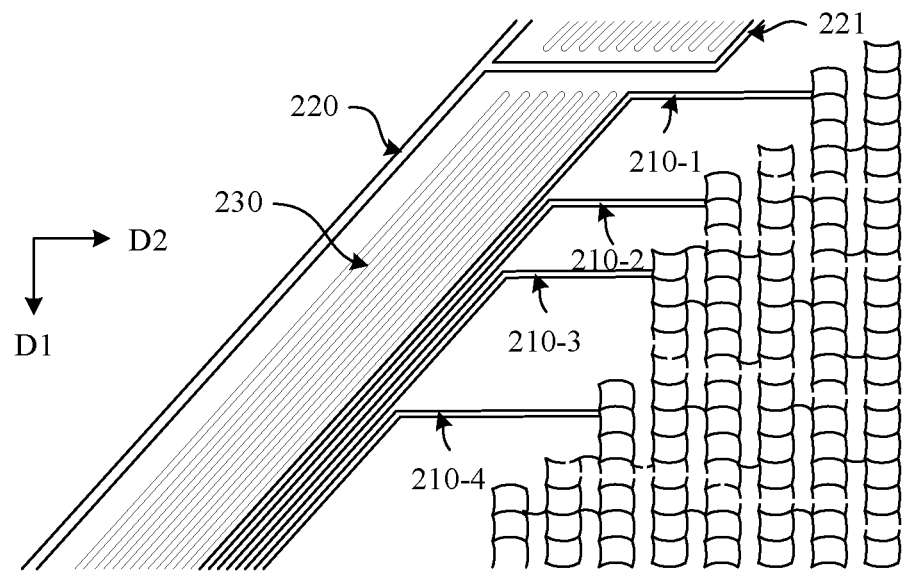
FIG. 22 is a schematic diagram of a first set of leads according to an exemplary embodiment of the present disclosure.

FIG. 22 is a schematic diagram of a first set of leads according to an exemplary embodiment of the present disclosure, and is an enlarged view of region A in FIG. 21. As shown in FIG. 22, the first set of leads 211 may include a first signal lead 210-1, a second signal lead 210-2, a third signal lead 210-3, and a fourth signal lead 210-4. The four signal leads are connected with the four touch wires in the first set of wires in the touch region respectively.

In an exemplary implementation mode, each of the signal leads includes a leading-out section and an extension section. A first end of the leading-out section is connected with the touch wire of the touch electrode, while a second end is connected with a first end of the extension section after extending in the direction opposite to the second direction D2. A second end of the extension section extends to the bonding region along the border shape.

In an exemplary implementation mode, the leading-out section of the first signal lead 210-1, the leading-out section of the second signal lead 210-2, the leading-out section of the third signal lead 210-3 and the leading-out section of the fourth signal lead 210-4 are sequentially arranged in the first direction D1 (a direction approaching the bonding region). The extension section of the first signal lead 210-1, the extension section of the second signal lead 210-2, the extension section of the third signal lead 210-3 and the extension section of the fourth signal lead 210-4 are sequentially arranged in the second direction D2 (a direction approaching the touch region). Therefore, a nested lead structure is formed. The fourth signal lead 210-4 is nested with the third signal lead 210-3, the third signal lead 210-3 is nested with the second signal lead 210-2, and the second signal lead 210-2 is nested with the first signal lead 210-1.

In an exemplary implementation mode, a first end of the grounding wire 220 is arranged at a side of the border region away from the bonding region, while a second end extends to the bonding region along the border shape. In an exemplary implementation mode, the grounding wire 220 is arranged at a side of the first signal lead 210-1 away from the touch region.

In an exemplary implementation mode, an auxiliary grounding wire 221 is arranged in the border region. The auxiliary grounding wire 221 may be arranged at a side of the first signal lead 210-1 in the direction (a direction away from the bonding region) opposite to the first direction D1. In an exemplary implementation mode, the auxiliary grounding wire 221 may include an auxiliary extension section and an auxiliary connection section. A first end of the auxiliary extension section is arranged at the side of the border region away from the bonding region, while a second end is connected with a first end of the auxiliary connection section after extending to a direction approaching the bonding region along the border shape. A second end of the auxiliary connection section extends in the direction opposite to the second direction D2, and is connected with the grounding wire 220 such that the auxiliary grounding wire 221 forms a branched structure with the grounding wire 220.

According to the exemplary embodiment of the present disclosure, the auxiliary grounding wire is arranged and connected with the grounding wire to form the branched structure, so that an additional shielding structure is formed. As such, external static electricity and external interference signals may be shielded twice, and the external static electricity and the external interference signals are more unlikely to enter the touch region. Therefore, the capability of the grounding wire in shielding static electricity and interference signals may be improved, and the touch performance may be improved.

In an exemplary implementation mode, the auxiliary connection section may be arranged at a side of the leading-out section of the first signal lead 210-1 away from the bonding region. The auxiliary connection section may be parallel to the leading-out section of the first signal lead 210-1.

In an exemplary implementation mode, multiple dummy line segments 230 may be arranged in the border region. The multiple dummy line segments 230 may be arranged between the extension section of the first signal lead 210-1 and the grounding wire 220. The multiple dummy line segments 230 are sequentially arranged in a direction away from the touch region. Each of the dummy line segments 230 extends along the border shape.

In an exemplary implementation mode, multiple dummy line segments 230 may be arranged between the grounding wire 220 and the auxiliary grounding wire 221. The multiple dummy line segments 230 are sequentially arranged in a direction away from the touch region. Each of the dummy line segments 230 extends along the border shape.

According to the exemplary embodiment of the present disclosure, the dummy line segments are arranged between the grounding wire and the signal lead and between the grounding wire and the auxiliary grounding wire, so that the etching uniformity may be ensured, and the precision of a preparation process and the yield may be improved.

Figure 23:
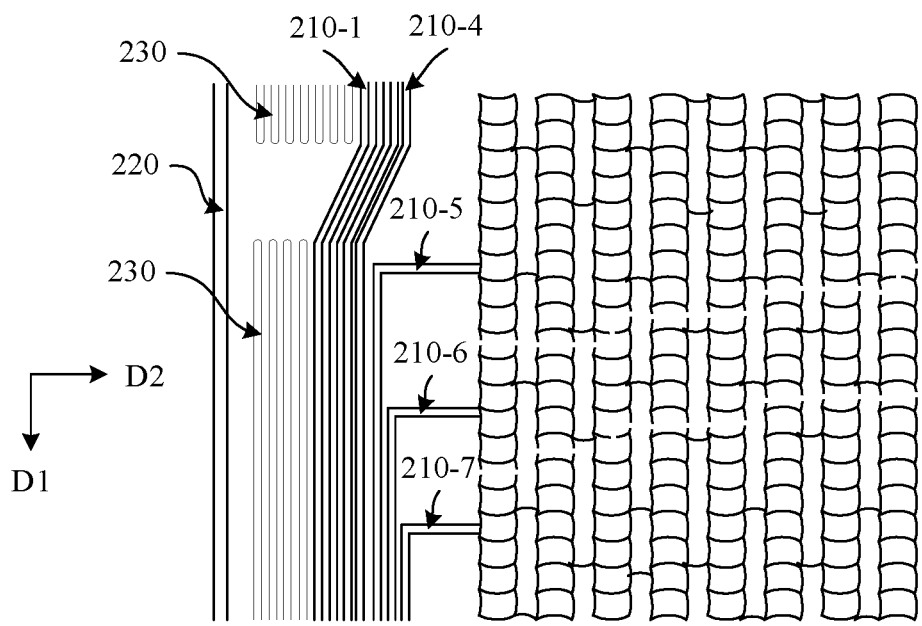
FIG. 23 is a schematic diagram of a second set of leads according to an exemplary embodiment of the present disclosure.

FIG. 23 is a schematic diagram of a second set of leads according to an exemplary embodiment of the present disclosure, and is an enlarged view of region B in FIG. 21. As shown in FIG. 23, the second set of leads 212 may include a fifth signal lead 210-5, a sixth signal lead 210-6, and a seventh signal lead 210-7. The three signal leads are connected with the three touch wires in the second set of wires in the touch region respectively.

In an exemplary implementation mode, each of the signal leads includes a leading-out section and an extension section. A first end of the leading-out section is connected with the touch wire of the touch electrode, while a second end is connected with a first end of the extension section after extending in the direction opposite to the second direction D2. A second end of the extension section extends to the bonding region along the border shape.

In an exemplary implementation mode, the leading-out section of the fifth signal lead 210-5, the leading-out section of the sixth signal lead 210-6 and the leading-out section of the seventh signal lead 210-7 are sequentially arranged in the first direction D1. The extension section of the fifth signal lead 210-5, the extension section of the sixth signal lead 210-6 and the extension section of the seventh signal lead 210-7 are sequentially arranged in the second direction D2. Therefore, a nested lead structure is formed. The seventh signal lead 210-7 is nested with the sixth signal lead 210-6, and the sixth signal lead 210-6 is nested with the fifth signal lead 210-5.

In an exemplary implementation mode, the extension section of the fifth signal lead 210-5 is arranged at a side of the extension section of the fourth signal lead 210-4 close to the touch region. That is, the four signal leads in the first set of leads 211 are arranged at a side of the fifth signal lead 210-5 away from the touch region. The grounding wire 220 is arranged at a side of the first signal lead 210-1 away from the touch region.

In an exemplary implementation mode, multiple dummy line segments 230 may be arranged between the first signal lead 210-1 and the grounding wire 220. The multiple dummy line segments 230 are sequentially arranged in a direction away from the touch region. Each of the dummy line segments 230 extends along the border shape.

Figure 24:
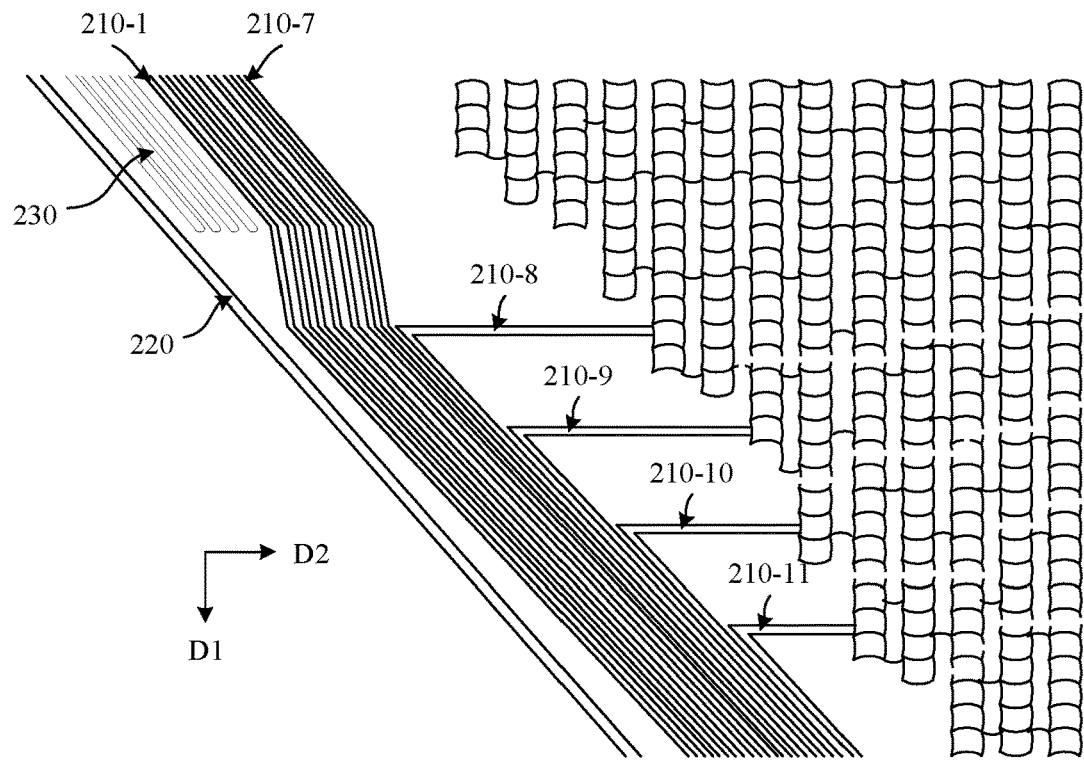
FIG. 24 is a schematic diagram of a third set of leads according to an exemplary embodiment of the present disclosure.

FIG. 24 is a schematic diagram of a third set of leads according to an exemplary embodiment of the present disclosure, and is an enlarged view of region C in FIG. 21. As shown in FIG. 24, the third set of leads 213 may include an eighth signal lead 210-8, a ninth signal lead 210-9, a tenth signal lead 210-10, and an eleventh signal lead 210-11. The four signal leads are connected with the four touch wires in the third set of wires in the touch region respectively.

In an exemplary implementation mode, each of the signal leads includes a leading-out section and an extension section. A first end of the leading-out section is connected with the touch wire of the touch electrode, while a second end is connected with a first end of the extension section after extending in the direction opposite to the second direction D2. A second end of the extension section extends to the bonding region along the border shape.

The leading-out section of the eighth signal lead 210-8, the leading-out section of the ninth signal lead 210-9, the leading-out section of the tenth signal lead 210-10 and the leading-out section of the eleventh signal lead 210-11 are sequentially arranged in the first direction D1. The extension section of the eighth signal lead 210-8, the extension section of the ninth signal lead 210-9, the extension section of the tenth signal lead 210-10 and the extension section of the eleventh signal lead 210-11 are sequentially arranged in the second direction D2. Therefore, a nested lead structure is formed. The eleventh signal lead 210-11 is nested with the tenth signal lead 210-10, the tenth signal lead 210-10 is nested with the ninth signal lead 210-9, and the ninth signal lead 210-9 is nested with the eighth signal lead 210-8.

In an exemplary implementation mode, the extension section of the eighth signal lead 210-8 is arranged at a side of the extension section of the seventh signal lead 210-7 close to the touch region. That is, the seven signal leads in the first set of leads 211 and the second set of leads 212 are arranged at a side of the eighth signal lead 210-8 away from the touch region. The grounding wire 220 is arranged at a side of the first signal lead 210-1 away from the touch region.

In an exemplary implementation mode, multiple dummy line segments 230 may be arranged between the first signal lead 210-1 and the grounding wire 220. The multiple dummy line segments 230 are sequentially arranged in a direction away from the touch region. Each of the dummy line segments 230 extends along the border shape.

Figure 25:
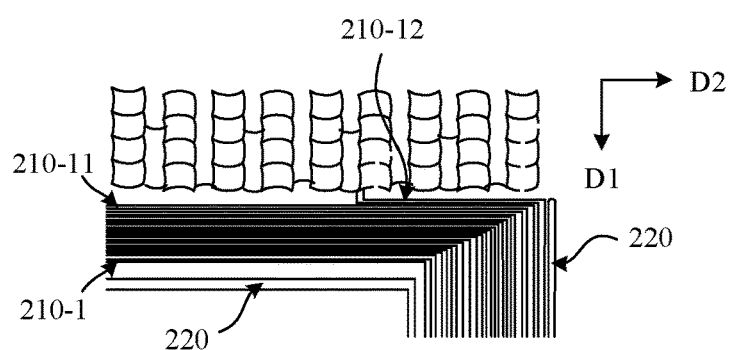
FIG. 25 is a schematic diagram of a fourth set of leads according to an exemplary embodiment of the present disclosure.

FIG. 25 is a schematic diagram of a fourth set of leads according to an exemplary embodiment of the present disclosure, and is an enlarged view of region D in FIG. 21. As shown in FIG. 24, the fourth set of leads 214 may include a twelfth signal lead 210-12. The signal lead is connected with the touch wire in the fourth set of wires in the touch region.

In an exemplary implementation mode, the twelfth signal lead 210-12 includes a leading-out section and an extension section. A first end of the leading-out section is connected with the touch wire of the touch electrode, while a second end is connected with a first end of the extension section after extending in the second direction D2. A second end of the extension section extends to the bonding region along the first direction D1.

In an exemplary implementation mode, the 11 signal leads in the first set of lead 211, the second set of leads 212 and the third set of leads 213 are arranged at a side of the twelfth signal lead 210-12 in the first direction D1. A grounding wire 220 is arranged at a side of the first signal lead 210-1 away from the touch region, and turns to extend to the bonding region after extending in the second direction D2. Another grounding wire 220 is arranged at a side of the extension section of the twelfth signal lead 210-12 in the second direction D2, and extends to the bonding region in the first direction D1.

Figure 26:
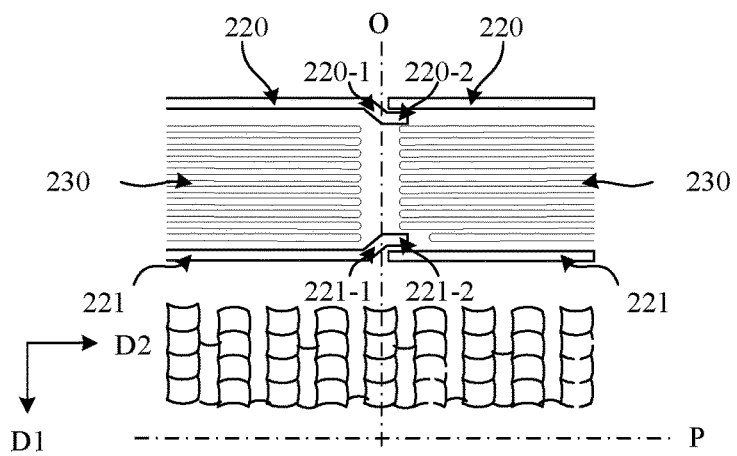
FIG. 26 is a schematic diagram of a grounding wire and an auxiliary grounding wire according to an exemplary embodiment of the present disclosure.

FIG. 26 is a schematic diagram of a grounding wire and an auxiliary grounding wire according to an exemplary embodiment of the present disclosure, and is an enlarged view of region E in FIG. 21. As shown in FIG. 26, the touch panel includes a centerline O extending in the first direction D1 and equally dividing the touch region and a reference line P perpendicular to the centerline O. The grounding wire 220 may include a first grounding wire located at one side (left side) of the centerline O and a second grounding wire located at the other side (right side) of the centerline O. Both a first end of the first grounding wire and a first end of the second grounding wire are arranged at the side of the border region away from the bonding region. Both a second end of the first grounding wire and a second end of the second grounding wire extend to the bonding region along the border shape. The auxiliary grounding wire 221 may include a first auxiliary grounding wire located at one side (left side) of the centerline O and a second auxiliary grounding wire located at the other side (right side) of the centerline O. Both a first end of the first auxiliary grounding wire and a first end of the second auxiliary grounding wire are arranged at the side of the border region away from the bonding region. Both a second end of the first auxiliary grounding wire and a second end of the second auxiliary grounding wire extend along the border shape. In an exemplary implementation mode, distances from the first grounding wire and the second grounding wire to the touch region are longer than those from the first auxiliary grounding wire and the second auxiliary grounding wire to the touch region. That is, the first grounding wire and the second grounding wire are located at sides of the first auxiliary grounding wire and the second auxiliary grounding wire away from the touch region.

In an exemplary implementation mode, an insertion portion is arranged at an end portion of the first grounding wire at the left side. The insertion portion may include a turning section 220-1 and an insertion section 220-2. A first end of the turning section 220-1 is connected with the first end of the first grounding wire, while a second end turns to extend to a direction approaching the touch region, and is connected with a first end of the insertion section 220-2. A second end of the insertion section 220-2 extends to the right side of the centerline O in the second direction D2. The insertion section 220-2 of the first grounding wire forms an inserted structure with the first end of the second grounding wire. There is an overlapping region between an orthographic projection of the insertion section 220-2 of the first grounding wire on the reference line P and an orthographic projection of the first end of the second grounding wire on the reference line P.

In an exemplary implementation mode, a width of an overlapping region between the insertion section of the first grounding wire and the second grounding wire may be set according to a practical condition. A large overlapping width is favorable for shielding. A turning angle of the turning section of the first grounding wire and a distance between the insertion section of the first grounding wire and the second grounding wire may be set according to a practical condition as long as short-circuits may be prevented in the process.

In an exemplary implementation mode, an auxiliary insertion portion is arranged at an end portion of the first auxiliary grounding wire at the left side. The auxiliary insertion portion may include an auxiliary turning section 221-1 and an auxiliary insertion section 221-2. A first end of the auxiliary turning section 221-1 is connected with the first end of the auxiliary grounding wire 221, while a second end turns to extend to a direction away from the touch region, and is connected with a first end of the auxiliary insertion section 221-2. A second end of the auxiliary insertion section 221-2 extends to the right side of the centerline O in the second direction D2. The auxiliary insertion section 221-2 of the first auxiliary grounding wire forms an inserted structure with the first end of the second auxiliary grounding wire. There is an overlapping region between an orthographic projection of the auxiliary insertion section 220-2 of the first auxiliary grounding wire on the reference line P and an orthographic projection of the first end of the second auxiliary grounding wire on the reference line P.

In an exemplary implementation mode, a width of an overlapping region between the auxiliary insertion section of the first auxiliary grounding wire and the second auxiliary grounding wire may be set according to a practical condition. A large overlapping width is favorable for shielding. A turning angle of the auxiliary turning section of the first auxiliary grounding wire and a distance between the auxiliary insertion section of the first auxiliary grounding wire and the second auxiliary grounding wire may be set according to a practical condition as long as short-circuits may be prevented in the process.

In an exemplary implementation mode, multiple dummy line segments 230 may be arranged between the auxiliary grounding wire 221 at the left side and the grounding wire 220 at the left side. The multiple dummy line segments 230 are sequentially arranged in a direction away from the touch region. Each of the dummy line segments 230 extends along the border shape. Multiple dummy line segments 230 may be arranged between the auxiliary grounding wire 221 at the right side and the grounding wire 220 at the right side. The multiple dummy line segments 230 are sequentially arranged in a direction away from the touch region. Each of the dummy line segments 230 extends along the border shape.

The inserted structure shown in FIG. 26 is described only as an example. In an exemplary implementation mode, the inserted structure may be modified or equivalently replaced with a corresponding structure. For example, an insertion portion is arranged at an end portion of the second grounding wire at the right side, and an auxiliary insertion portion is arranged at an end portion of the second auxiliary grounding wire at the right side. For another example, the insertion section may be arranged at a side of the second grounding wire away from the touch region. For another example, the auxiliary insertion section may be arranged at a side of the second auxiliary grounding wire close to the touch region. No limits are made in the present disclosure.

Figure 27:
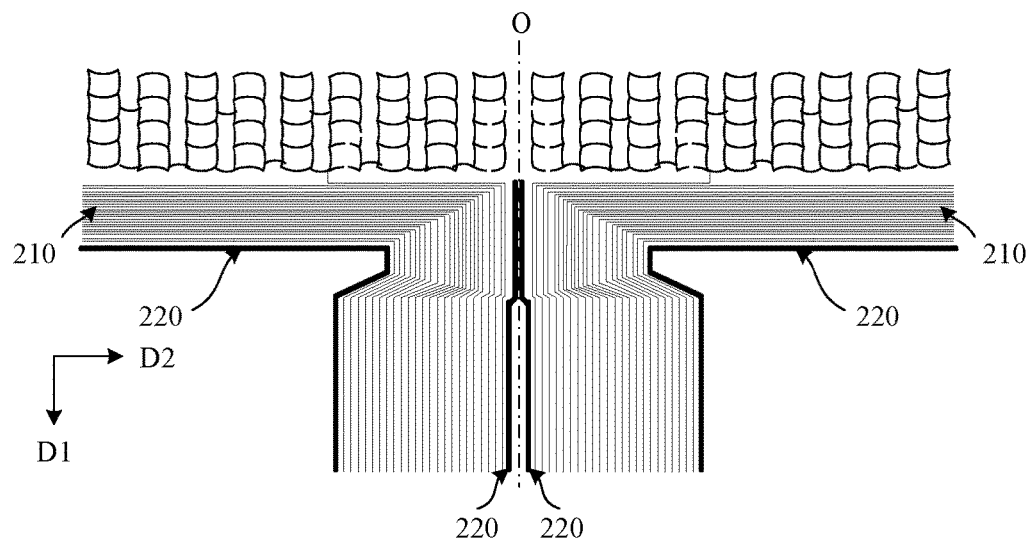
FIG. 27 is a schematic diagram of a lead collection region in a border region according to an exemplary embodiment of the present disclosure.

FIG. 27 is a schematic diagram of a lead collection region in a border region according to an exemplary embodiment of the present disclosure. As shown in FIG. 27, multiple signal leads 210 extend to the bonding region in the first direction D1 after collected in a lead collection region in the border region. The multiple signal leads 210 are arranged between two grounding wires 220 at both sides of the centerline O. The grounding wires 220 may shield the signal leads so as to avoid the signal leads being affected by static electricity and interference signals.

According to the exemplary embodiment of the present disclosure, the inserted structure is formed at a junction of the grounding wire and the auxiliary grounding wire, so that a gap between the grounding wires is eliminated, a path of external static electricity and external interference signals to the touch region is prolonged, the external static electricity and the external interference signals are more unlikely to enter the touch region, the influences of the external static electricity and the external interference signals on the signal leads and the touch electrodes are reduced effectively, and the touch performance is improved. Moreover, the overlapping of the grounding wires may facilitate the release of electrostatic charges, electrostatic charges accumulated on the grounding wire are reduced, an electrostatic current of the grounding wire is reduced, and the influence of the grounding wire on the touch performance is minimized.

In a touch panel, grounding wires are usually arranged at both sides of a touch region, the grounding wire at each side extending to a position of a centerline after surrounding the touch region at this side, and first ends of the grounding wires at both sides are arranged opposite to each other and spaced by a certain distance. Researches show that such a grounding wire structure may provide an electro static discharge path for static electricity generated in the touch region. However, there is a section of unshielded region between the first ends of the grounding wires at both sides, and external static electricity and external interference signals easily enter the touch region from this unshielded region. As a result, the capability of shielding external static electricity and external interference signals is relatively low, the touch performance is reduced, and user experiences are affected. According to the touch panel provided in the exemplary embodiment of the present disclosure, the inserted structure is formed at a junction of the grounding wire and the auxiliary grounding wire, so that a gap between the grounding wires is eliminated, a path of external static electricity and external interference signals to the touch region is prolonged, the external static electricity and the external interference signals are more unlikely to enter the touch region, the influences of the external static electricity and the external interference signals on the signal leads and the touch electrodes are reduced effectively, and the touch performance is improved. Moreover, the overlapping of the grounding wires may facilitate the discharge of electrostatic charges, electrostatic charges accumulated on the grounding wire are reduced, an electrostatic current of the grounding wire is reduced, and the influence of the grounding wire on the touch performance is minimized. According to the exemplary embodiment of the present disclosure, the auxiliary grounding wire is arranged and connected with the grounding wire to form the branched structure to further form a grounding wire of a double-wire structure, so that an additional shielding structure is formed. As such, external static electricity and external interference signals may be shielded twice, and the external static electricity and the external interference signals are more unlikely to enter the touch region. Therefore, the capability of the grounding wire in shielding static electricity and interference signals is further improved, and the touch performance is improved. According to the exemplary embodiment of the present disclosure, the dummy line segments are arranged in an empty space between the grounding wire and the auxiliary grounding wire, so that the etching uniformity is ensured, and the precision of a preparation process and the yield are improved.

Figure 28:
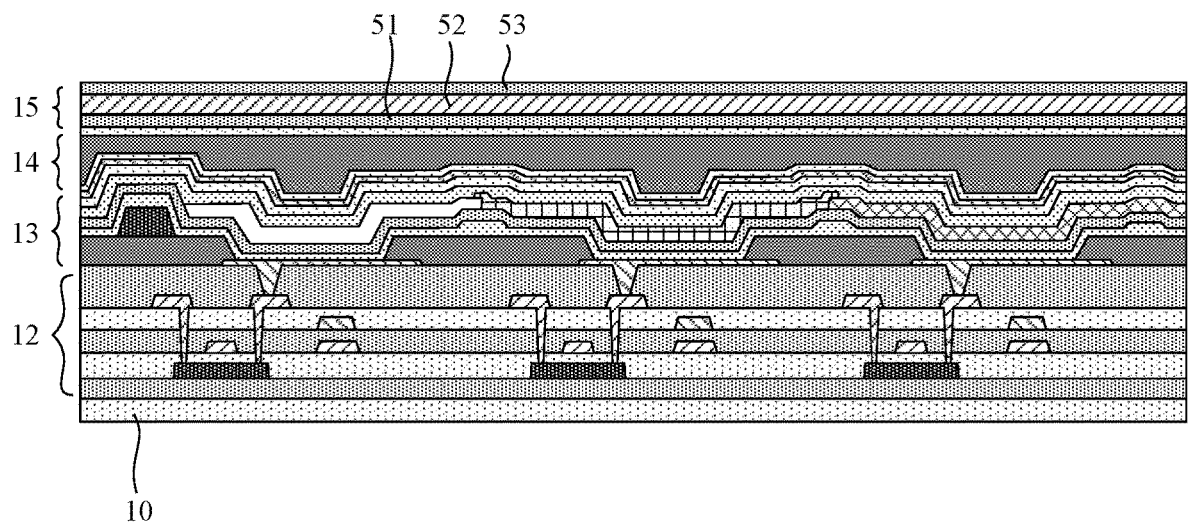
FIG. 28 is a schematic sectional view of a display panel according to an exemplary embodiment of the present disclosure.

FIG. 28 is a schematic sectional view of a display panel according to an exemplary embodiment of the present disclosure, and shows a structure of an OLED display substrate including three sub-pixels. As shown in FIG. 28, in a plane perpendicular to the display substrate, the display substrate may include a driving circuit layer 12 arranged on a base 10, an emitting structure layer 13 arranged at a side of the driving circuit layer 12 away from the base 10, an encapsulation layer 14 arranged at a side of the emitting structure layer 13 away from the base 10, and a touch electrode layer 15 arranged at a side of the encapsulation layer 14 away from the base 10. The touch electrode layer 15 may include a TLD layer 51 arranged at a side of the encapsulation layer 14 away from the base, a touch electrode layer 52 arranged at a side of the TLD layer 51 away from the base, and a touch protective layer 53 arranged at a side of the touch electrode layer 52 away from the base.

A preparation process of the display panel will be exemplarily described below. A "patterning process" mentioned in the present disclosure includes coating with a photoresist, mask exposure, development, etching, photoresist stripping, and other treatment for a metal material, an inorganic material, or a transparent conductive material, and includes coating with an organic material, mask exposure, development, and other treatment for the organic material. Deposition may be any one or more of sputtering, evaporation, and chemical vapor deposition. Coating may be any one or more of spray coating, spin coating, and ink-jet printing. Etching may be any one or more of dry etching and wet etching. No limits are made in the present disclosure. "Thin film" refers to a layer of thin film made of a certain material on a base by deposition, coating, or another process. If the patterning process is not needed by the "thin film" in the whole making process, the "thin film" may be referred to as a "layer". When the patterning process is needed by the "thin film" in the whole making process, the thin film is referred to as a "thin film" before the patterning process and a "layer" after the patterning process. The "layer" after the patterning process includes at least one "pattern". "A and B are arranged in the same layer" mentioned in the present disclosure refers to that A and B are simultaneously formed by the same patterning process. The "thickness" of the film layer is a size of the film layer in a direction perpendicular to the display panel. In the exemplary embodiment of the present disclosure, "the orthographic projection of B is located within the range of the orthographic projection of A" refers to that a boundary of the orthographic projection of B falls within a range of a boundary of the orthographic projection of A or the boundary of the orthographic projection of A overlaps the boundary of the orthographic projection of B.

In an exemplary implementation mode, the preparation process of the display panel includes the following operations.

In (1), a pattern of a driving circuit layer is formed on a base. In an exemplary implementation mode, the formation of the pattern of the driving circuit layer may include the following operations.

A first insulating thin film and a semiconductor thin film are sequentially deposited on the base. The semiconductor thin film is patterned through a patterning process to form a first insulating layer covering the whole base and a pattern of a semiconductor layer arranged on the first insulating layer. The pattern of the semiconductor layer at least includes an active layer in each display sub-pixel.

Then, a second insulating thin film and a first metal thin film are sequentially deposited. The first metal thin film is patterned through a patterning process to form a second insulating layer covering the pattern of the semiconductor layer and a pattern of a first conductive layer arranged on the second insulating layer. The pattern of the first conductive layer at least includes a gate electrode and first capacitor electrode in each sub-pixel.

Then, a third insulating thin film and a second metal thin film are sequentially deposited. The second metal thin film is patterned through a patterning process to form a third insulating layer covering the pattern of the first conductive layer and a pattern of a second conductive layer arranged on the third insulating layer. The pattern of the second conductive layer at least includes a second capacitor electrode in each sub-pixel.

Then, a fourth insulating thin film is deposited. The fourth insulating thin film is patterned through a patterning process to form a fourth insulating layer covering the pattern of the second conductive layer. Vias are formed in the fourth insulating layer.

Then, a third metal thin film is deposited. The third metal thin film is patterned through a patterning process to form a pattern of a third conductive layer on the fourth insulating layer. The pattern of the third conductive layer at least includes a source electrode and drain electrode in each sub-pixel. The source electrode and the drain electrode are connected with the active layer through the vias respectively.

Then, a planarization thin film is deposited. The planarization thin film is patterned through a patterning process to form a planarization layer covering the pattern of the third conductive layer. An anode via is formed in the planarization layer.

Hereto, the preparation of the pattern of the driving circuit layer is completed.

In (2), a pattern of an emitting structure layer is formed on the driving circuit layer. In an exemplary implementation mode, the formation of the pattern of the emitting structure layer may include the following operations.

A conductive thin film is deposited on the base formed with the above-mentioned patterns. The conductive thin film is patterned through a patterning process to form a pattern of an anode. The anode is connected with the drain electrode through the anode via.

Then, the base formed with the above-mentioned patterns is coated with a pixel definition thin film. The pixel definition thin film is patterned through a patterning process to form a pattern of a pixel definition layer. A pixel opening is formed on the pixel definition layer. The pixel opening exposes a surface of the anode.

Then, a pattern of an organic emitting layer is formed on the base formed with the above-mentioned patterns by evaporation or ink-jet printing. The organic emitting layer is connected with the anode through the pixel opening.

Then, a pattern of a cathode is formed on the base formed with the above-mentioned patterns by evaporation. The cathode is connected with the organic emitting layer.

Hereto, the preparation of the pattern of the emitting structure layer is completed.

In (3), a pattern of an encapsulation layer is formed on the emitting structure layer. In an exemplary implementation mode, the formation of the pattern of the encapsulation layer may include the following operations.

A first encapsulation thin film is deposited at first on the base formed with the above-mentioned patterns to form a first encapsulation layer. Then, an organic encapsulation thin film is formed by an ink-jet printing process, and an organic encapsulation layer is formed after curing film forming. Then, a third encapsulation thin film is deposited to form a third encapsulation layer, so as to form a stacked structure of inorganic material/organic material/inorganic material. The organic material layer is arranged between the two inorganic material layers, so that external water vapor may be prevented from entering the emitting structure layer.

Hereto, the preparation of the pattern of the encapsulation layer is completed.

In (4), a pattern of a touch electrode layer is formed on the encapsulation layer. In an exemplary implementation mode, the formation of the pattern of the touch electrode layer may include the following operations.

A TLD thin film is deposited. The TLD thin film is patterned through a patterning process to form a TLD layer. Touch vias are formed in the TLD layer. In an exemplary implementation mode, the TLD layer may be made of any one or more of silicon oxide (SiOx), silicon nitride (SiNx), and silicon oxynitride (SiON), and may be single-layer, multilayer, or composite.

Then, a touch metal thin film is deposited. The touch metal thin film is patterned through a patterning process to form the pattern of the touch electrode layer on the TLD layer. The pattern of the touch electrode layer at least includes touch electrodes and touch wires in a touch region, as well as signal leads in a border region. The touch electrodes and the touch wires are in form of a metal mesh. The signal leads are connected with signal electrodes in the display substrate through the touch vias. In an exemplary implementation mode, the touch metal thin film may be of a single-layer structure of, for example, any one or more of Argentum (Ag), Copper (Cu), Aluminum (Al), Titanium (Ti), and Molybdenum (Mo), or a stacked layer of, for example, Ti/Al/Ti.

Then, a touch protective layer covering the pattern of the touch electrode layer is formed by coating a protective thin film. In an exemplary implementation mode, the touch protective layer may be made of Polyimide (PI), etc.

Hereto, the preparation of the pattern of the touch electrode layer is completed.

The structure of the display panel of the exemplary embodiment of the present disclosure and the preparation process thereof are described only as an example. In an exemplary implementation mode, changes in corresponding structures and addition or deletion of patterning processes may be made as practically required. No limits are made in the present disclosure.

The present disclosure also provides a preparation method for a touch panel. In an exemplary implementation mode, the preparation method may include the following operations.

A display substrate is formed, the display substrate including multiple sub-pixels, and at least one of the sub-pixels including an emitting region and a non-emitting region located on a periphery of the emitting region.

A touch panel is formed on the display substrate, the touch panel including multiple touch electrodes, and at least one of the touch electrodes including multiple grid patterns enclosed by metal wires. Herein, an orthographic projection of the emitting region on the display substrate is located within a range of that of a region enclosed by the metal wires on the display substrate. An orthographic projection of the metal wire on the display substrate is located within a range of that of the non-emitting region on the display substrate.

At least one of the grid patterns includes a first edge, second edge, third edge and fourth edge that form a ring. The first edge and the third edge extend in a second direction, and the second edge and the fourth edge extend in a first direction, the first direction intersecting the second direction. A shape of the grid pattern includes at least one of a first curved ring, a second curved ring, a third curved ring, and a fourth curved ring. A first edge and third edge of the first curved ring are curves curved towards a direction opposite to the first direction. A first edge and third edge of the second curved ring are curves curved towards the first direction. A second edge and fourth edge of the third curved ring are curves curved towards the second direction. A second edge and fourth edge of the fourth curved ring are curves curved towards a direction opposite to the second direction.

The present disclosure also provides a display device, which includes the touch panel of the above-mentioned embodiment. The display device may be any product or component with a display function, such as a mobile phone, a tablet computer, a television, a display, a notebook computer, a digital photo frame, and a navigator.

The drawings of the present disclosure only involve the structures involved in the present application, and the other structures may refer to conventional designs. The embodiments in the present disclosure, i.e., the features in the embodiments, can be combined without conflicts to obtain new embodiments.

Those of ordinary skill in the art should know that modifications or equivalent replacements may be made to the technical solutions of the present disclosure without departing from the spirit and scope of the technical solutions of the present disclosure, and shall all fall within the scope of the claims of the present application.

The invention claimed is:

1. A display panel, comprising a display substrate and a touch panel arranged on the display substrate, wherein the display substrate comprises multiple sub-pixels, and at least one of the sub-pixels comprises an emitting region and a non-emitting region located on a periphery of the emitting region;

the touch panel comprises multiple touch electrodes, and at least one of the touch electrodes comprises multiple grid patterns enclosed by metal wires;

an orthographic projection of the emitting region on the display substrate is located within a range of that of a region enclosed by the metal wires on the display substrate;

an orthographic projection of the metal wire on the display substrate is located within a range of that of the non-emitting region on the display substrate;

at least one of the grid patterns comprises a first edge, second edge, third edge and fourth edge that form a ring;

the first edge and the third edge extend in a second direction, and the second edge and the fourth edge extend in a first direction, the first direction intersecting the second direction;

a shape of the grid pattern comprises at least one of a first curved ring, a second curved ring, a third curved ring, and a fourth curved ring;

a first edge and third edge of the first curved ring are curves curved towards a direction opposite to the first direction;

a first edge and third edge of the second curved ring are curves curved towards the first direction;

a second edge and fourth edge of the third curved ring are curves curved towards the second direction; and a second edge and fourth edge of the fourth curved ring are curves curved towards a direction opposite to the second direction.

2. The display panel according to claim 1, wherein a shape of the curve comprises any one or more of an arc and a broken line.

3. The display panel according to claim 1, wherein at least one notch is formed in at least one of the first edge, the second edge, the third edge, and the fourth edge, and the notch breaks the grid pattern.

4. The display panel according to claim 1, wherein the display substrate at least comprises a first pixel unit and a second pixel unit adjacent to the first pixel unit in the second direction, and each of the first pixel unit and the second pixel unit comprises a first sub-pixel emitting first-color light, a second sub-pixel emitting second-color light, and a third sub-pixel emitting third-color light;

the touch electrode comprises a first repetitive unit and a second repetitive unit adjacent to the first repetitive unit in the second direction, and each of the first repetitive unit and the second repetitive unit comprises a first grid pattern corresponding to a position of the first sub-pixel, a second grid pattern corresponding to a position of the second sub-pixel, and a third grid pattern corresponding to a position of the third sub-pixel; and a shape of the first grid pattern in the first repetitive unit is any one of a first curved ring and a second curved ring, and a shape of the first grid pattern in the second repetitive unit is the other of the first curved ring and the second curved ring.

5. The display panel according to claim 4, wherein a shape of the second grid pattern in the first repetitive unit is any one of a first curved ring and a second curved ring, and a shape of the second grid pattern in the second repetitive unit is the other of the first curved ring and the second curved ring; or a shape of the third grid pattern in the first repetitive unit is any one of a first curved ring and a second curved ring, and a shape of the third grid pattern in the second repetitive unit is the other of the first curved ring and the second curved ring; or in the first grid pattern of the first repetitive unit and the first grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction; or in the second grid pattern of the first repetitive unit and the second grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction; or in the third grid patterns of the first repetitive unit and the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction; or in the first repetitive unit, a notch is formed in a second edge of the first grid pattern, a notch is formed in a fourth edge of the second grid pattern, and notches are formed in a second edge and fourth edge of the third grid pattern, and in the second repetitive unit, a notch is formed in a fourth edge of the first grid pattern, a notch is formed in a third edge of the second grid pattern, and a notch is formed in a second edge of the third grid pattern; or a third edge of the first grid pattern in each of the first repetitive unit and the second repetitive unit serves as a first edge of the second grid pattern, a second edge of the first grid pattern in the first repetitive unit together with a second edge of the second grid pattern in the first repetitive unit serves as a fourth edge of the third grid pattern in the first repetitive unit, a fourth edge of the first grid pattern in the second repetitive unit together with a fourth edge of the second grid pattern in the second repetitive unit serves as a second edge of the third grid pattern in the first repetitive unit, a second edge of the first grid pattern in the second repetitive unit together with a second edge of the second grid pattern in the second repetitive unit serves as a fourth edge of the third grid pattern in the second repetitive unit, and a second edge of the first grid pattern in another first repetitive unit together with a second edge of the second grid pattern in the other first repetitive unit serves as a second edge of the third grid pattern in the second repetitive unit, the other first repetitive unit being a first repetitive unit adjacent to the second repetitive unit in the second direction a shape of the third grid pattern in the first repetitive unit is any one of a first curved ring and a second curved ring, and a shape of the third grid pattern in the second repetitive unit is the other of the first curved ring and the second curved ring; or in the first grid pattern of the first repetitive unit and the first grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction; or in the second grid pattern of the first repetitive unit and the second grid pattern of the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction; or in the third grid patterns of the first repetitive unit and the second repetitive unit, at least one of a second edge and/or a fourth edge of one grid pattern is a curve curved towards the second direction, while at least one of a second edge and/or a fourth edge of the other grid pattern is a curve curved towards the direction opposite to the second direction or a curve curved towards the second direction; or in the first repetitive unit, a notch is formed in a second edge of the first grid pattern, a notch is formed in a fourth edge of the second grid pattern, and notches are formed in a second edge and fourth edge of the third grid pattern, and in the second repetitive unit, a notch is formed in a fourth edge of the first grid pattern, a notch is formed in a third edge of the second grid pattern, and a notch is formed in a second edge of the third grid pattern; or a third edge of the first grid pattern in each of the first repetitive unit and the second repetitive unit serves as a first edge of the second grid pattern, a second edge of the first grid pattern in the first repetitive unit together with a second edge of the second grid pattern in the first repetitive unit serves as a fourth edge of the third grid pattern in the first repetitive unit, a fourth edge of the first grid pattern in the second repetitive unit together with a fourth edge of the second grid pattern in the second repetitive unit serves as a second edge of the third grid pattern in the first repetitive unit, a second edge of the first grid pattern in the second repetitive unit together with a second edge of the second grid pattern in the second repetitive unit serves as a fourth edge of the third grid pattern in the second repetitive unit, and a second edge of the first grid pattern in another first repetitive unit together with a second edge of the second grid pattern in the other first repetitive unit serves as a second edge of the third grid pattern in the second repetitive unit, the other first repetitive unit being a first repetitive unit adjacent to the second repetitive unit in the second direction.

6. The display panel according to claim 4, wherein a first opening or a second opening is formed in the third grid pattern in the first repetitive unit or the second repetitive unit, the first opening being formed by removing a first edge of the third grid pattern, and the second opening being formed by removing a third edge of the third grid pattern.

7. The display panel according to claim 6, wherein the touch electrode comprises multiple first repetitive unit columns and multiple second repetitive unit columns, which are arranged alternately in the second direction;

the first repetitive unit column comprises multiple first repetitive units sequentially arranged in the first direction, and the second repetitive unit column comprises multiple second repetitive units sequentially arranged in the first direction;

any one of the repetitive unit columns comprises at least one connected grid pattern, and the connected grid pattern is a ring surrounding two emitting regions, and is formed by arranging the third grid pattern with the first opening at a side of the third grid pattern with the second opening in the first direction; and the connected grid patterns of the first repetitive unit columns are staggered with those of the second repetitive unit columns.

8. The display panel according to claim 7, wherein any one of the repetitive unit columns comprises at least one common horizontal edge, the common horizontal edge serves as both a third edge of the third grid pattern with the first opening and a first edge of the third grid pattern with the second opening, and the third grid pattern with the second opening is arranged at a side of the third grid pattern with the first opening in the first direction; and the common horizontal edges of the first repetitive unit columns are staggered with those of the second repetitive unit columns.

9. The display panel according to claim 1, wherein the display substrate at least comprises a first pixel unit and a third pixel unit adjacent to the first pixel unit in the first direction, and each of the first pixel unit and the third pixel unit comprises a first sub-pixel emitting first-color light, a second sub-pixel emitting second-color light, and a third sub-pixel emitting third-color light;

the touch electrode comprises a first repetitive unit and a third repetitive unit adjacent to the first repetitive unit in the first direction, and each of the first repetitive unit and the third repetitive unit comprises a first grid pattern corresponding to a position of the first sub-pixel, a second grid pattern corresponding to a position of the second sub-pixel, and a third grid pattern corresponding to a position of the third sub-pixel; and a shape of the first grid pattern in the first repetitive unit is any one of a third curved ring and a fourth curved ring, and a shape of the first grid pattern in the third repetitive unit is the other of the third curved ring and the fourth curved ring.

10. The display panel according to claim 9, wherein a shape of the second grid pattern in the first repetitive unit is any one of a third curved ring and a fourth curved ring, and a shape of the second grid pattern in the third repetitive unit is the other of the third curved ring and the fourth curved ring; or a shape of the third grid pattern in the first repetitive unit is any one of a third curved ring and a fourth curved ring, and a shape of the third grid pattern in the third repetitive unit is the other of the third curved ring and the fourth curved ring; or first edges and third edges of the first grid pattern and second grid pattern in the first repetitive unit and first edges and third edges of the first grid pattern and second grid pattern in the second repetitive unit are curves curved towards the direction opposite to the first direction; or in the first repetitive unit, a notch is formed in a second edge of the first grid pattern, a notch is formed in a fourth edge of the second grid pattern, and notches are formed in a second edge and fourth edge of the third grid pattern, and in the third repetitive unit, a notch is formed in a third edge of the first grid pattern, and a notch is formed in a first edge of the second grid pattern; or a third edge of the first grid pattern in each of the first repetitive unit and the third repetitive unit serves as a first edge of the second grid pattern, a second edge of the first grid pattern in the first repetitive unit together with a second edge of the second grid pattern in the first repetitive unit serves as a fourth edge of the third grid pattern in the first repetitive unit, and a second edge of the first grid pattern in the third repetitive unit together with a second edge of the second grid pattern in the third repetitive unit serves as a fourth edge of the third grid pattern in the third repetitive unit; or a first opening or a second opening is formed in the third grid pattern in the first repetitive unit or the third repetitive unit, the first opening being formed by removing a first edge of the third grid pattern, and the second opening being formed by removing a third edge of the third grid pattern.

11. The display panel according to claim 1, wherein the display substrate comprises multiple pixel units, and at least one of the pixel units comprises a first sub-pixel emitting first-color light, a second sub-pixel emitting second-color light, and a third sub-pixel emitting third-color light;

the touch electrode comprises multiple repetitive units, and at least one of the repetitive units comprises a first grid pattern corresponding to a position of the first sub-pixel, a second grid pattern corresponding to a position of the second sub-pixel, and a third grid pattern corresponding to a position of the third sub-pixel; and in at least one of the repetitive units, a shape of the first grid pattern is any one of a first curved ring and a second curved ring, and a shape of the third grid pattern is the other of the first curved ring and the second curved ring.

12. The display panel according to claim 1, wherein the display substrate comprises multiple pixel units, and at least one of the pixel units comprises a first sub-pixel emitting first-color light, a second sub-pixel emitting second-color light, and a third sub-pixel emitting third-color light;

the touch electrode comprises multiple repetitive units, and at least one of the repetitive units comprises a first grid pattern corresponding to a position of the first sub-pixel, a second grid pattern corresponding to a position of the second sub-pixel, and a third grid pattern corresponding to a position of the third sub-pixel; and shapes of the first grid pattern and second grid pattern in at least one of the repetitive units are the same curved ring.

13. The display panel according to claim 1, wherein an included angle between a tangent of the first edge and the second direction at a junction of the first edge and the second edge or the fourth edge ranges from 12° to 18°; and at a junction of the third edge and the second edge or the fourth edge, an included angle between a tangent of the third edge and the second direction ranges from 12° to 18°; and an included angle between a tangent of the second edge or the fourth edge and the first direction ranges from 12° to 18°.

14. The display panel according to claim 1, wherein at least one of the touch electrodes comprises a wavy first electrode edge extending in the second direction and a wavy second electrode edge extending in the first direction; and at a junction of the first electrode edge and the second electrode edge, an included angle between a tangent of the first electrode edge and the second direction ranges from 12° to 18°, and an included angle between a tangent of the second electrode edge and the first direction ranges from 12° to 18°.

15. The display panel according to claim 1, wherein a minimum distance between at least one of the first edge and/or the third edge and the emitting region in the first direction ranges from 8 μm to 10 μm; and a minimum distance between at least one of the second edge and/or the fourth edge and the emitting region in the second direction ranges from 8 μm to 10 μm.

16. The display panel according to claim 1, wherein the touch panel comprises a touch region, a bonding region located at a side of the touch region in the first direction, and a border region located at another side of the touch region;

a signal lead, a grounding wire and an auxiliary grounding wire are arranged in the border region;

a first end of the signal lead is connected with the touch electrode in the touch region, while a second end extends to the bonding region along a border shape;

a first end of the grounding wire is arranged at a side of the border region away from the bonding region, while a second end extends to the bonding region along the border shape at a side of the signal lead away from the touch region;

a first end of the auxiliary grounding wire is arranged at the side of the border region away from the bonding region, while a second end is connected with the grounding wire after extending along the border shape; and a distance between the grounding wire and the touch region is longer than that between the auxiliary grounding wire and the touch region.

17. The display panel according to claim 16, wherein the auxiliary grounding wire comprises an auxiliary extension section and an auxiliary connection section, a first end of the auxiliary extension section is arranged at the side of the border region away from the bonding region, while a second end is connected with a first end of the auxiliary connection section after extending along the border shape, and a second end of the auxiliary connection section extends in the second direction or the direction opposite to the second direction, and is connected with the grounding wire to form a branched structure with the grounding wire; or the touch panel comprises a centerline extending in the first direction and equally dividing the touch region and a reference line perpendicular to the centerline, the grounding wire comprises a first grounding wire located at one side of the centerline and a second grounding wire located at the other side of the centerline, both a first end of the first grounding wire and a first end of the second grounding wire are arranged at the side of the border region away from the bonding region, both a second end of the first grounding wire and a second end of the second grounding wire extend to the bonding region along the border shape, an insertion portion is arranged at the first end of the first grounding wire; the insertion portion comprises a turning section and an insertion section, a first end of the turning section is connected with the first end of the first grounding wire, while a second end is connected with a first end of the insertion section after turning to a direction approaching the touch region, a second end of the insertion section extends to the other side of the centerline, and forms an inserted structure with the first end of the second grounding wire, and there is an overlapping region between an orthographic projection of the insertion section on the reference line and an orthographic projection of the first end of the second grounding wire on the reference line; or the touch panel comprises a centerline extending in the first direction and equally dividing the touch region and a reference line perpendicular to the centerline, the auxiliary grounding wire comprises a first auxiliary grounding wire located at one side of the centerline and a second auxiliary grounding wire located at the other side of the centerline, both a first end of the first auxiliary grounding wire and a first end of the second auxiliary grounding wire are arranged at the side of the border region away from the bonding region, an auxiliary insertion portion is arranged at the first end of the first auxiliary grounding wire, the auxiliary insertion portion comprises an auxiliary turning section and an auxiliary insertion section; a first end of the auxiliary turning section is connected with the first end of the first auxiliary grounding wire, while a second end is connected with a first end of the auxiliary insertion section after turning to a direction away from the touch region, a second end of the auxiliary insertion section extends to the other side of the centerline, and forms an auxiliary inserted structure with the first end of the second auxiliary grounding wire, and there is an overlapping region between an orthographic projection of the auxiliary insertion section on the reference line and an orthographic projection of the first end of the second auxiliary grounding wire on the reference line; or multiple dummy line segments are further arranged in the border region, and the multiple dummy line segments are arranged between the signal lead and the grounding wire, or the multiple dummy line segments are arranged between the grounding wire and the auxiliary grounding wire.

18. A display device, comprising the display panel according to claim 1.

19. A preparation method for a display panel, comprising:

forming a display substrate, the display substrate comprising multiple sub-pixels, and at least one of the sub-pixels comprising an emitting region and a non-emitting region located on a periphery of the emitting region; and forming a touch panel on the display substrate, the touch panel comprising multiple touch electrodes, and at least one of the touch electrodes comprising multiple grid patterns enclosed by metal wires, wherein an orthographic projection of the emitting region on the display substrate is located within a range of that of a region enclosed by the metal wires on the display substrate; an orthographic projection of the metal wire on the display substrate is located within a range of that of the non-emitting region on the display substrate; wherein at least one of the grid patterns comprises a first edge, second edge, third edge and fourth edge that form a ring;

the first edge and the third edge extend in a second direction, and the second edge and the fourth edge extend in a first direction, the first direction intersecting the second direction;

a shape of the grid pattern comprises at least one of a first curved ring, a second curved ring, a third curved ring, and a fourth curved ring;

a first edge and third edge of the first curved ring are curves curved towards a direction opposite to the first direction;

a first edge and third edge of the second curved ring are curves curved towards the first direction;

a second edge and fourth edge of the third curved ring are curves curved towards the second direction; and a second edge and fourth edge of the fourth curved ring are curves curved towards a direction opposite to the second direction.

* * * * *